US009786676B2

(12) United States Patent
Yun et al.

(10) Patent No.: US 9,786,676 B2
(45) Date of Patent: Oct. 10, 2017

(54) VERTICAL MEMORY DEVICES AND METHODS OF MANUFACTURING THE SAME

(71) Applicants: Jang-Gn Yun, Hwaseong-si (KR); Zhiliang Xia, Hwaseong-si (KR); Ahn-Sik Moon, Hwaseong-si (KR); Se-Jun Park, Hwaseong-si (KR); Joon-Sung Lim, Yongin-si (KR); Sung-Min Hwang, Seoul (KR)

(72) Inventors: Jang-Gn Yun, Hwaseong-si (KR); Zhiliang Xia, Hwaseong-si (KR); Ahn-Sik Moon, Hwaseong-si (KR); Se-Jun Park, Hwaseong-si (KR); Joon-Sung Lim, Yongin-si (KR); Sung-Min Hwang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/217,313

(22) Filed: Jul. 22, 2016

(65) Prior Publication Data

US 2017/0133389 A1 May 11, 2017

(30) Foreign Application Priority Data

Nov. 10, 2015 (KR) ........................ 10-2015-0157066

(51) Int. Cl.

| | |
|---|---|
| ***H01L 27/115*** | (2017.01) |
| ***H01L 27/1157*** | (2017.01) |

(Continued)

(52) U.S. Cl.

CPC ........ *H01L 27/1157* (2013.01); *H01L 23/528* (2013.01); *H01L 23/5226* (2013.01); *H01L 27/11582* (2013.01)

(58) Field of Classification Search

CPC ........... H01L 27/1157; H01L 27/11582; H01L 23/5226; H01L 23/528

See application file for complete search history.

(56) References Cited

U.S. PATENT DOCUMENTS 7,679,133 B2 3/2010 Son et al.
8,310,875 B2 11/2012 Sakurai et al.

(Continued)

FOREIGN PATENT DOCUMENTS

KR 2011-0068590 A 6/2011

*Primary Examiner* — Long Pham

(74) *Attorney, Agent, or Firm* — Harness, Dickey & Pierce, P.L.C.

(57) ABSTRACT

A vertical memory device includes a channel, a dummy channel, a plurality of gate electrodes, and a support pattern. The channel extends in a first direction perpendicular to an upper surface of a substrate. The dummy channel extends from the upper surface of the substrate in the first direction. The plurality of gate electrodes are formed at a plurality of levels, respectively, spaced apart from each other in the first direction on the substrate. Each of the gate electrodes surrounds outer sidewalls of the channel and the dummy channel. The support pattern is between the upper surface of the substrate and a first gate electrode among the gate electrodes. The first gate electrode is at a lowermost one of the levels. The channel and the dummy channel contact each other between the upper surface of the substrate and the first gate electrode.

20 Claims, 86 Drawing Sheets

(51) Int. Cl.

| | |
|---|---|
| ***H01L 27/11582*** | (2017.01) |
| ***H01L 23/522*** | (2006.01) |
| ***H01L 23/528*** | (2006.01) |

(56) References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,575,675 | B2 | 11/2013 | Park et al. |
| 8,614,126 | B1 | 12/2013 | Lee et al. |
| 8,654,587 | B2 | 2/2014 | Yoon et al. |
| 8,847,302 | B2 | 9/2014 | Alsmeier et al. |
| 9,012,974 | B2 | 4/2015 | Chae et al. |
| 2011/0147824 | A1 | 6/2011 | Son et al. |
| 2011/0233648 | A1 | 9/2011 | Seol et al. |
| 2012/0068253 | A1 | 3/2012 | Oota et al. |
| 2014/0145137 | A1 | 5/2014 | Ju et al. |
| 2015/0008499 | A1 | 1/2015 | Lee et al. |
| 2015/0129954 | A1 | 5/2015 | Kim et al. |
| 2016/0343730 | A1* | 11/2016 | Son ...................... H01L 23/528 |

* cited by examiner

VERTICAL MEMORY DEVICES AND METHODS OF MANUFACTURING THE SAME

CROSS-REFERENCE TO RELATED APPLICATIONS

This application claims priority under 35 USC §119 to Korean Patent Application No. 10-2015-0157066, filed on Nov. 10, 2015 in the Korean Intellectual Property Office (KIPO), the contents of which are herein incorporated by reference in their entirety.

BACKGROUND

1. Field

Inventive concepts generally relate to vertical memory devices, and more particularly, inventive concepts relate to vertical non-volatile memory devices including vertical channels.

2. Description of Related Art

When a VNAND flash memory device is fabricated, an insulation layer and a sacrificial layer may be alternately and repeatedly formed on a substrate, channel holes may be formed through the insulation layers and the sacrificial layers to expose upper surfaces of the substrate, respectively, and channels may be formed in the channel holes, respectively. The channels may contact the upper surfaces of the substrate to be electrically connected thereto. However, as the numbers of the insulation layer and the sacrificial layer stacked on the substrate increase and the sizes of the channel holes decrease, the channel holes may not expose the upper surfaces of the substrate, and thus the channels in the channel holes may not contact the upper surfaces of the channels, which may generate the electrical failure.

SUMMARY

Example embodiments provide a vertical memory device having good characteristics.

Example embodiments provide a method of manufacturing a vertical memory device having good characteristics.

According to example embodiments of inventive concepts, a vertical memory device may include a substrate; a channel on the substrate, the channel extending in a first direction perpendicular to an upper surface of the substrate; a dummy channel on the substrate, the dummy channel extending from the upper surface of the substrate in the first direction; a plurality of gate electrodes spaced apart from each other in the first direction at a plurality of levels, respectively, on the substrate, each of the gate electrodes surrounding outer sidewalls of the channel and the dummy channel, the channel and the dummy channel contact each other between the upper surface of the substrate and a first gate electrode among the gate electrodes, the first gate electrode being at a lowermost one of the levels; and a support pattern between the upper surface of the substrate and the first gate electrode.

According to example embodiments of inventive concepts, a vertical memory device may include a substrate; a plurality of gate electrodes on the substrate, the plurality of gate electrodes spaced apart from each other in a first direction perpendicular to an upper surface of the substrate; a channel on the substrate, the channel extending in the first direction through the gate electrodes; a support pattern between the upper surface of the substrate and a first gate electrode among the plurality of gate electrodes, the first gate electrode being a lowermost one of the plurality gate electrodes, wherein the support pattern does not vertically overlap the channel; and an epitaxial layer between the upper surface of the substrate and the first gate electrode, the epitaxial layer contacting the channel.

According to example embodiments of inventive concepts, a vertical memory device may include a plurality of gate electrodes on a substrate, the plurality of gate electrodes being spaced apart from each other in a first direction perpendicular to an upper surface of the substrate; a channel on the substrate and extending in the first direction through the gate electrodes; a dummy channel on the substrate and extending in the first direction from the upper surface of the substrate through the gate electrodes, a lower portion of the dummy channel contacting a lower portion of the channel; a first contact plug on the channel; a first wiring electrically connected to the channel through the first contact plug; a second contact plug on the dummy channel; and a second wiring electrically connected to the dummy channel through the second contact plug.

According to example embodiments of inventive concepts, a method of manufacturing a vertical memory device includes forming a support layer on a substrate; alternately forming sacrificial layers and insulation layers on the support layer in a first direction perpendicular to an upper surface of the substrate; forming a channel hole and a dummy channel hole through the support layer, the sacrificial layers and the insulation layers, the channel hole having a first width, the dummy channel hole having a second width greater than the first width, and the dummy channel hole exposing the upper surface of the substrate; removing a part of the support layer exposed by the channel hole and the dummy channel hole to enlarge lower portions of the channel hole and the dummy channel holes so that the channel hole and the dummy channel hole are in communication with each other, a remaining portion of the support layer forming a support pattern; forming a channel and a dummy channel filling the channel hole and the dummy channel hole, respectively; forming an opening through the support pattern, the insulation layers and the sacrificial layers to expose the upper surface of the substrate, the forming the opening through the support pattern including transforming the insulation layers and the sacrificial layers into insulation patterns and sacrificial patterns, respectively; removing the sacrificial patterns to form a plurality of first gaps; and forming gate electrodes to fill the first gaps, respectively.

According to example embodiments of inventive concepts, a method of manufacturing a vertical memory device includes forming a support layer on a substrate; alternately forming sacrificial layers and insulation layers on the support layer in a first direction perpendicular to an upper surface of the substrate; forming a channel hole through the support layer, the sacrificial layers, and the insulation layers; forming a channel to fill the channel hole; forming an opening through the support layer, the sacrificial layers and the insulation layers to expose the upper surface of the substrate, the forming the opening including transforming the insulation layers and the sacrificial layers into insulation patterns and sacrificial patterns, respectively; removing a part of the support layer exposed by the opening to form a first gap exposing the upper surface of the substrate and an outer sidewall of the channel; performing an SEG process to form an epitaxial layer on the upper surface of the substrate exposed by the opening and the first gap, the epitaxial layer contacting the outer sidewall of the channel; removing the sacrificial patterns to form a plurality of second gaps; and forming gate electrodes to fill the second gaps, respectively.

According to example embodiments of inventive concepts, a method of manufacturing a vertical memory device includes forming a support layer on a substrate; alternately forming sacrificial layers and insulation layers on the support layer in a first direction perpendicular to an upper surface of the substrate; forming a channel hole and a dummy channel hole through the support layer, the sacrificial layers and the insulation layers; removing a part of the support layer exposed by the channel hole and the dummy channel hole to enlarge lower portions of the channel hole and the dummy channel holes so that the channel hole and the dummy channel hole are in communication with each other, a remaining portion of the support layer forming a support pattern; forming a channel and a dummy channel filling the channel hole and the dummy channel hole, respectively, the channel and the dummy channel contacting each other; forming an opening through the support pattern, the insulation layers and the sacrificial layers to expose the upper surface of the substrate, the forming the opening including transforming the insulation layers and the sacrificial layers into insulation patterns and sacrificial patterns, respectively; replacing the sacrificial patterns with gate electrodes, respectively; forming a second wiring on the dummy channel to be electrically connected thereto; and forming a first wiring on the channel to be electrically connected thereto.

According to example embodiments, a vertical memory device includes a plurality of gate electrodes stacked on top of each other on the substrate, the gate electrodes defining channel holes that extend through the gate electrodes in a first direction perpendicular to an upper surface of the substrate, the channel holes being spaced apart from each other in a second direction and a third direction that cross each other and are parallel to the upper surface of the substrate; a support pattern between the upper surface of the substrate and the gate electrodes, the support pattern defining channel openings that connect to the channel holes; and a plurality of channel structures filling the channel holes and channel openings, the channel structures extending in the first direction through the gate electrodes, a portion of each of the channel structures extending in the third direction in the channel openings.

In vertical memory devices according to example embodiments, even if the channels have a small width and do not contact the substrate, the channels may be electrically connected to the substrate via the dummy channels having a large width. Additionally, the epitaxial layer may be formed to contact the channels, so that the channels may be electrically connected to the substrate via the epitaxial layer.

BRIEF DESCRIPTION OF THE DRAWINGS

The above and other aspects and features of inventive concepts will become readily understood from the detail description of non-limiting embodiments that follows, with reference to the accompanying drawings, in which like reference numbers refer to like elements unless otherwise noted, and in which.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIGS. 1 through 28B are plan views and cross-sectional views illustrating stages of a method of manufacturing a vertical memory device in accordance with example embodiments. For example, FIGS. 2, 5, 10, 13, 16, 19, and 26 are plan views, and FIGS. 1, 3-4, 6,7, 8A, 11A-12A, 14-15, 17-18, 20-25, 27A, and 28A are cross-sectional views.

Figure 8A:
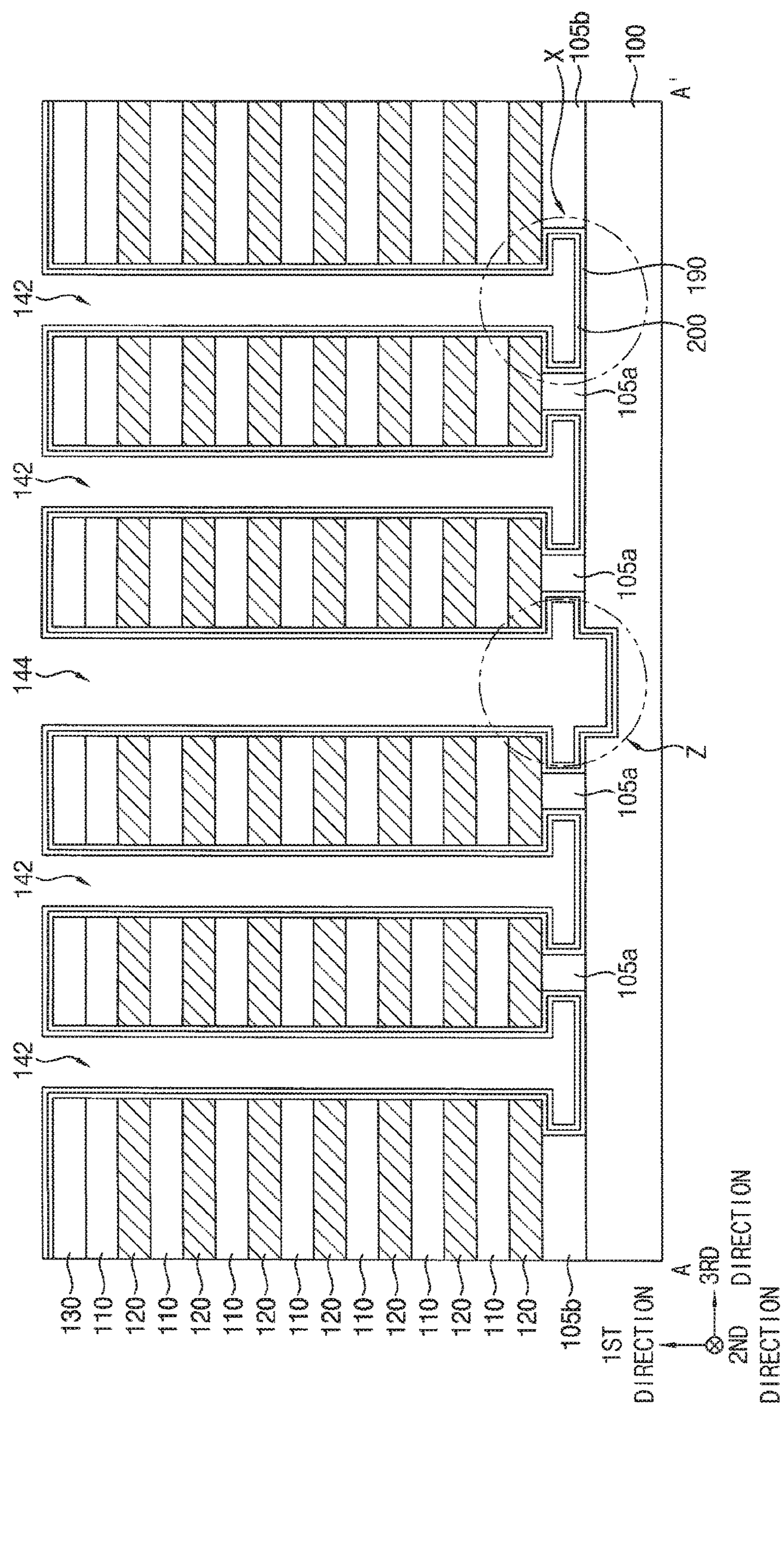
Figure 8B:
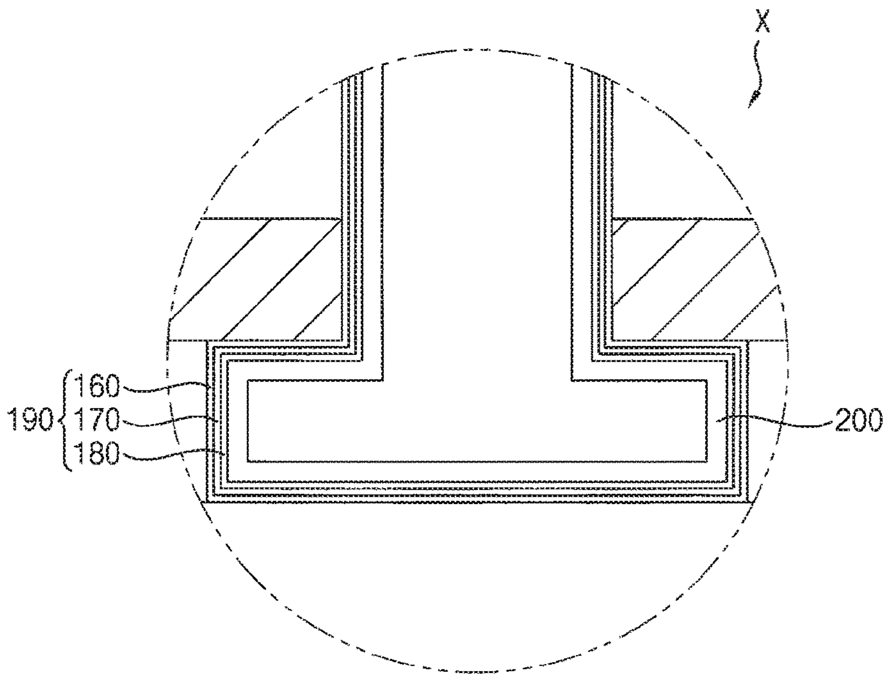
Figure 8B:
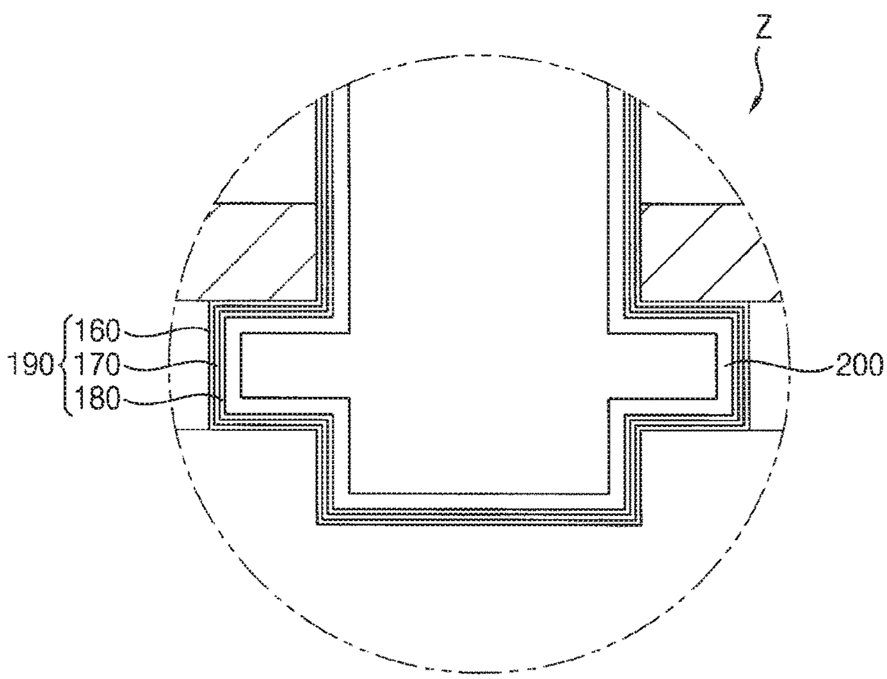
Figure 9A:
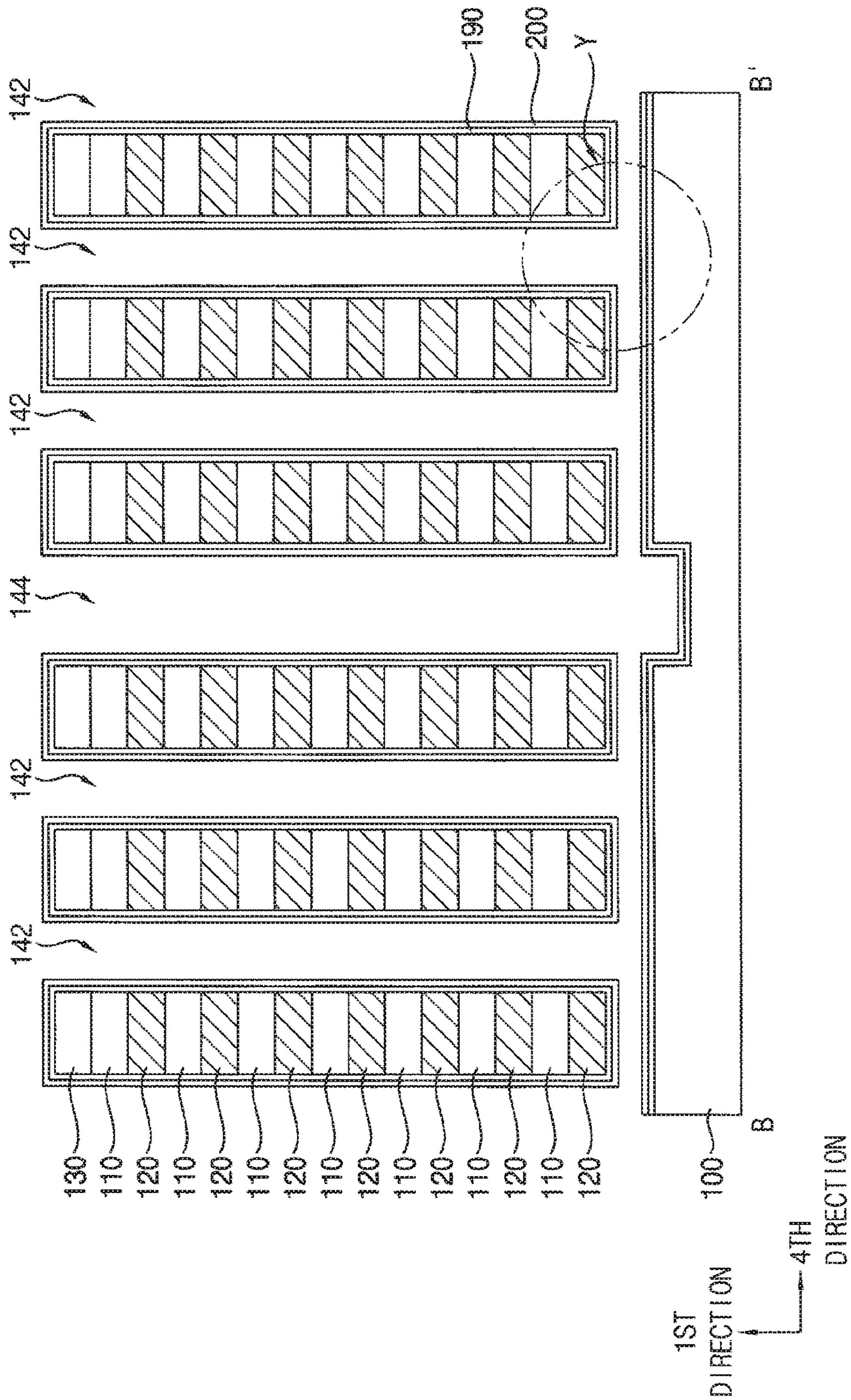
Figure 9B:
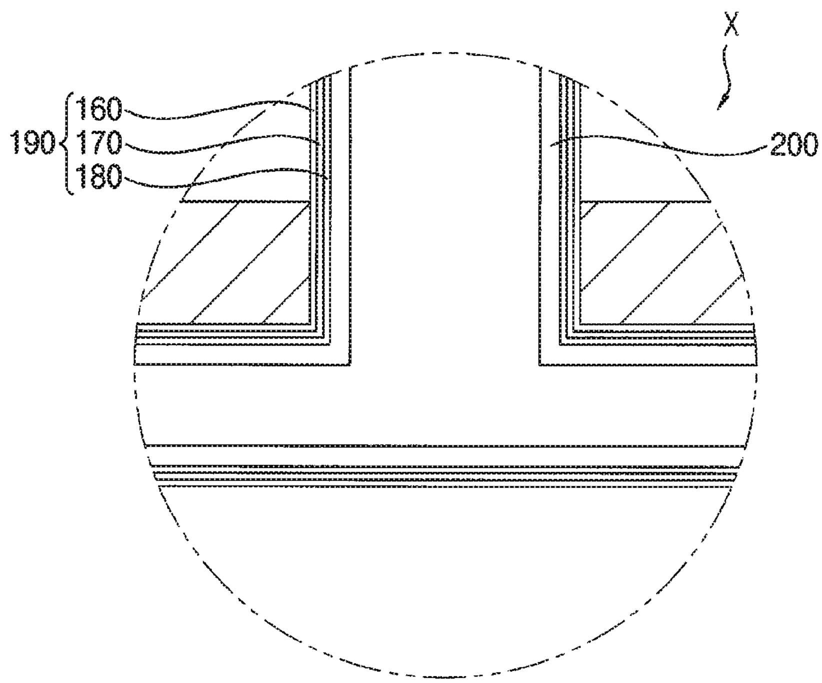
Figure 10:
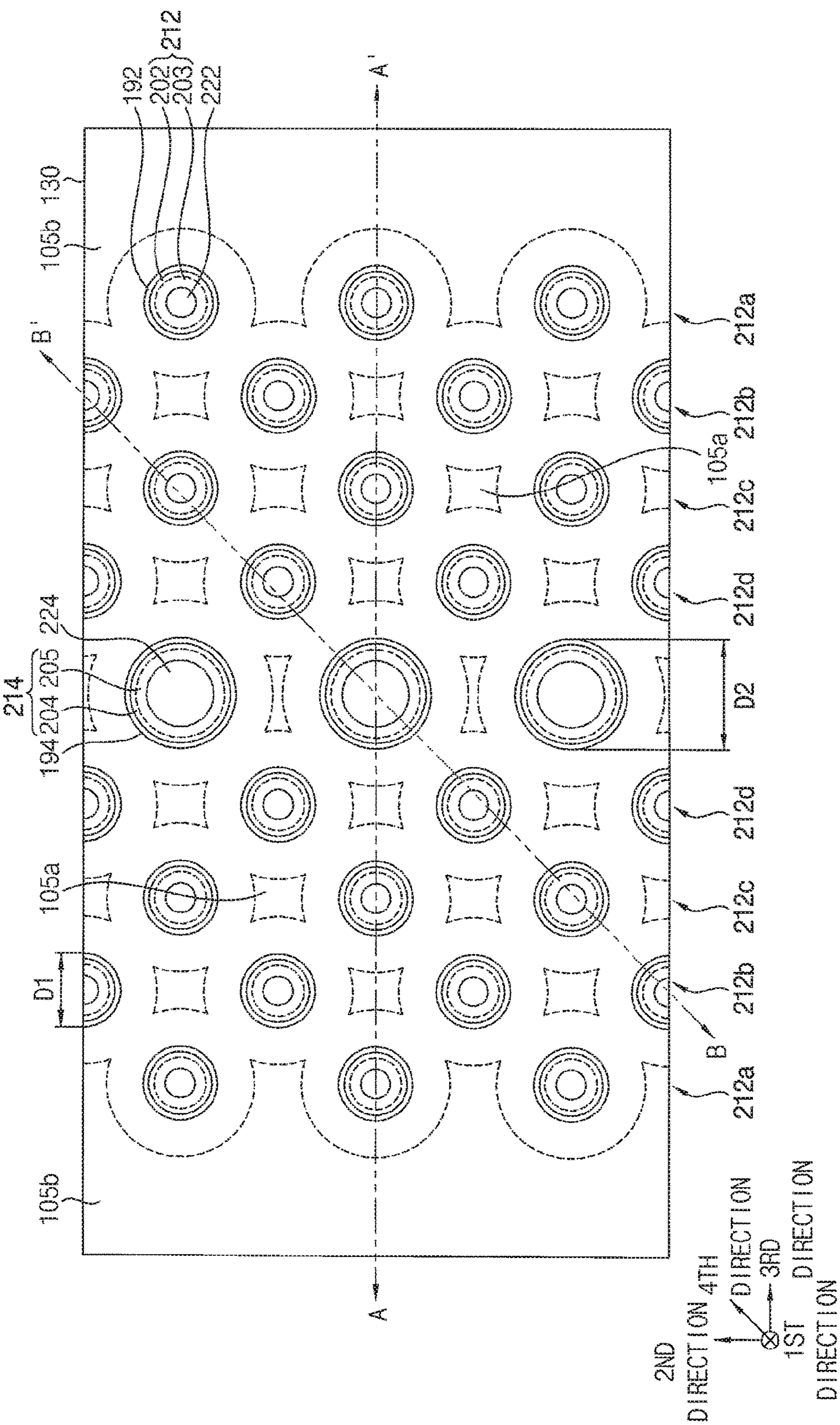
Figure 11A:
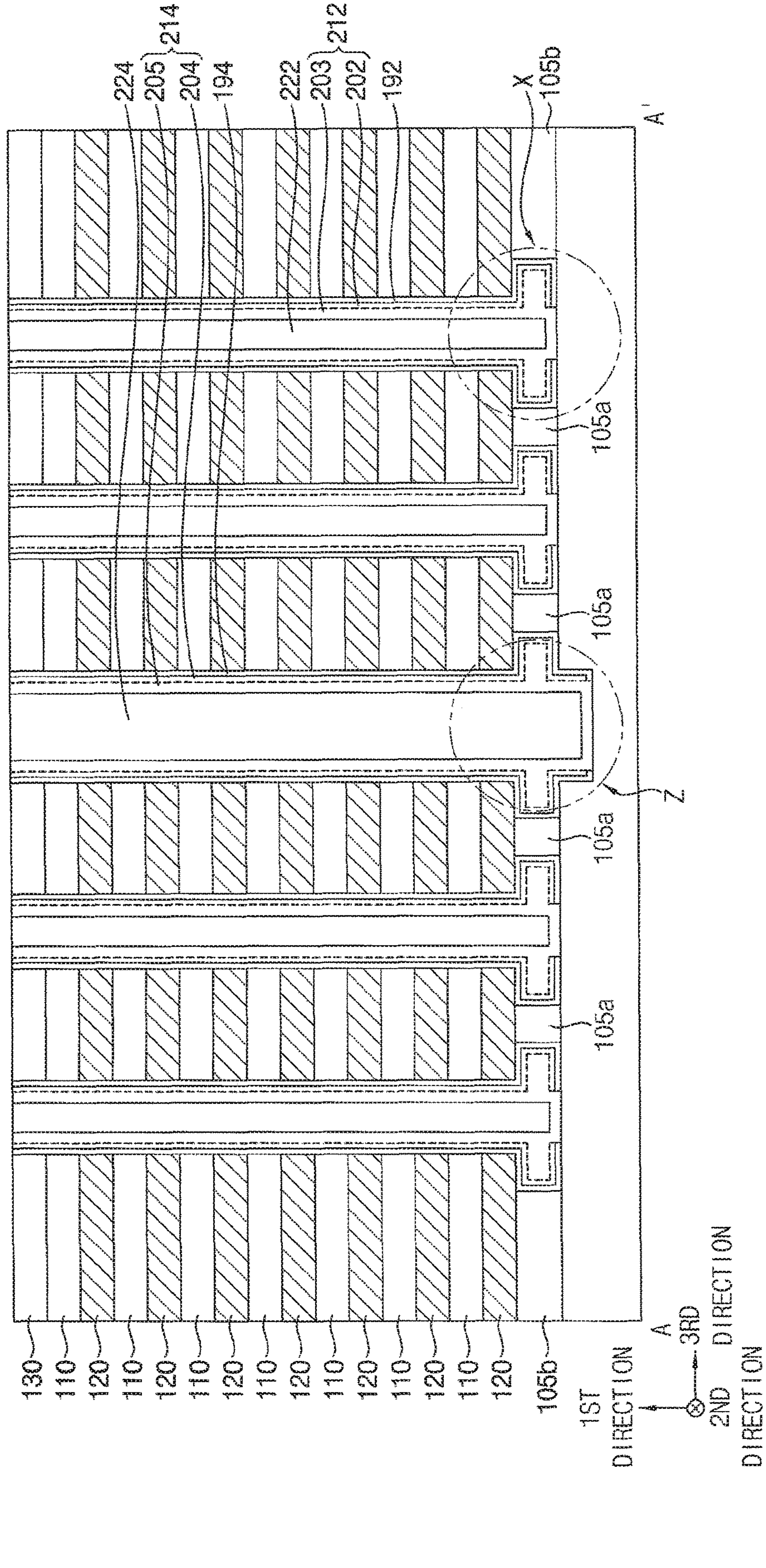
Figure 11B:
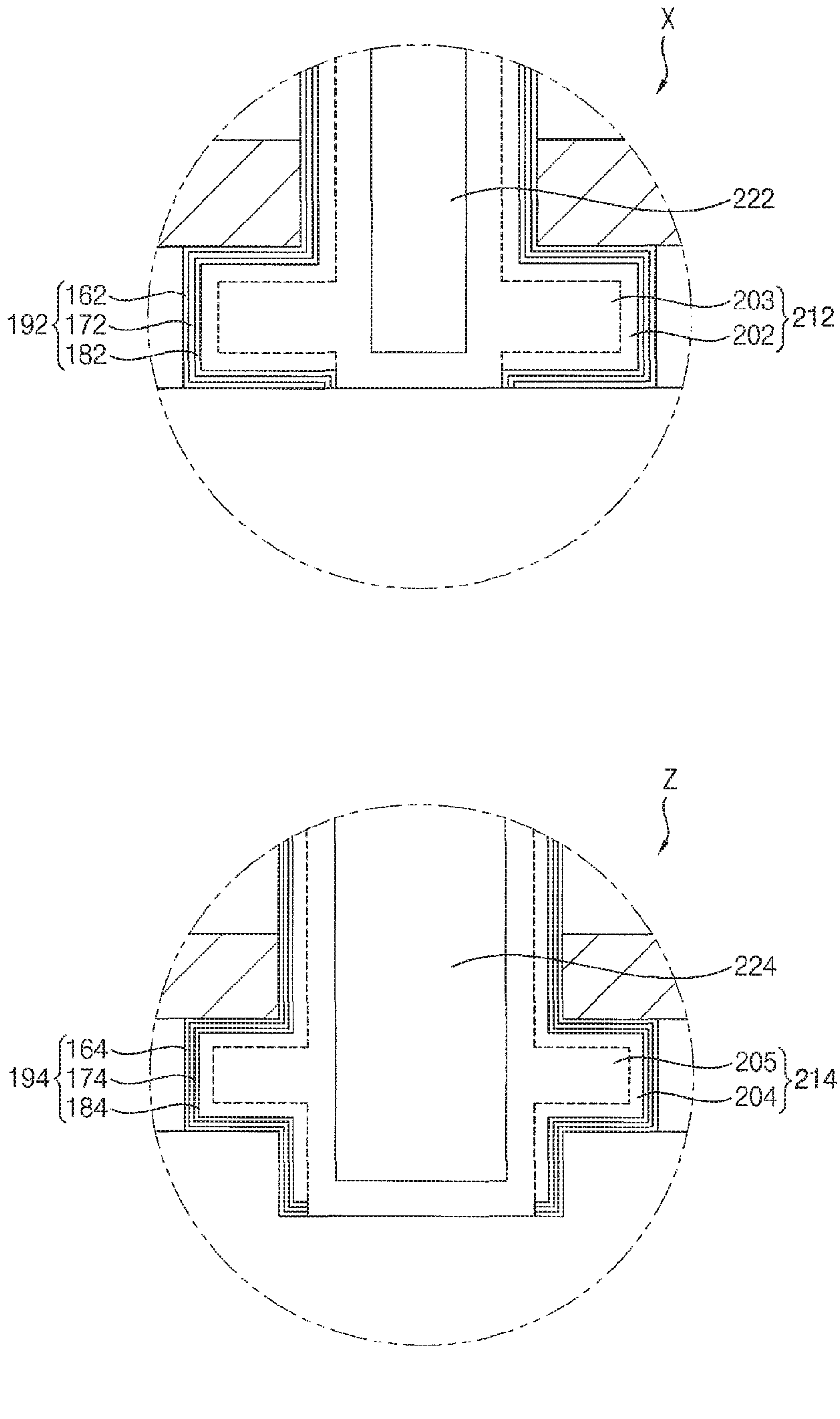
Figure 12A:
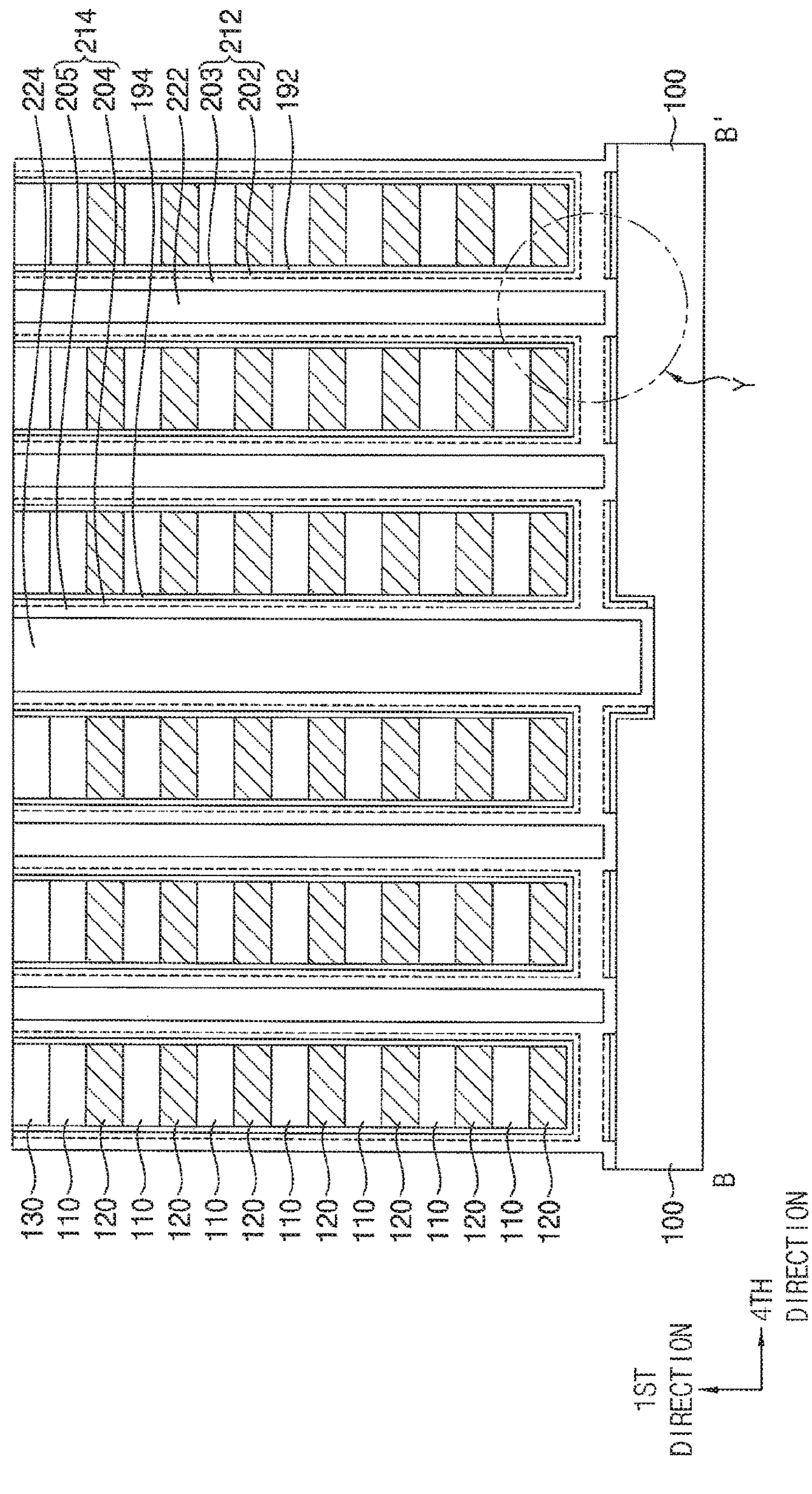
Figure 12B:
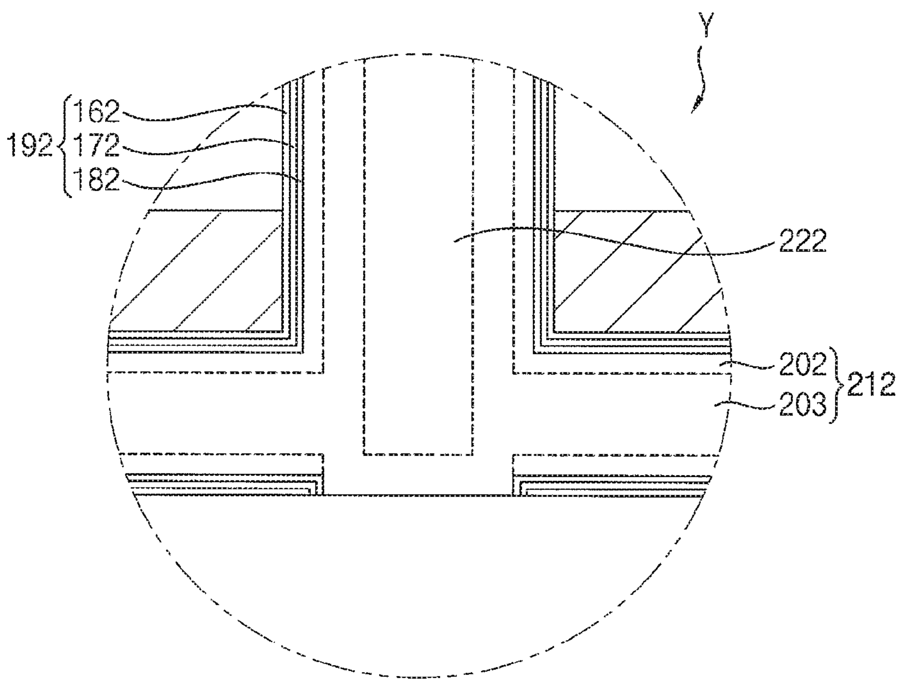
Figure 27A:
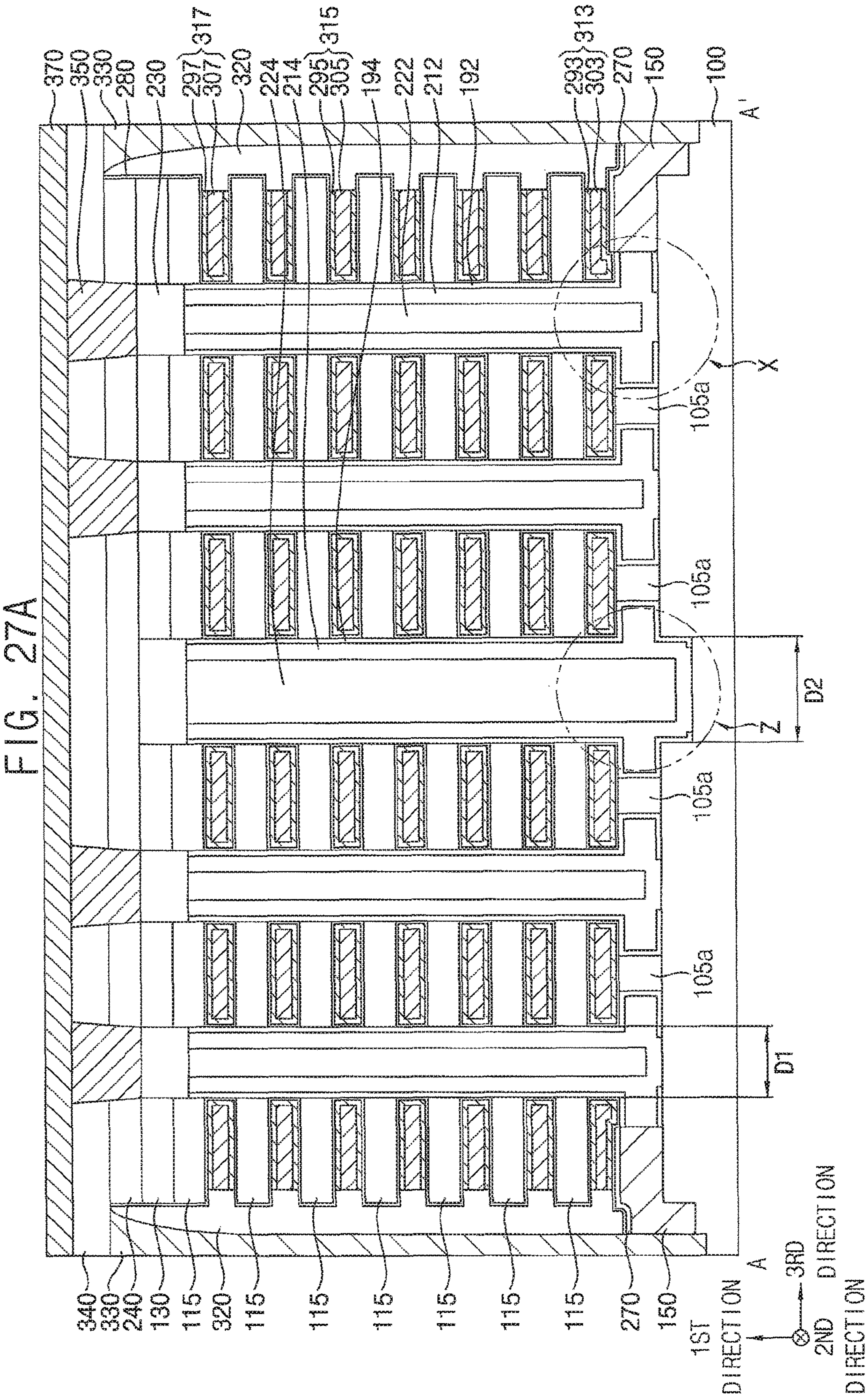
Figure 27B:
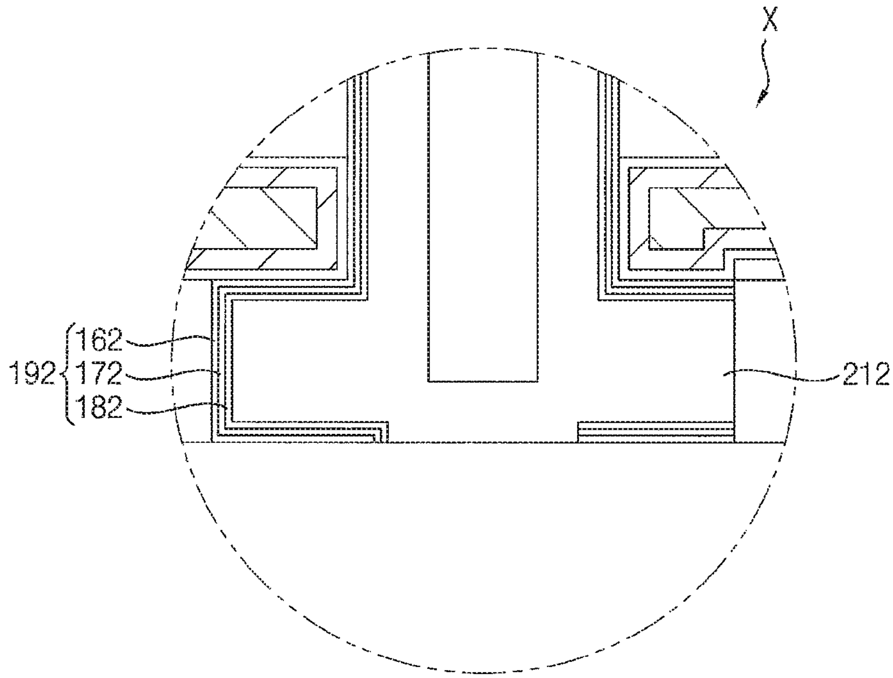
Figure 27B:
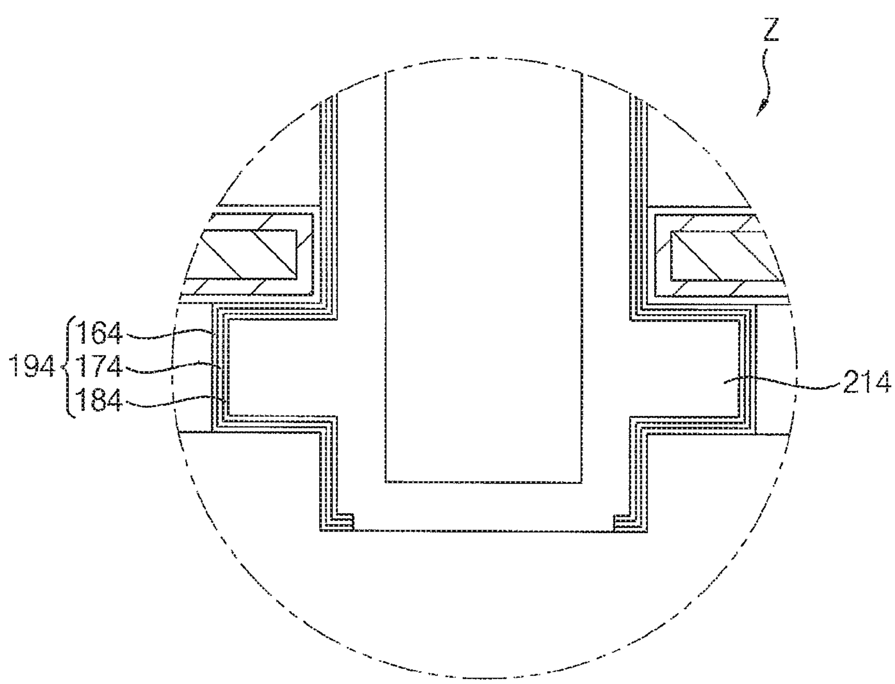
Figure 28A:
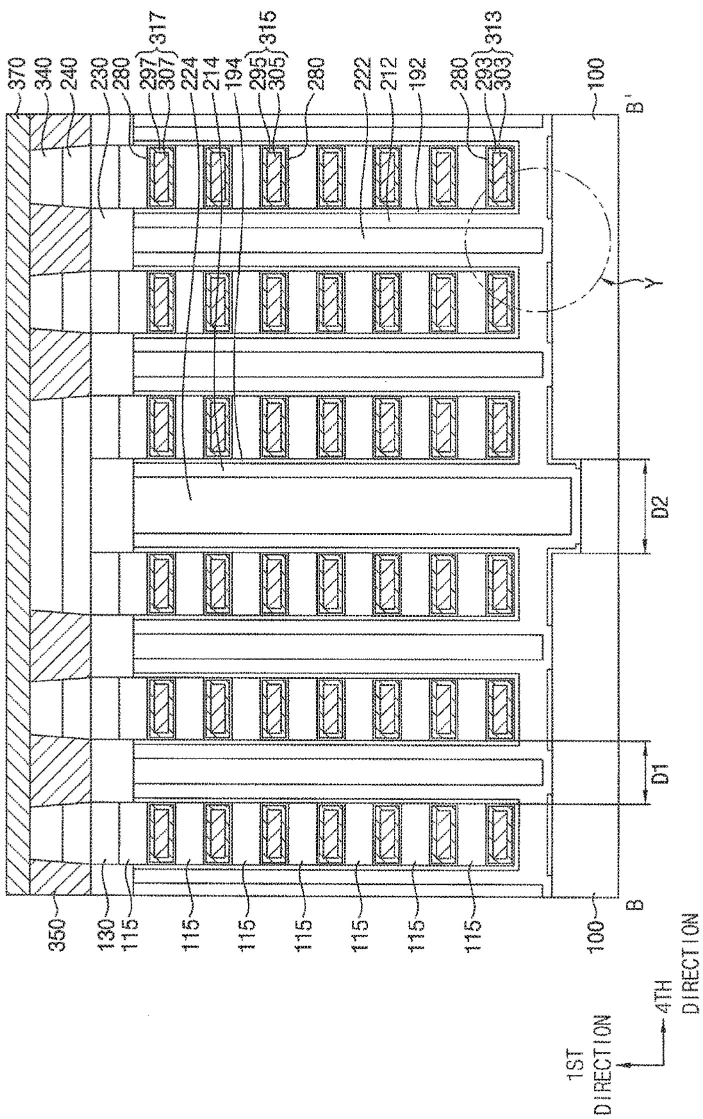
Figure 28B:
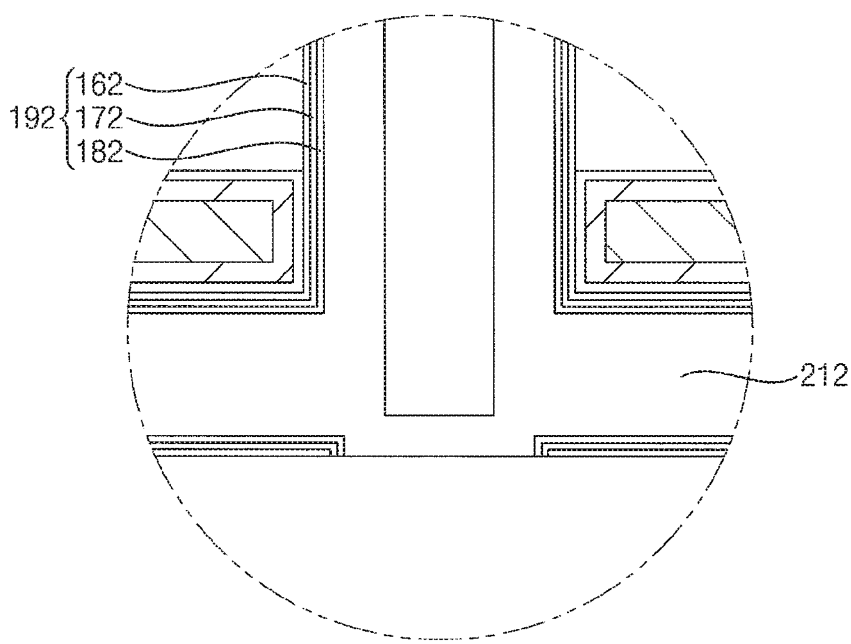

Among the cross-sectional views, FIGS. 1, 3-4, 6, 8A, 11A, 14-15, 17-18, 20-25 and 27A are cross-sectional views along cutlines A-A' of corresponding plan views, respectively, and FIGS. 7, 9A, 12 and 28A are cross-sectional views along cutlines B-B' of corresponding plan views, respectively. FIGS. 8B, 11B and 27B are enlarged cross-sectional views of regions X and Z in FIGS. 8A, 11A and 27A, respectively, and FIGS. 9B, 12B and 28B are enlarged cross-sectional views of regions Y in FIGS. 9A, 12A and 28A, respectively.

Figure 1:
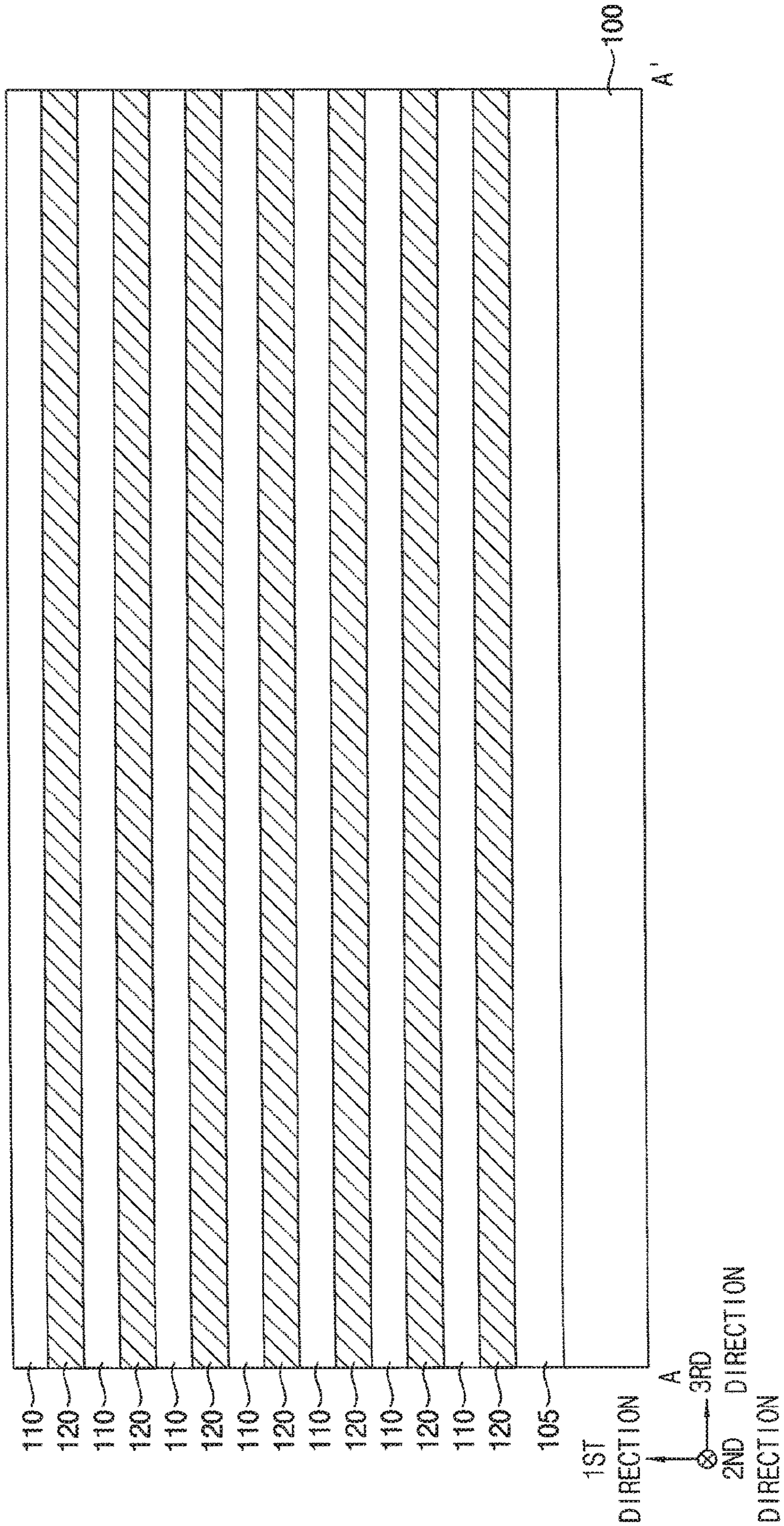
FIGS. 1 through 28B are plan views and cross-sectional views illustrating stages of a method of manufacturing a vertical memory device in accordance with example embodiments.

Referring to FIG. 1, a support layer 105 may be formed on a substrate 100, and a sacrificial layer 120 and an insulation layer 110 may be alternately and repeatedly formed on the support layer 105. Thus, a plurality of sacrificial layers 120 and a plurality of insulation layers 110 may be alternately stacked on each other over the support layer 105 in a first direction substantially perpendicular to an upper surface of the substrate 100. FIG. 1 shows for purposes of illustration seven sacrificial layers 120 and eight insulation layers 110 alternately stacked on the support layer 105. However, inventive concepts are not limited to any particular number of the sacrificial layers 120 and the insulation layers 110.

The substrate 100 may include a semiconductor material, e.g., silicon, germanium, and the like.

In example embodiments, before forming the support layer 105, e.g., p-type impurities may be implanted into the substrate 100 to form a p-type well (not shown) therein.

The support layer 105, the insulation layers 110 and the sacrificial layers 120 may be formed by a chemical vapor deposition (CVD) process, a plasma chemical vapor deposition (PECVD) process, an atomic layer deposition (ALD) process, etc.

The insulation layers 110 may be formed of a silicon oxide, e.g., plasma enhanced tetraethylorthosilicate (PE-TEOS), high density plasma (HDP) oxide, plasma enhanced oxide (PEOX), etc. The sacrificial layers 120 may be formed of a material having an etching selectivity with respect to the insulation layers 110, e.g., silicon nitride.

In example embodiments, the support layer 105 may be formed of a material having an etching selectivity with respect to the substrate 100, the insulation layer 110 and the sacrificial layer 120. For example, the support layer 105 may be formed of silicon-germanium or doped polysilicon. A material of the support layer 105 may be different than a material of the substrate 100.

Figure 2:
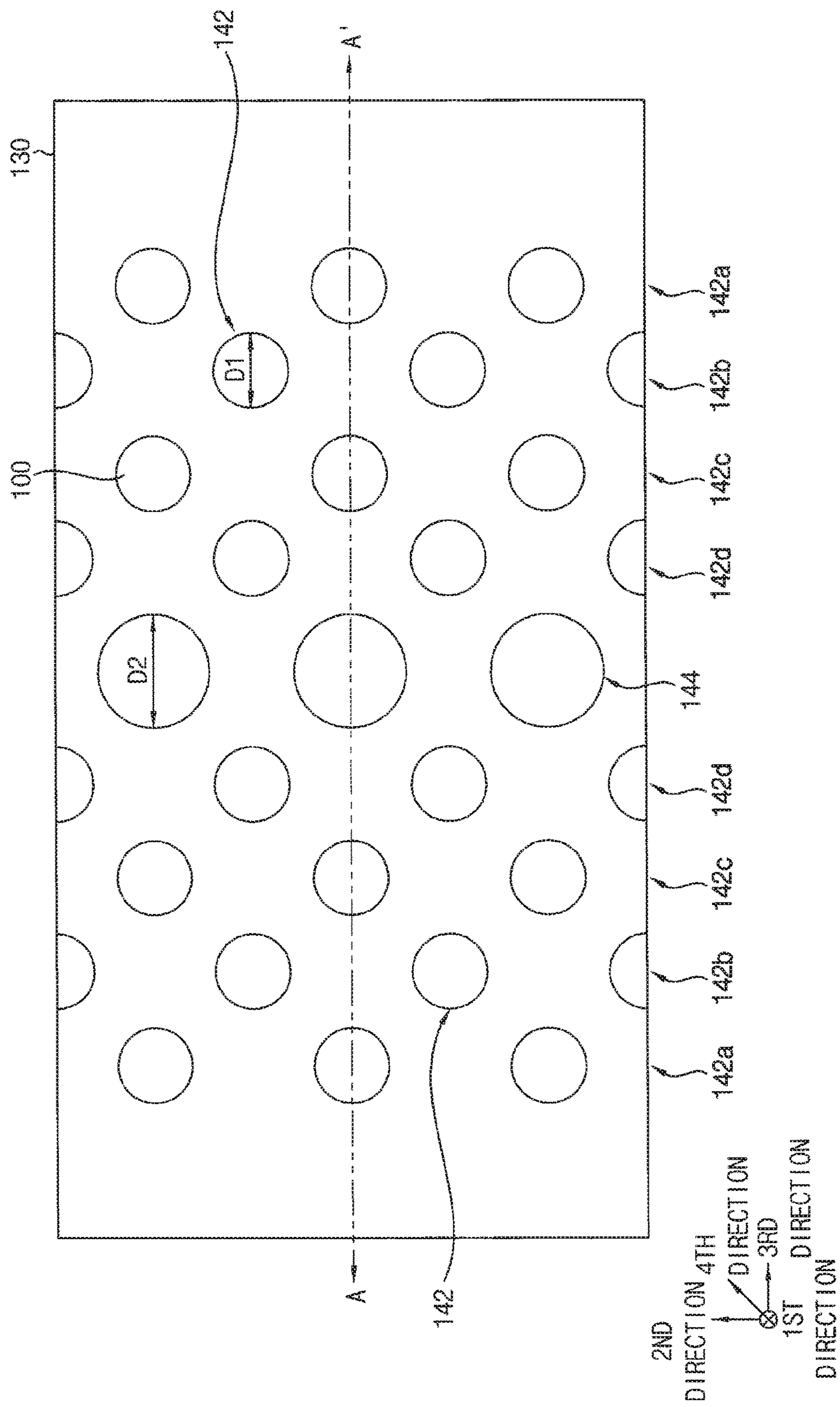
Figure 3:
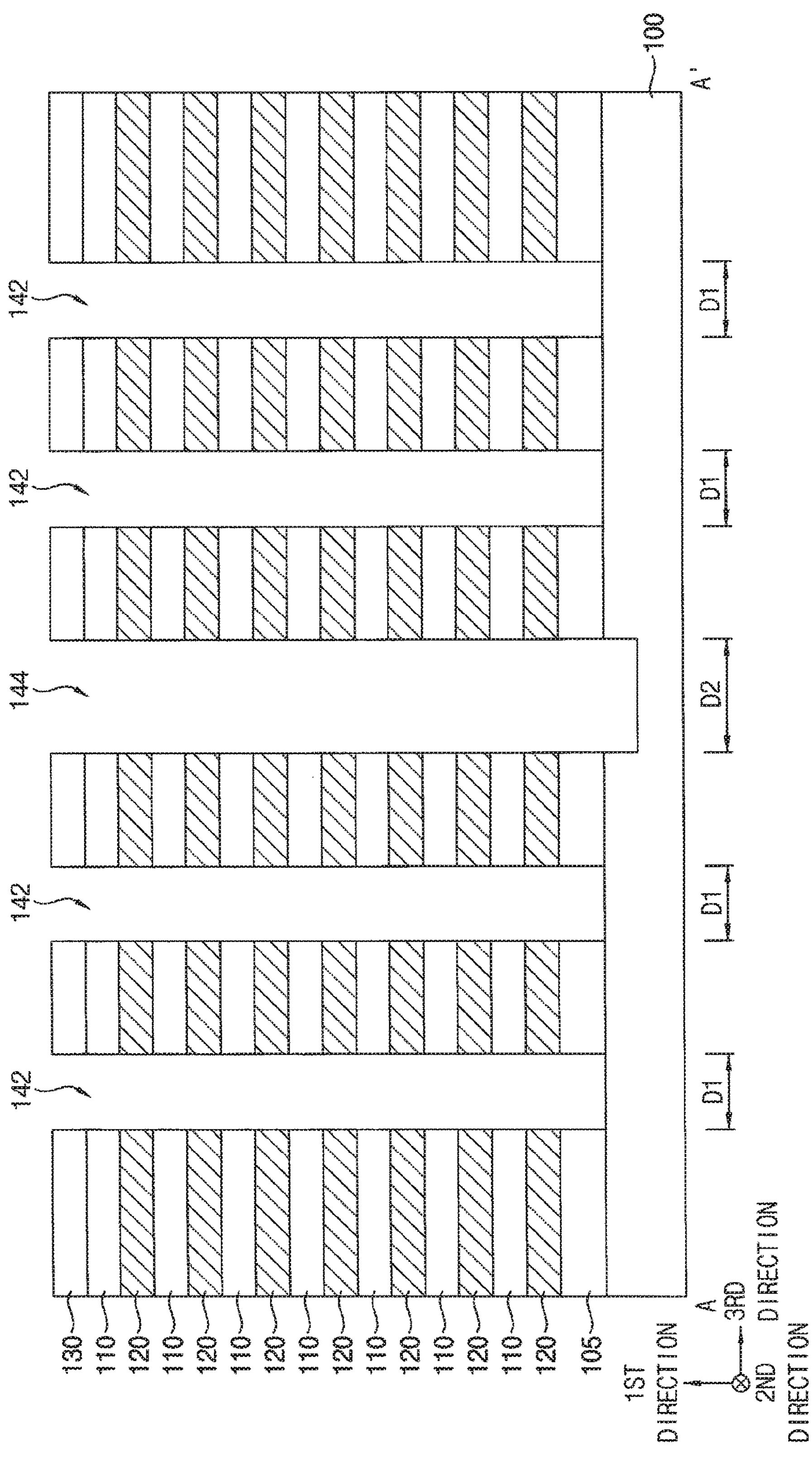

Referring to FIGS. 2 and 3, after forming a first insulating interlayer 130 on an uppermost one of the insulation layers 110, a photolithography process may be performed using a photoresist pattern (not shown) as an etching mask to form a channel hole 142 and a dummy channel hole 144 through the first insulating interlayer 130, the insulation layers 110, the sacrificial layers 120 and the support layer 105, each of which may expose an upper surface of the substrate 100.

The channel hole 142 and the dummy channel hole 144 may be formed to have first and second widths, respectively, and the second width may be greater than the first width. In example embodiments, the channel hole 142 and the dummy channel hole 144 may have hollow cylindrical shapes with first and second diameters D1 and D2, respectively, and the second diameter D2 may be greater than the first diameter D1.

Due the characteristics of the etching process, each of the channel hole 142 and the dummy channel hole 144 may have a width decreasing from a top toward a bottom thereof. Thus, referring to FIG. 4, one of the channel holes 142 having a relatively small width may not expose an upper surface of the substrate 100. However, in example embodiments, at least the dummy channel hole 144 having a relatively large width may expose an upper surface of the substrate 100, and an upper portion of the substrate 100 exposed by the dummy channel hole 144 may be further etched to form a recess.

In example embodiments, a plurality of channel holes 142 may be formed both in second and third directions, which may be parallel to the upper surface of the substrate 100 and substantially perpendicular to each other, and a channel hole array may be defined.

In example embodiments, the channel hole array may include a first channel hole column 142*a* including a plurality of channel holes 142 disposed in the second direction, and a second channel hole column 142*b* including a plurality of channel holes 142 disposed in the second direction, which may be spaced apart from the first channel hole column 142*a* in the third direction.

The channel holes 142 of the first channel hole column 142*a* may be disposed at a fourth direction having an acute angle with respect to the second direction or the third direction from the channel holes 142 of the second channel hole column 142*b*. Thus, the channel holes 142 of the first and second channel hole columns 142*a* and 142*b* may be arranged in a zigzag layout in the second direction so as to be densely formed in a unit area.

The first and second channel hole columns 142*a* and 142*b* may be disposed alternately and repeatedly in the third direction. In example embodiments, the first and second channel hole columns 142*a* and 142*b* may be disposed in the third direction four times to form a channel hole block including eight channel hole columns therein, and a plurality of channel hole blocks may be formed in the third direction to be spaced apart from each other.

In example embodiments, a plurality of dummy channel holes 144 may be formed in the second direction to form a dummy channel hole column. In example embodiments, the dummy channel hole column may be formed at a central portion of each channel hole block in the third direction, and four channel hole columns may be formed at each side of the dummy channel hole column in the third direction. Hereinafter, the four channel hole columns disposed from an edge toward the dummy channel hole column in each channel hole block may be referred to as first, second, third and fourth channel hole columns 142*a*, 142*b*, 142*c* and 142*d*, respectively, in this order.

That is, FIG. 2 shows one channel hole block including the first, second, third and fourth channel hole columns 142*a*, 142*b*, 142*c* and 142*d*, the dummy channel hole column, and the fourth, third, second and first channel hole columns 142*d*, 142*c*, 142*b* and 142*a* disposed in the third direction in this order. However, inventive concepts are not limited thereto, and each channel hole block may include a plurality of channel hole columns other than four channel hole columns at each side of the dummy channel hole column in the third direction.

In example embodiments, the first, second, third and fourth channel hole columns 142*a*, 142*b*, 142*c* and 142*d* may be spaced apart from each other in the third direction, and the channel holes 142 in each of the first, second, third and fourth channel hole columns 142*a*, 142*b*, 142*c* and 142*d* may be spaced apart from each other in the second direction. The dummy channel hole column may be spaced apart by the same distance from the third channel hole columns 142*c* at both sides of the dummy channel hole column in the third direction, and the dummy channel holes 144 in the dummy channel hole column may be spaced apart from each other by the same distance in the second direction. Thus, the layout of the channel holes 142 and the dummy channel holes 144 in each channel hole block may have a pattern, and for example, the channel holes 142 and the dummy channel holes 144 may be disposed at lattice vertices, respectively. The layout of the channel holes 142 and the dummy channel holes 144 in each channel hole block may not be limited thereto.

The first insulating interlayer 130 may be formed of an oxide, e.g., silicon oxide, and thus may be merged with the uppermost one of the insulation layers 110.

Figure 5:
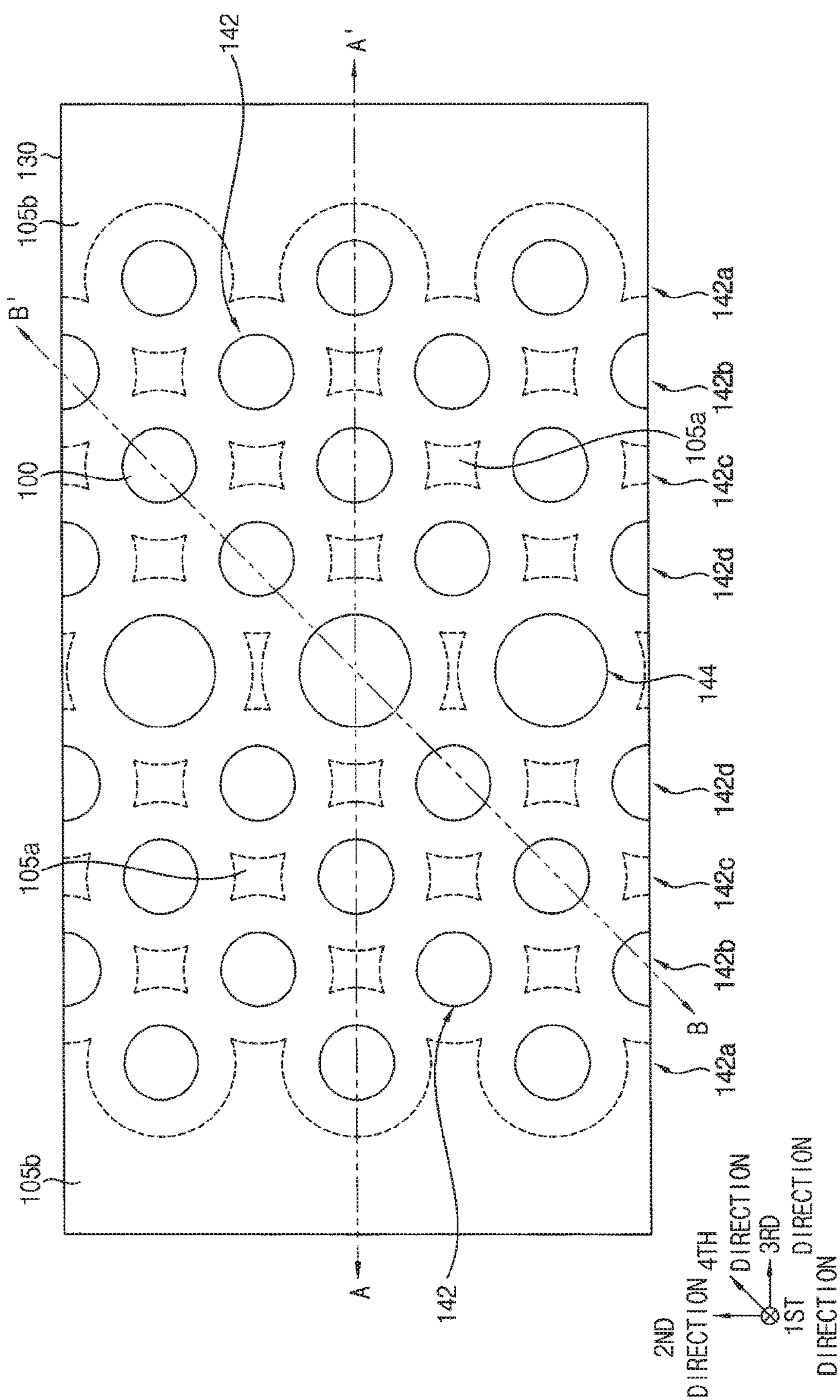
Figure 6:
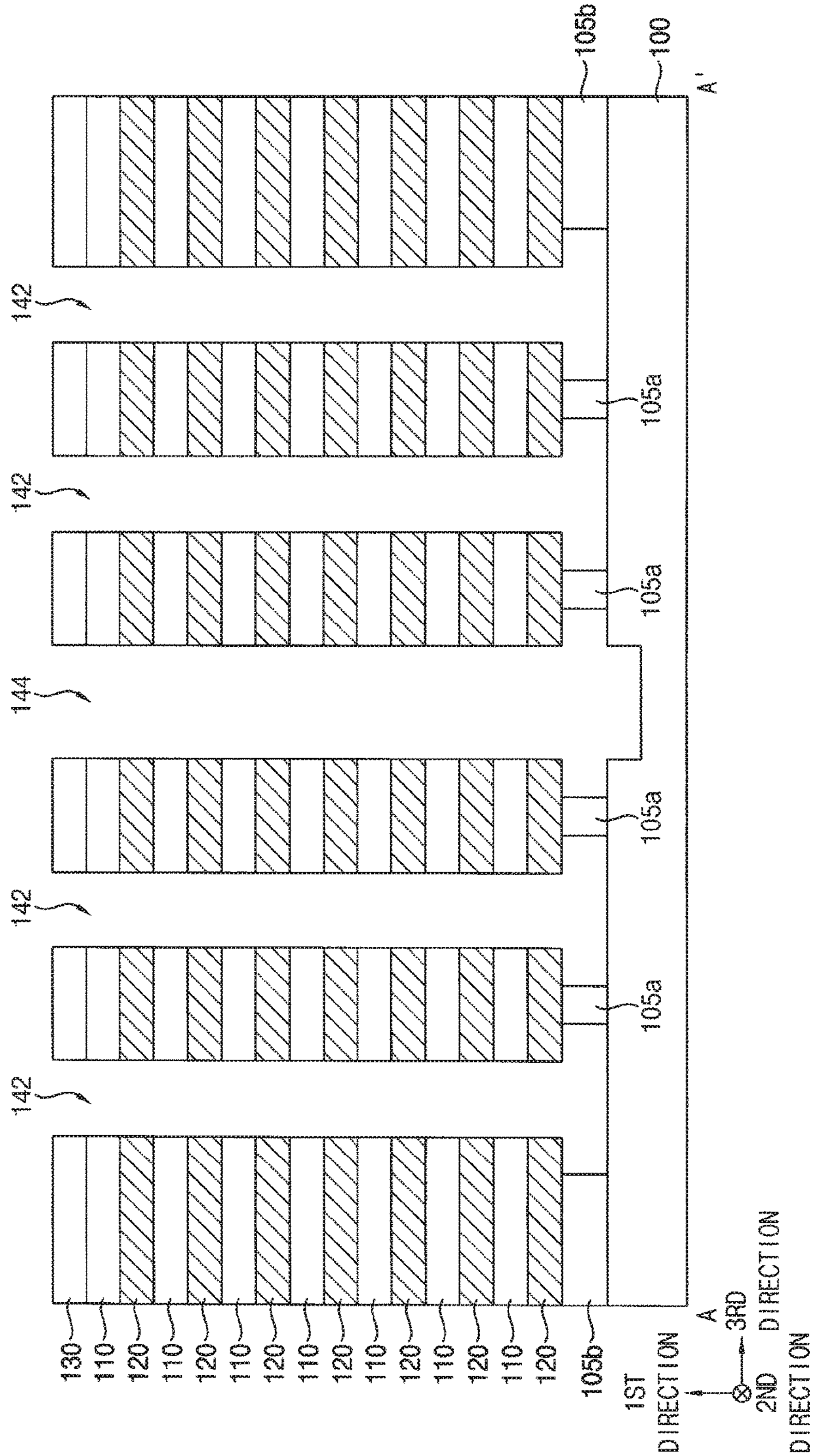
Figure 7:
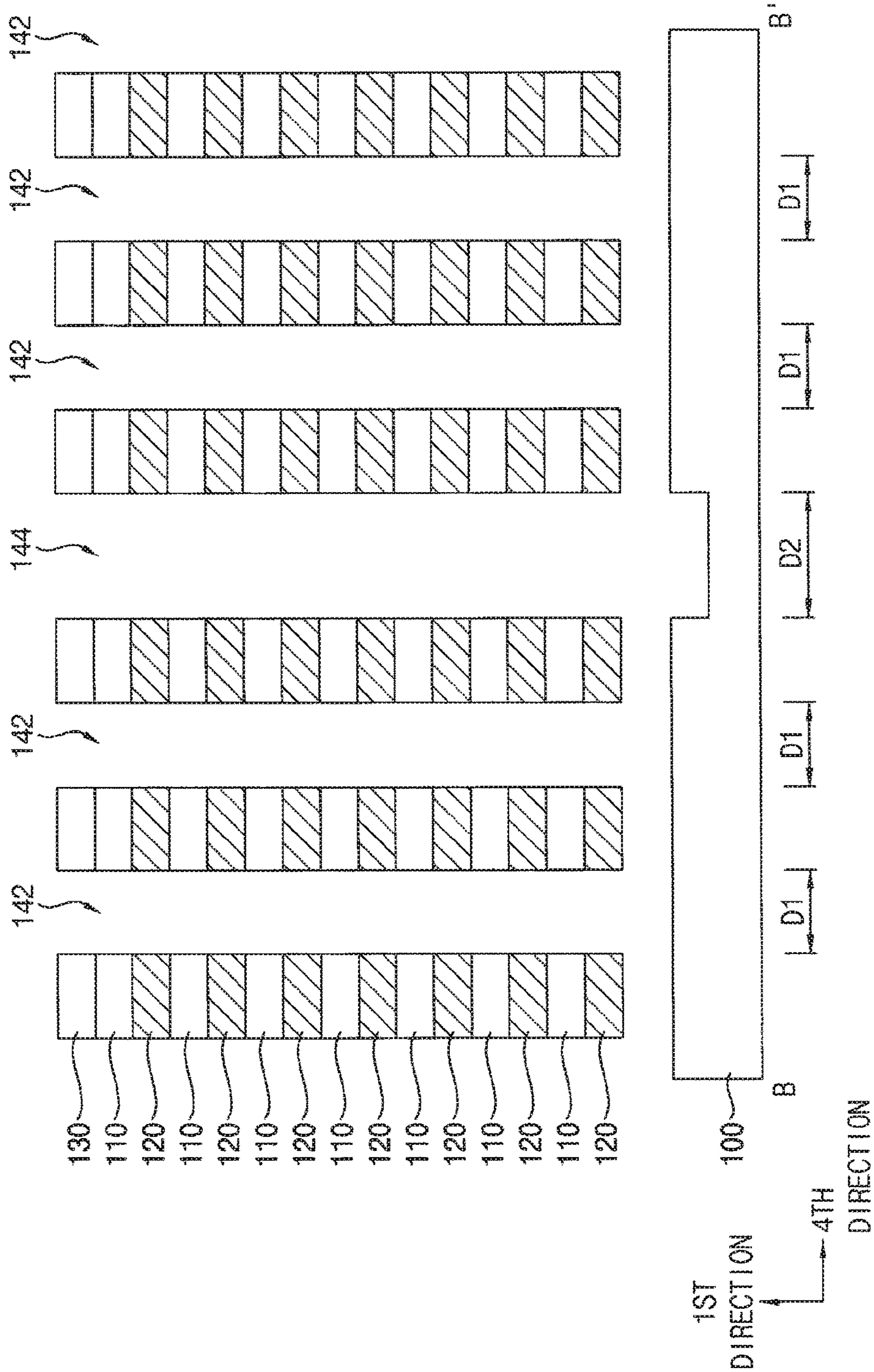

Referring to FIGS. 5 to 7, the support layer 105 exposed by the channel holes 142 and the dummy channel holes 144 may be partially removed so that lower portions of the channel holes 142 and the dummy channel holes 144 may be enlarged in a direction substantially parallel to the upper surface of the substrate 100, e.g., in a horizontal direction.

In example embodiments, the support layer 105 may be partially removed by a wet etching process. The support layer 105 may include a material having an etching selectivity with respect to the substrate 100, the insulation layer 110 and the sacrificial layer 120, e.g., silicon-germanium, and may be removed well with no influence thereon.

The lower portions of the channel holes 142 and the dummy channel holes 144 between the upper surface of the substrate 100 and a lowermost one of the sacrificial layers 120 may be enlarged by the etching process, so that the channel holes 142 and the dummy channel holes 144 may be in communication with each other. The lower portions of the channel holes 142 defined by the support layer 105 may be referred to as channel openings. The lower portions of the dummy channel holes 144 defined by the support layer 105 may be referred to as dummy channel openings. That is, the channel holes 142, which may be included in the channel hole columns adjacent to each other in the third direction among the first to fourth channel hole columns 142*a*, 142*b*, 142*c* and 142*d* and may be adjacent to each other in the fourth direction, may be in communication with each other, and the dummy channel holes 144 may be in communication with the channel holes 142, which may be included in the channel hole columns adjacent to the dummy channel hole column in the third direction, e.g., the fourth channel hole column 142*d* and may be adjacent to the dummy channel holes 144 in the fourth direction. Accordingly, all of the channel holes 142 and the dummy channel holes 144 in each channel hole block may be in communication with one another.

As the support layer 105 is partially removed by the etching process, a first support pattern 105*a* may be formed between the channel holes 142, or between the channel holes 142 and the dummy channel holes 144, and a second support pattern 105*b* may be formed at an outside of the channel hole columns distant from the dummy channel holes 144, e.g., at outsides of the first and second channel hole columns 142*a* and 142*b* in the third direction.

In example embodiments, the first support pattern 105*a* may be formed between the channel holes 142 spaced apart from each other in the second direction in each of the second, third and fourth channel hole columns 142*b*, 142*c* and 142*d*. The first support pattern 105*a* may be also formed between the channel holes 142 included in the first and third channel hole columns 142*a* and 142*c*, between the channel holes 142 included in the third channel hole columns 142*c* and the dummy channel holes 144, between the channel holes 142 included in the second and fourth channel hole columns 142*b* and 142*d*, and between the channel holes 142 included in the fourth channel hole columns 142*d* disposed at opposite sides of the dummy channel hole column in the third direction. Thus, the first support pattern 105*a* may be formed both in the second and third directions to form a given pattern.

The second support pattern 105*b* may extend in the second direction.

Referring to FIGS. 8A, 8B, 9A and 9B, a first blocking layer 160, a charge storage layer 170, a tunnel insulation layer 180 and a first channel layer 200 may be sequentially formed on inner sidewalls of the channel holes 142 and the dummy channel holes 144, the exposed upper surface of the substrate 100, and an upper surface of the first insulating interlayer 130.

The first blocking layer 160 may be formed of an oxide, e.g., silicon oxide, the charge storage layer 170 may be formed of a nitride, e.g., silicon nitride, the tunnel insulation layer 180 may be formed of an oxide, e.g., silicon oxide, and the first channel layer 200 may be formed of polysilicon or amorphous silicon.

The first blocking layer 160, the charge storage layer 170, and the tunnel insulation layer 180 sequentially stacked may define a charge storage layer structure 190, and hereinafter, only the charge storage layer structure 190 will be illustrated for avoidance of complexity.

Referring to FIGS. 10, 11A, 11B, 12A and 12B, after forming a first spacer layer (not shown) on the first channel layer 200, the first spacer layer may be anisotropically etched to form a first spacer (not shown) remaining only on the inner sidewalls of the channel holes 142 and the dummy channel holes 144, and the first channel layer 200 and the charge storage layer structure 190 may be sequentially etched using the first spacer as an etching mask to form a first channel pattern 202 and a first charge storage structure 192, each of which may have a cup-like shape of which a bottom is opened, on the inner sidewall of each of the channel holes 142 and the exposed upper surface of the substrate 100, and to form a first dummy channel pattern 204 and a second charge storage structure 194, each of which may have a cup-like shape of which a bottom is opened, on the inner sidewall of each of the dummy channel holes 144 and the exposed upper surface of the substrate 100. In the etching process, the first spacer may be removed.

A second channel layer may be formed on the first channel pattern 202, the first dummy channel pattern 204, the exposed upper surface of the substrate 100 and the first insulating interlayer 130, a filling layer may be formed on the second channel layer to fill the channel holes 142 and the dummy channel holes 144, and the filling layer and the second channel layer may be planarized until the upper surface of the first insulating interlayer 130 may be exposed. Thus, a second channel pattern 203 may be formed on the first channel pattern 202 and the exposed upper surface of the substrate 100 in each of the channel holes 142, and a first filling pattern 222 may be formed on the second channel pattern 203 to fill a remaining portion of each of the channel holes 142. Additionally, a second dummy channel pattern 205 may be formed on the first dummy channel pattern 204 and the exposed upper surface of the substrate 100 in each of the dummy channel holes 144, and a second filling pattern 224 may be formed on the second dummy channel pattern 205 to fill a remaining portion of each of the dummy channel holes 144.

The second channel layer may be formed of polysilicon or amorphous silicon, and the filling layer may be formed of an oxide, e.g., silicon oxide. In example embodiments, the second channel layer may be formed of a material substantially the same as that of the first channel layer 200, and thus the second channel pattern 203 and the second dummy channel pattern 205 may be merged into the first channel pattern 202 and the first dummy channel pattern 204, respectively. Hereinafter, the merged first and second channel patterns 202 and 203 may be referred to as a channel 212, and the merged first and second dummy channel patterns 204 and 205 may be referred to as a dummy channel 214. Only the channel 212 and the dummy channel 214 will be illustrated for the avoidance of complexity.

In example embodiments, the channel 212 may have a cup-like shape as a whole, however, a portion of the channel 212 between the upper surface of the substrate 100 and the lowermost one of the sacrificial layers 120 may have a width greater than those of other portions thereof. Thus, the channel 212 may include a first extension portion, which may extend in the first direction, and a first expansion portion, which may be expanded from the first extension portion in a horizontal direction and have a width greater than that of the first extension portion.

Likewise, the dummy channel 214 may have a cup-like shape as a whole, however, a portion of the dummy channel 214 between the upper surface of the substrate 100 and the lowermost one of the sacrificial layers 120 may have a width greater than those of other portions thereof. Thus, the dummy channel 214 may include a second extension portion, which may extend in the first direction, and a second expansion portion, which may be expanded from the second extension portion in the horizontal direction and have a width greater than that of the second extension portion. The dummy channel 214 may fill the recess on the substrate 100.

When the channel 212 and the dummy channel 214 include amorphous silicon, a laser epitaxial growth (LEG) process or a solid phase epitaxy (SPE) process may be further performed so as to include crystalline silicon.

The first charge storage structure 192 may include a first blocking pattern 162, a first charge storage pattern 172 and a first tunnel insulation pattern 182 sequentially stacked, and the second charge storage structure 194 may include a second blocking pattern 164, a second charge storage pattern 174 and a second tunnel insulation pattern 184 sequentially stacked.

As illustrated above with reference to FIGS. 2 to 4, the channel holes 142 may define the channel hole block including the first to fourth channel hole columns 142*a*, 142*b*, 142*c* and 142*d*, and a plurality of channel hole blocks may define the channel hole array. Additionally, the dummy channel holes 144 may define the dummy channel hole column. Correspondingly, the channels 212 may define a channel block including a plurality of channel columns, and a plurality of channel blocks may define a channel array. Additionally, the dummy channels 214 may define a dummy channel column. Particularly, the channel array may include a plurality of channel blocks spaced apart from each other in the third direction, and each channel block may include first, second, third and fourth channel columns 212*a*, 212*b*, 212*c* and 212*d* disposed at each opposite side of the dummy channel column in the third direction.

The channel 212 on the upper surface of the substrate 100, the first charge storage structure 192 covering an outer sidewall of the channel 212, and the first filling pattern 222 filling an inner space formed by the channel 212 may define a first structure having a pillar shape, e.g., a solid cylindrical shape, and the dummy channel 214 on the upper surface of the substrate 100, the second charge storage structure 194 covering an outer sidewall of the dummy channel 214, and the second filling pattern 224 filling an inner space formed by the dummy channel 214 may define a second structure having a pillar shape, e.g., a solid cylindrical shape.

Figure 13:
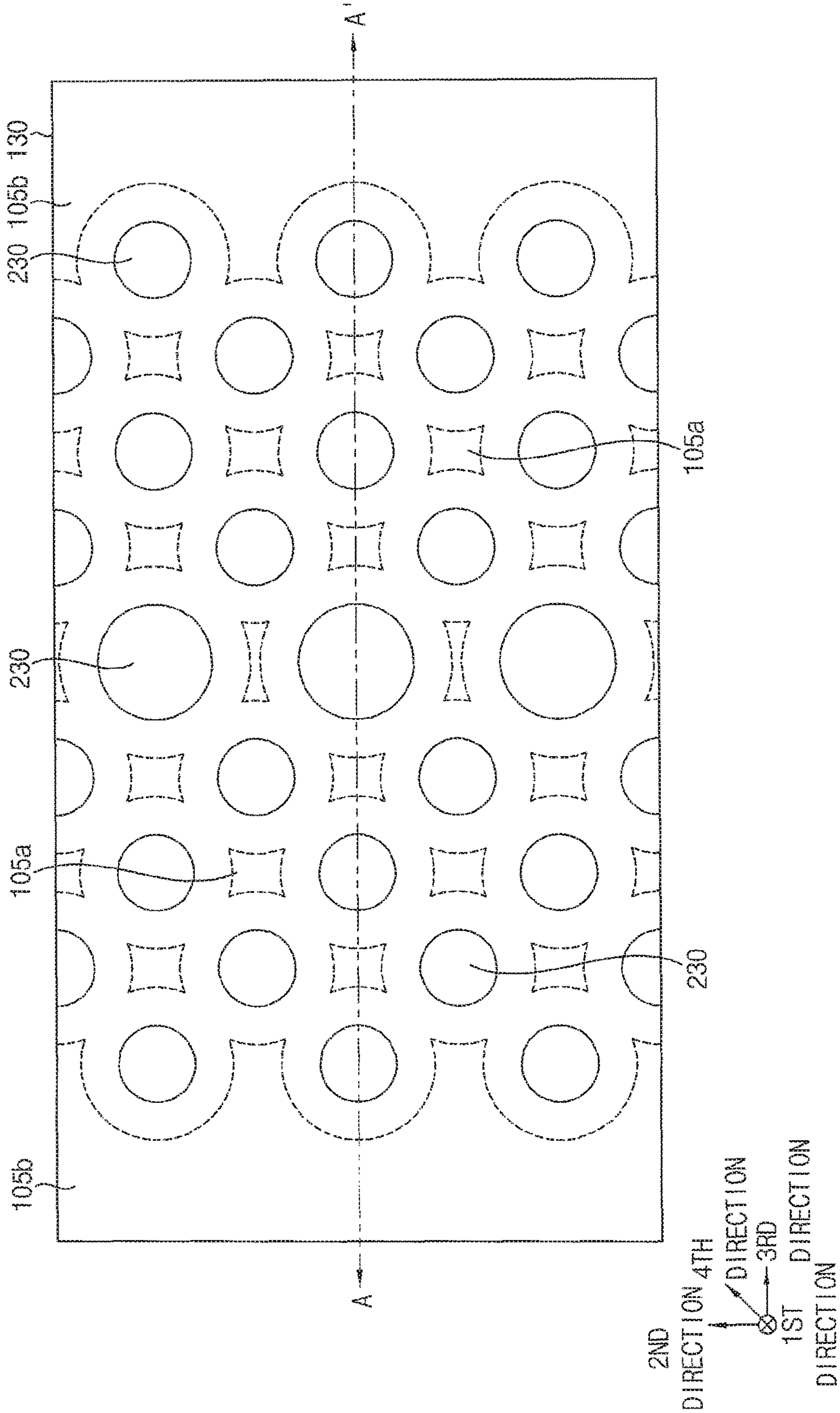
Figure 14:
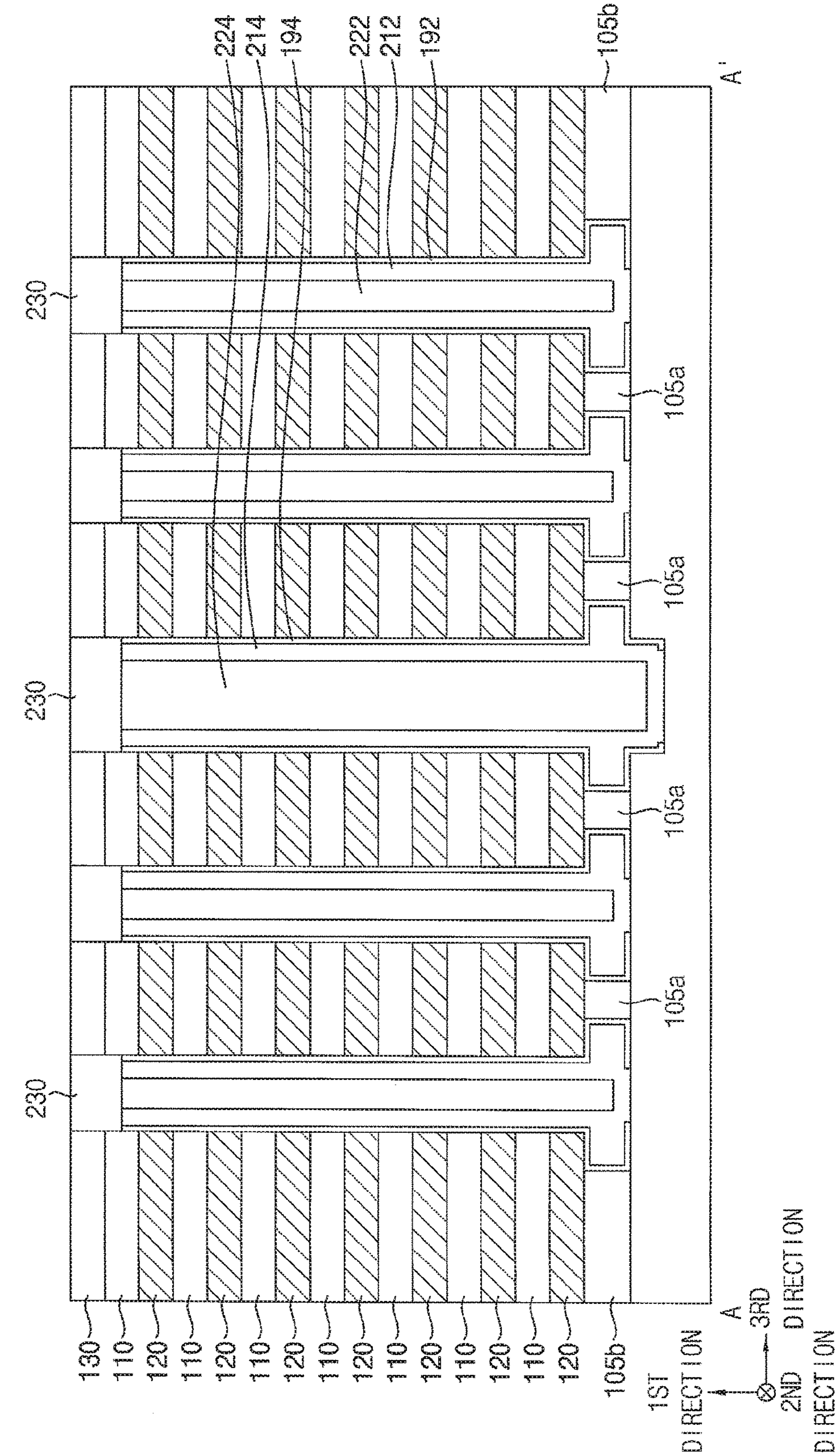

Referring to FIGS. 13 and 14, upper portions of the first and second structures may be removed to form trenches (not shown), and a capping pattern 230 may be formed to fill each of the trenches.

Particularly, after removing the upper portions of the first and second structures by an etch back process to form the trenches, a capping layer filling the trenches may be formed on the first and second structures and the first insulating interlayer 130, and an upper portion of the capping layer may be planarized until the upper surface of the first insulating interlayer 130 may be exposed to form the capping pattern 230. In example embodiments, the capping layer may be formed of doped or undoped polysilicon or amorphous silicon. When the capping layer is formed to include amorphous silicon, a crystallization process may be further performed thereon.

In an example embodiment, the capping layer may be formed of n-type impurities, e.g., phosphorus, arsenic, etc.

The first structure and the capping pattern 230 sequentially stacked in each of the channel holes 142 may define a third structure having a pillar shape, e.g., a solid cylindrical shape, and the second structure and the capping pattern 230 sequentially stacked in each of the dummy channel holes 144 may define a fourth structure having a pillar shape, e.g., a solid cylindrical shape.

In correspondence to the channel hole column, the channel hole block and the channel hole array, a third structure column, a third structure block, and a third structure array may be defined, and a fourth structure array may be defined in correspondence to the dummy channel hole column.

Figure 15:
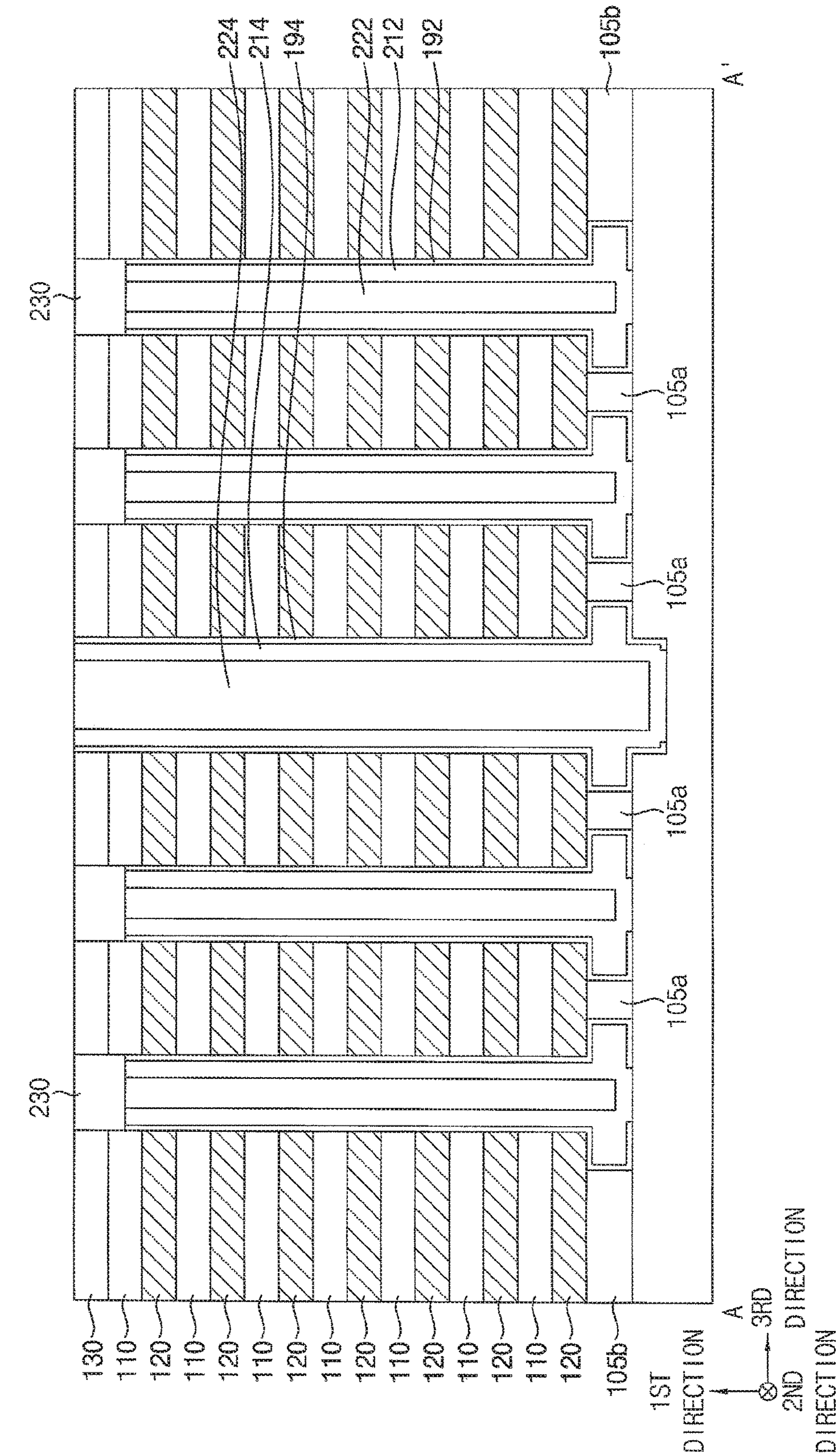

Alternatively, referring to FIG. 15, no capping pattern may be formed on the second structure. The capping pattern 230 may electrically connect each channel 212 to a bit line 370 (refer to FIGS. 26 to 28) subsequently formed, and the dummy channels 214 need not be electrically connected to the bit line 370. Thus, no capping pattern may be formed on the second structure.

Figure 16:
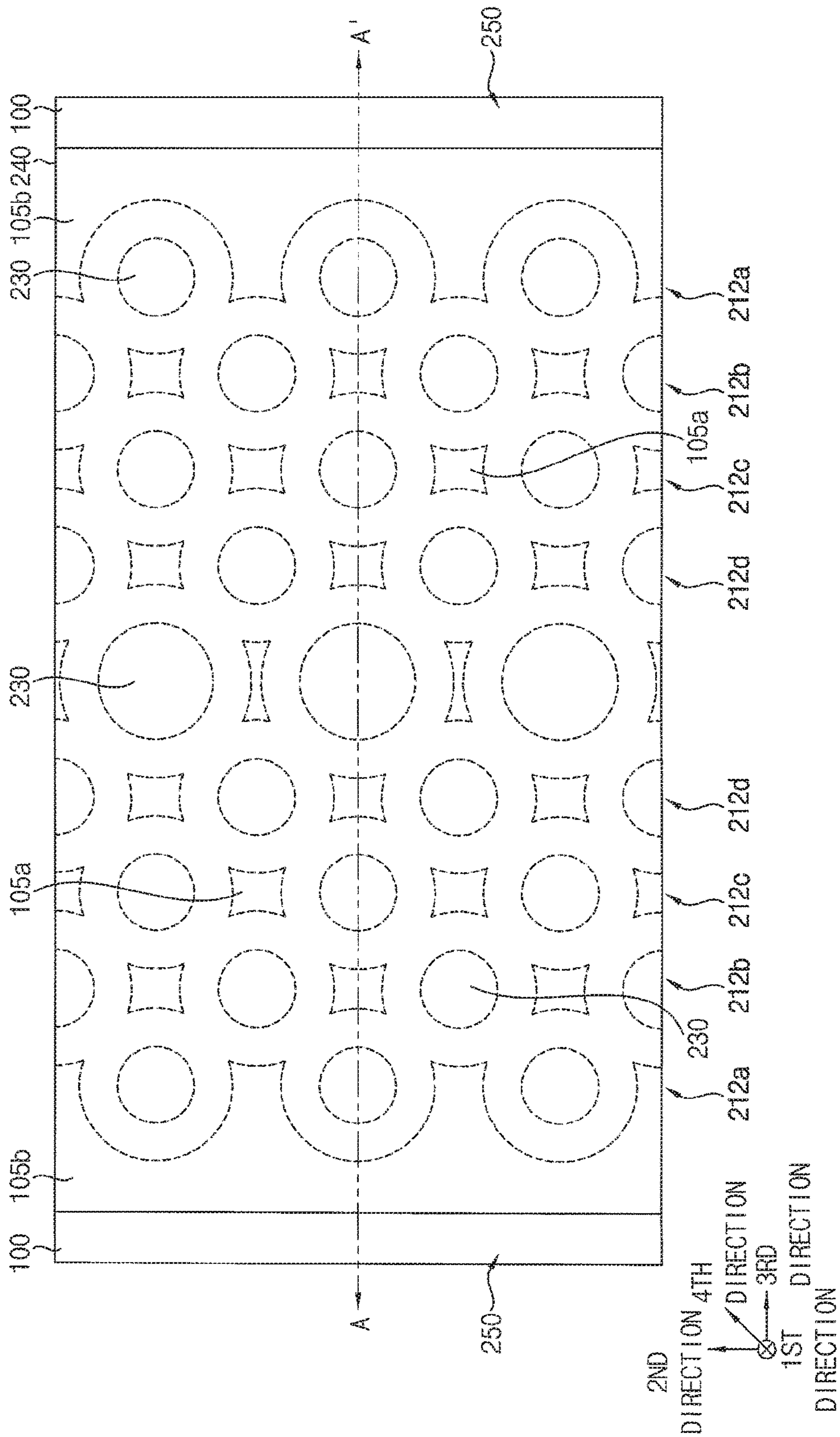
Figure 17:
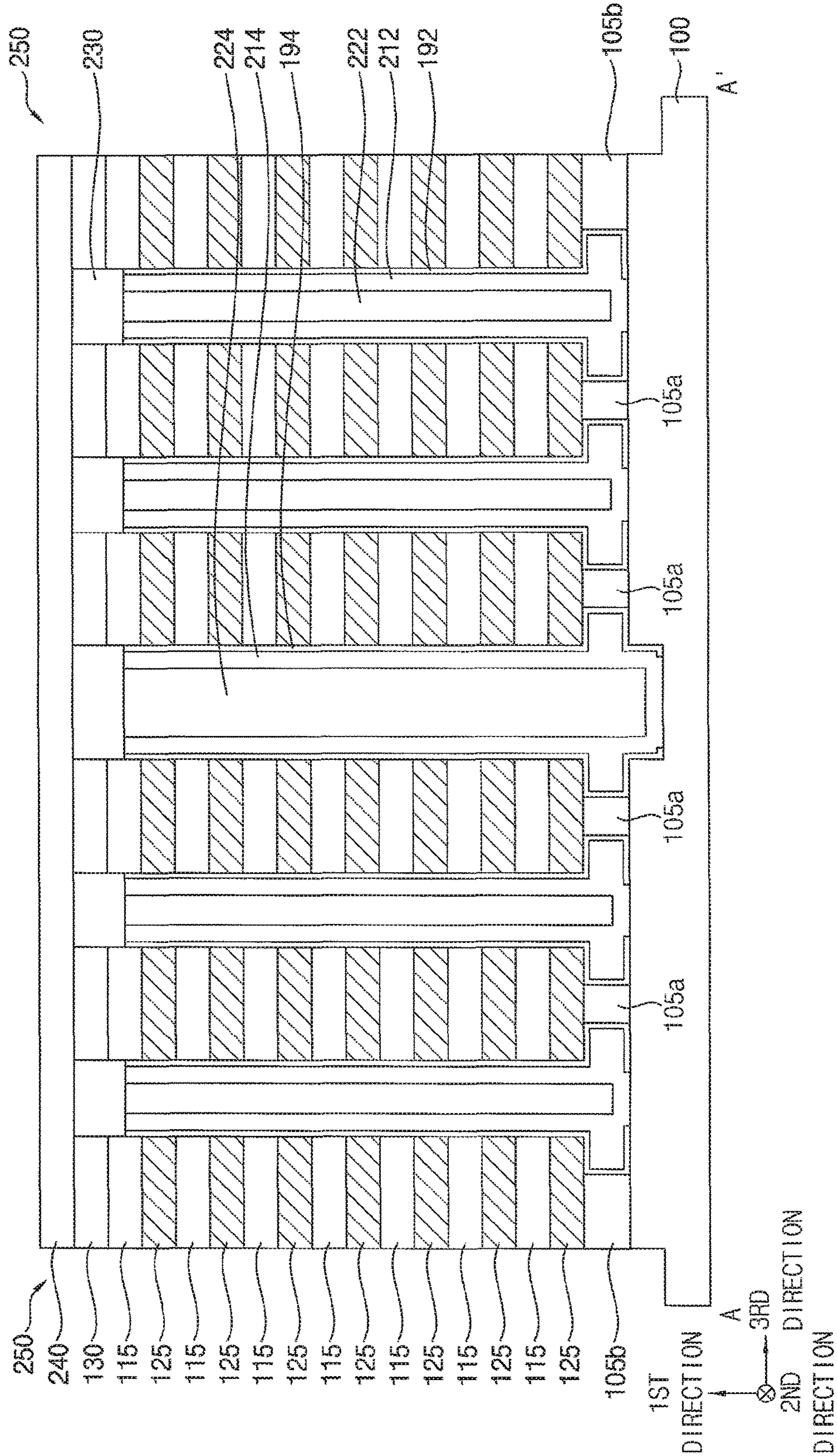

Referring to FIGS. 16 and 17, a second insulating interlayer 240 may be formed on the first insulating interlayer 130 and the capping pattern 230, and an opening 250 may be formed through the first and second insulating interlayers 130 and 240, the insulation layers 110, the sacrificial layers 120 and the second support pattern 105*b* to expose an upper surface of the substrate 100. An upper portion of the substrate 100 may be also removed.

The second insulating interlayer 240 may be formed of an oxide, e.g., silicon oxide, and thus may be merged into the first insulating interlayer 130.

In example embodiments, the opening 250 may be formed between the third structures disposed in the third direction, that is, may extend in the second direction between the first channel columns 212*a* included in neighboring channel blocks, and a plurality of openings 250 may be formed in the third direction.

According as the opening 250 extends in the second direction, each of the insulation layers 110 may be transformed into a plurality of insulation patterns 115 spaced apart from each other in the third direction, and each of the insulation patterns 115 may extend in the second direction. Additionally, each of the sacrificial layers 120 may be transformed into a plurality of sacrificial patterns 125 spaced apart from each other in the third direction, and each of the sacrificial patterns 125 may extend in the second direction.

Figure 18:
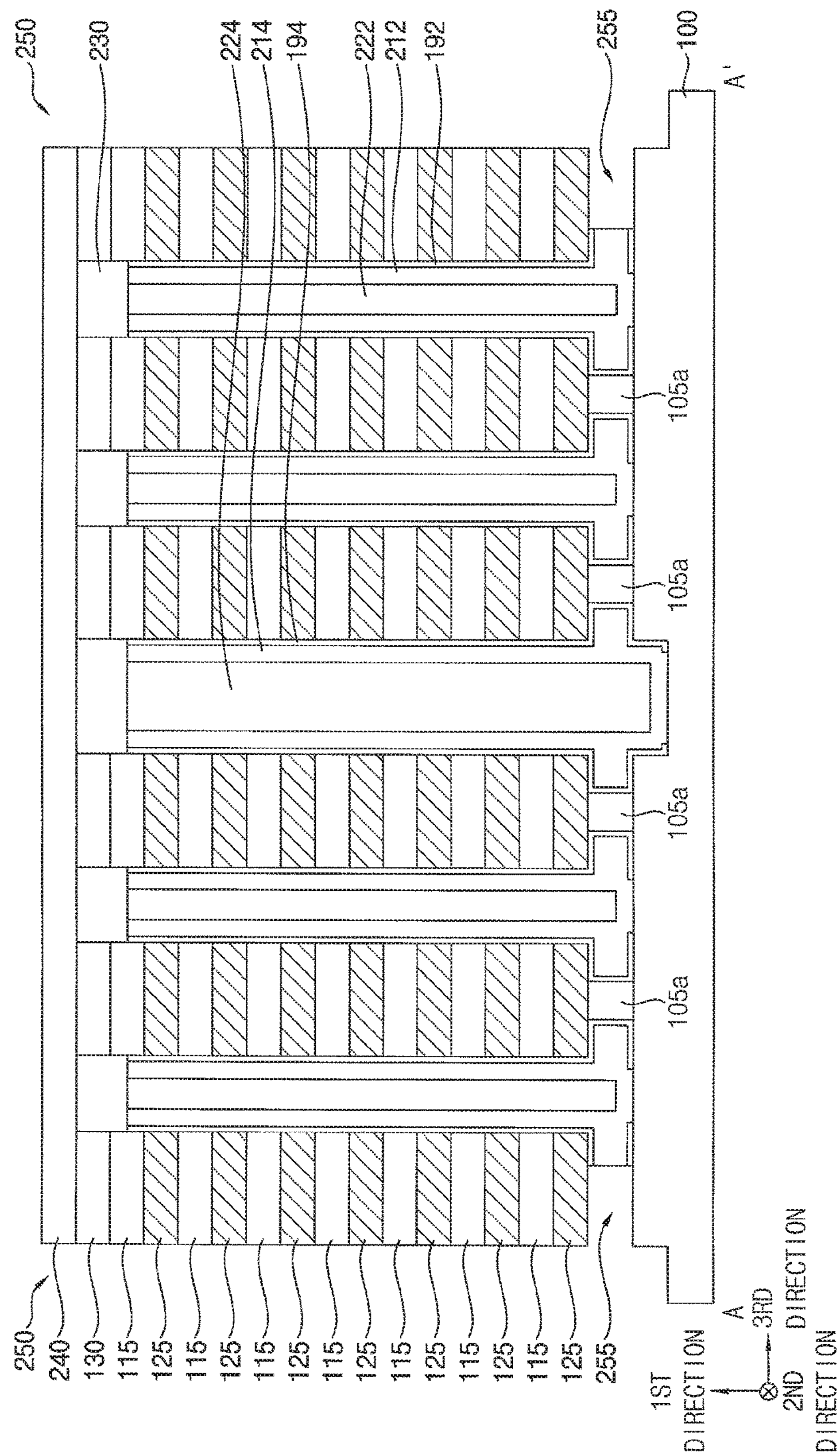

Referring to FIG. 18, the second support pattern 105*b* exposed by the opening 250 may be removed to form a first gap 255.

In example embodiments, after removing the second support pattern 105*b*, a portion of the first charge storage structure 192 contacting the second support pattern 105*b* may be also removed. Particularly, a portion of the first charge storage structure 192 contacting the first expansion portion of the channel 212 included in each of the first and second channel columns 212*a* and 212*b* may be removed.

Thus, the first gap 255 may be formed between the upper surface of the substrate 100 and the lowermost one of the sacrificial patterns 125, and may expose the first expansion portion of the channel 212 of each of the first and second channel columns 212*a* and 212*b*.

In example embodiments, the first gap 255 may be formed by a wet etching process.

Figure 19:
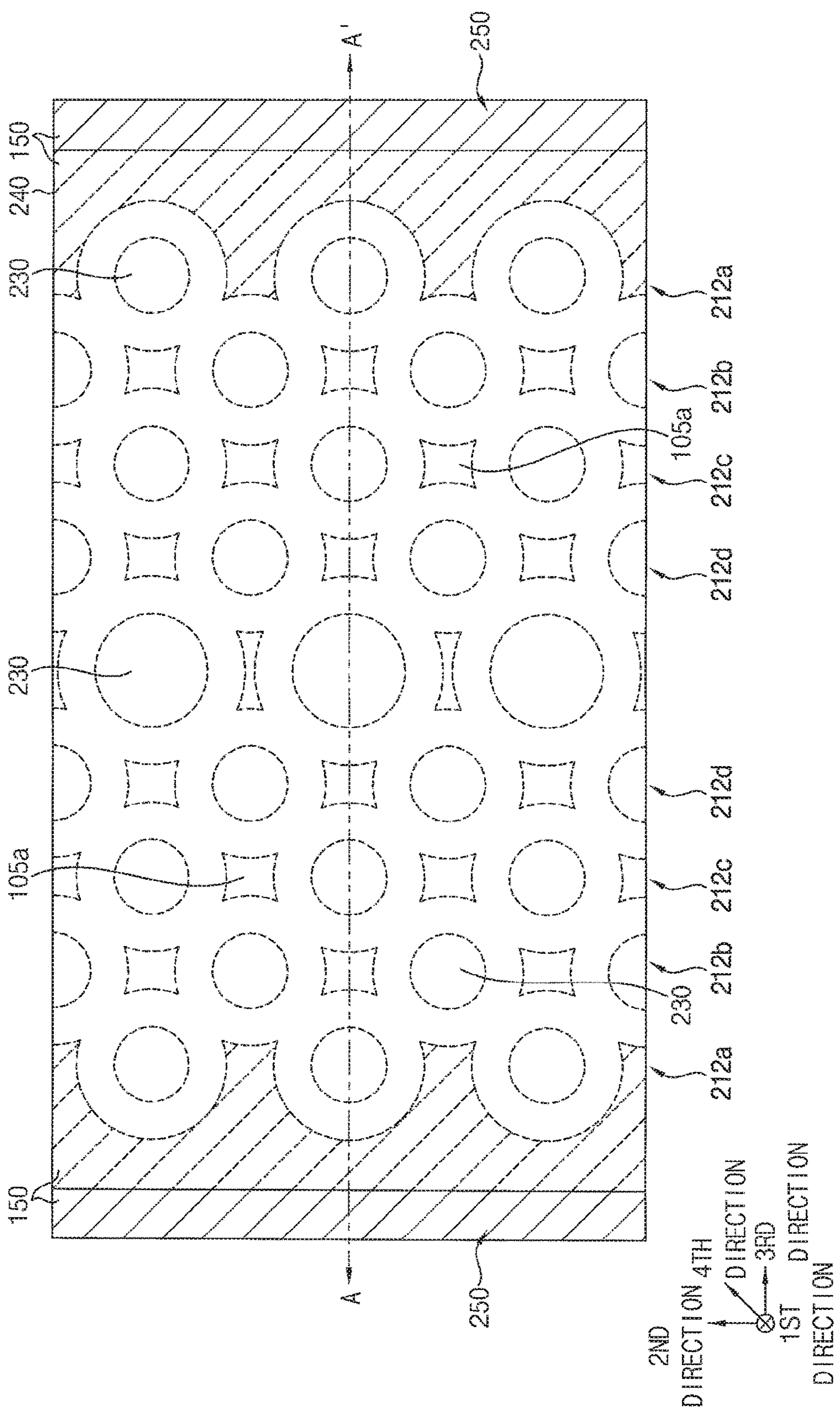
Figure 20:
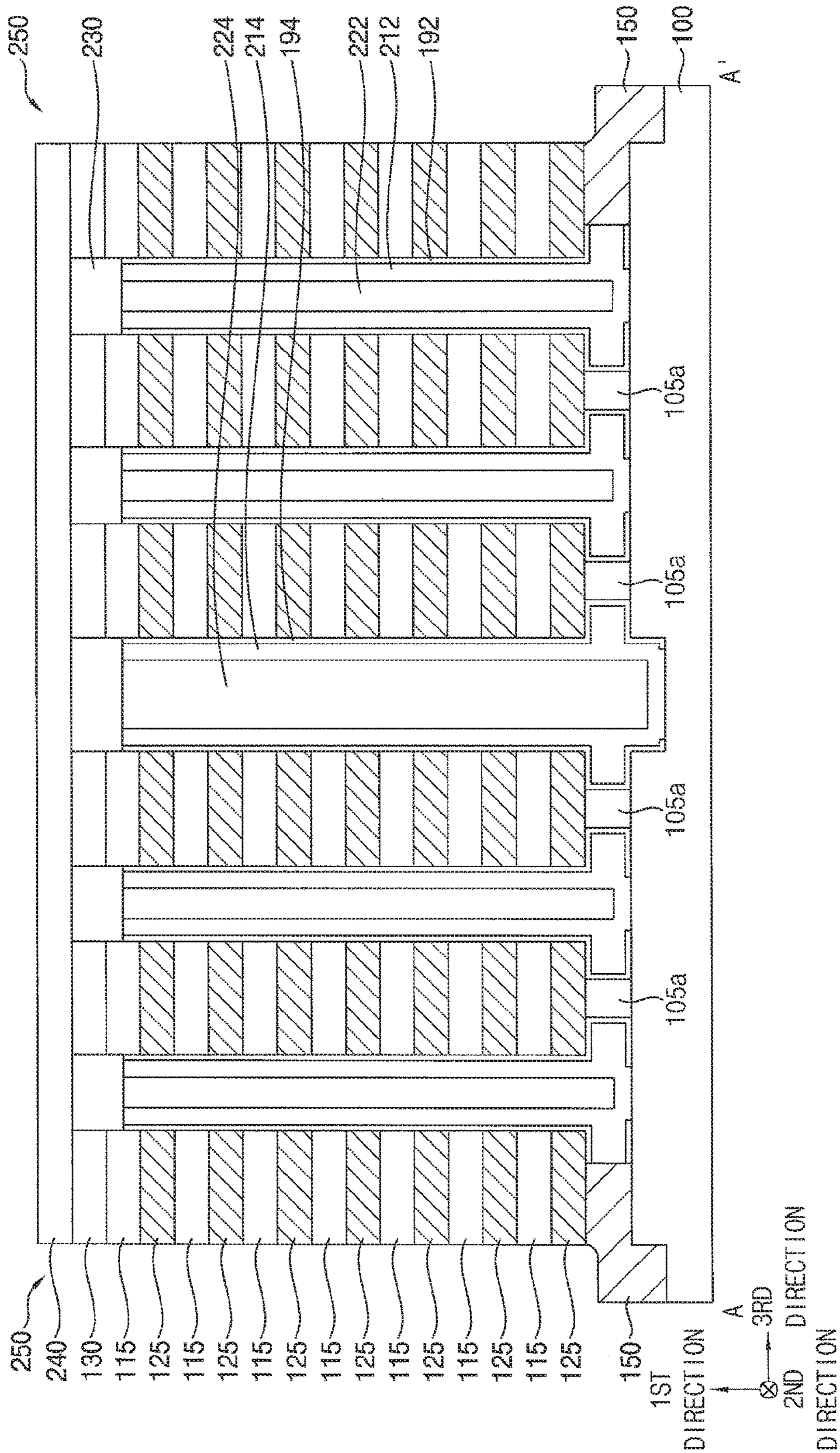

Referring to FIGS. 19 and 20, a selective epitaxial growth (SEG) process may be performed to form an epitaxial layer 150 on the upper surface of the substrate 100 exposed by the opening 250 and the first gap 255.

The substrate 100 may include silicon or germanium, and thus the epitaxial layer 150 may include single crystalline silicon or single crystalline germanium.

In example embodiments, the epitaxial layer 150 may completely fill the first gap 255, and thus may contact a lower portion of the channel 212, particularly, the first expansion portion of the channel 212 in each of the first and second channel columns 212*a* and 212*b*.

As illustrated above, the channels 212 of the first to fourth channel columns 212*a*, 212*b*, 212*c* and 212*d* and the dummy channels 214 may contact each other through the first and second expansion portions, and the epitaxial layer 150 may contact the first expansion portions of the channels 212 of the first and second channel columns 212*a* and 212*b* to be connected with each other. Thus, all channels 212 and the dummy channels 214 may be electrically connected to the epitaxial layer 150.

In example embodiments, the epitaxial layer 150 may extend in the second direction, and a portion in the lower portion of the opening 250 may not vertically overlap the insulation patterns 115 and the sacrificial patterns 125.

In example embodiments, the epitaxial layer 150, like the first support pattern 105*a*, may be formed between the upper surface of the substrate 100 and the lowermost one of the sacrificial patterns 125, and thus an upper surface of the epitaxial layer 150 may be substantially coplanar with an upper surface of the first support pattern 105*a*.

Figure 21:
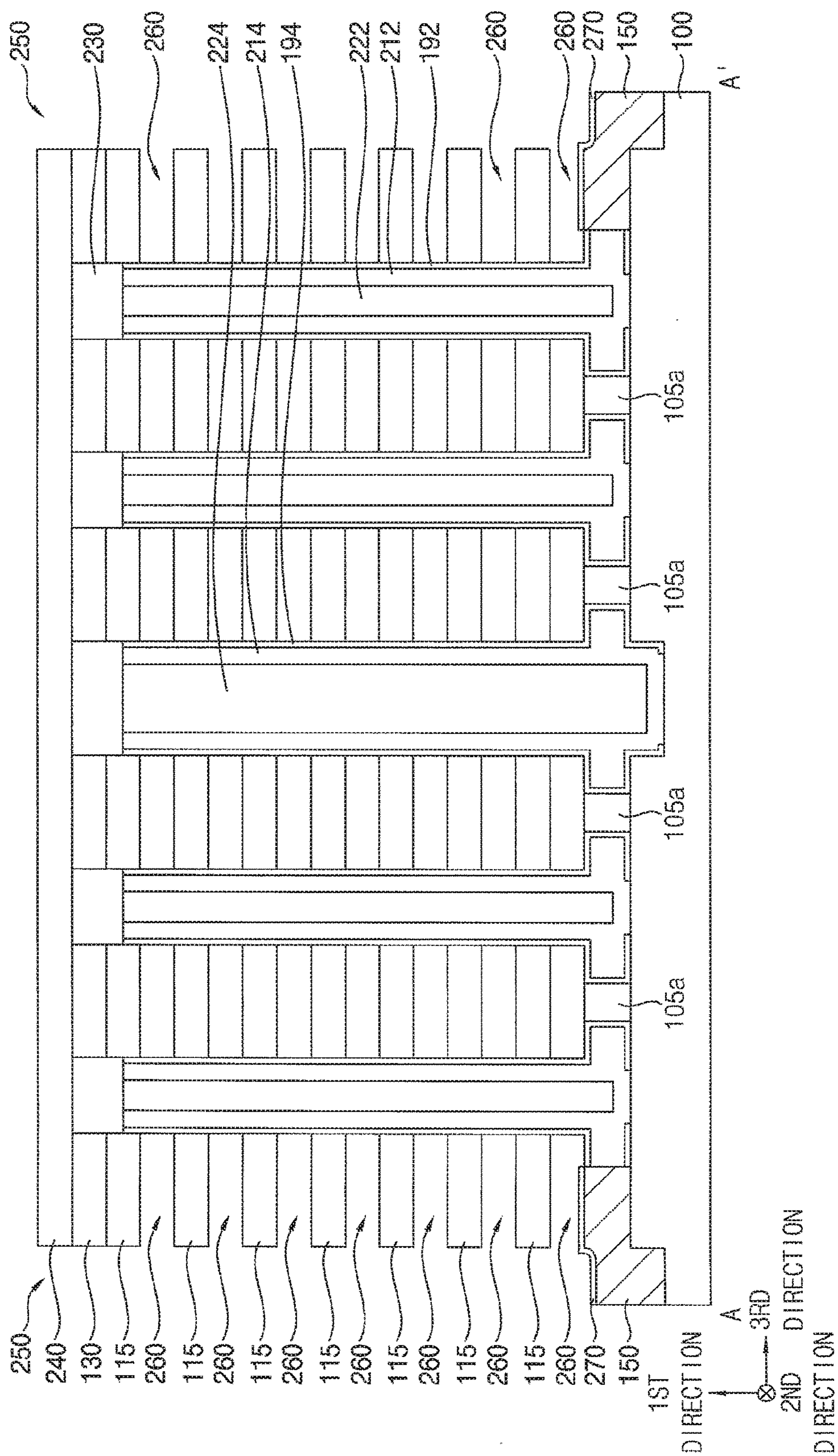

Referring to FIG. 21, the sacrificial patterns 125 exposed by the opening 250 may be removed to form a second gap 260 between the insulation patterns 115 sequentially stacked in the first direction, and the second gap 260 may expose a portion of an outer sidewall of each of the first and second charge storage structures 192 and 194 and a portion of the upper surface of the epitaxial layer 150.

In example embodiments, a wet etching process may be performed using an etching solution including phosphoric acid or sulfuric acid to remove the sacrificial patterns 125 exposed by the opening 250.

An oxidation process may be performed on the upper surface of the epitaxial layer 150 to form a gate insulation layer 270.

The epitaxial layer 150 may include silicon or germanium, and thus the gate insulation layer 270 may include silicon oxide or germanium oxide.

In example embodiments, the gate insulation layer 270 may be formed by performing a wet etching process using water vapor so that the upper surface of the epitaxial layer 150 including a semiconductor material exposed by the opening 250 and the second gap 260 may be oxidized. Alternatively, the gate insulation layer 270 may be formed by performing a dry etching process using oxygen gas.

Figure 22:
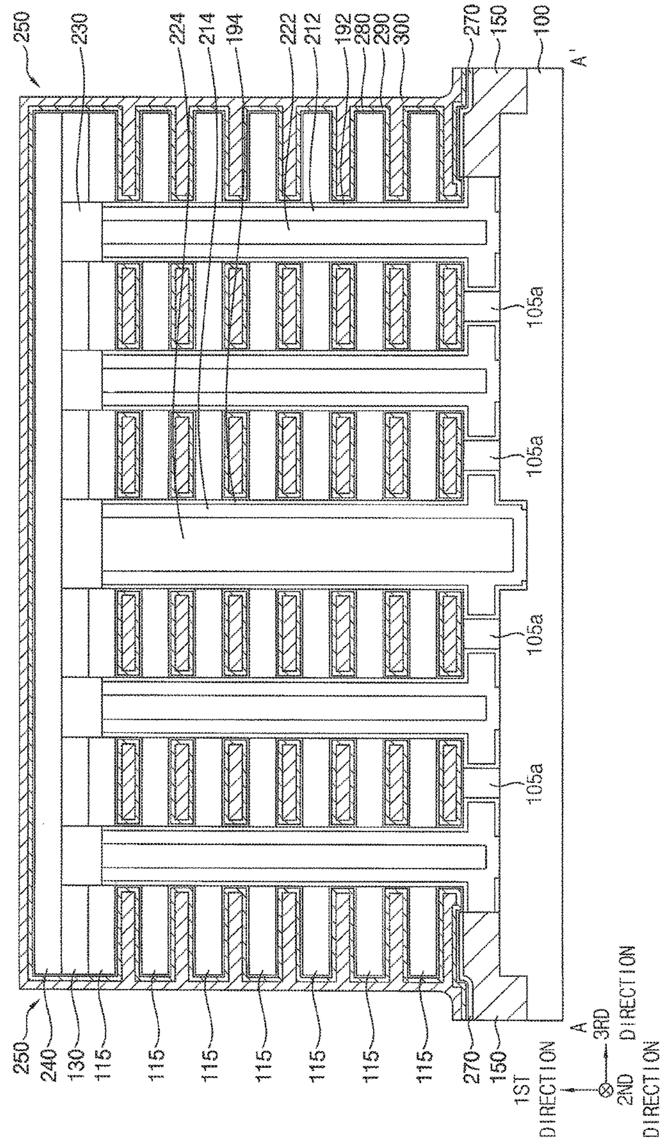

Referring to FIG. 22, after a second blocking layer 280 may be formed on the exposed portions of the outer sidewalls of the first and second charge storage structures 192 and 194, an upper surface of the gate insulation layer 270, inner walls of the second gaps 260, surfaces of the insulation patterns 115, and an upper surface of the second insulating interlayer 240, a gate barrier layer 290 may be formed on the second blocking layer 280, and a gate conductive layer 300 may be formed on the gate barrier layer 290 to sufficiently fill remaining portions of the second gaps 260.

The second blocking layer 280 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 300 may be formed of a metal having a low resistance, e.g., tungsten, titanium, tantalum, platinum, etc., and the gate barrier layer 290 may be formed of a metal nitride, e.g., titanium nitride, tantalum nitride, etc. Alternatively, the gate barrier layer 290 may be formed to have a first layer including a metal and a second layer including a metal nitride layer sequentially stacked.

Figure 23:
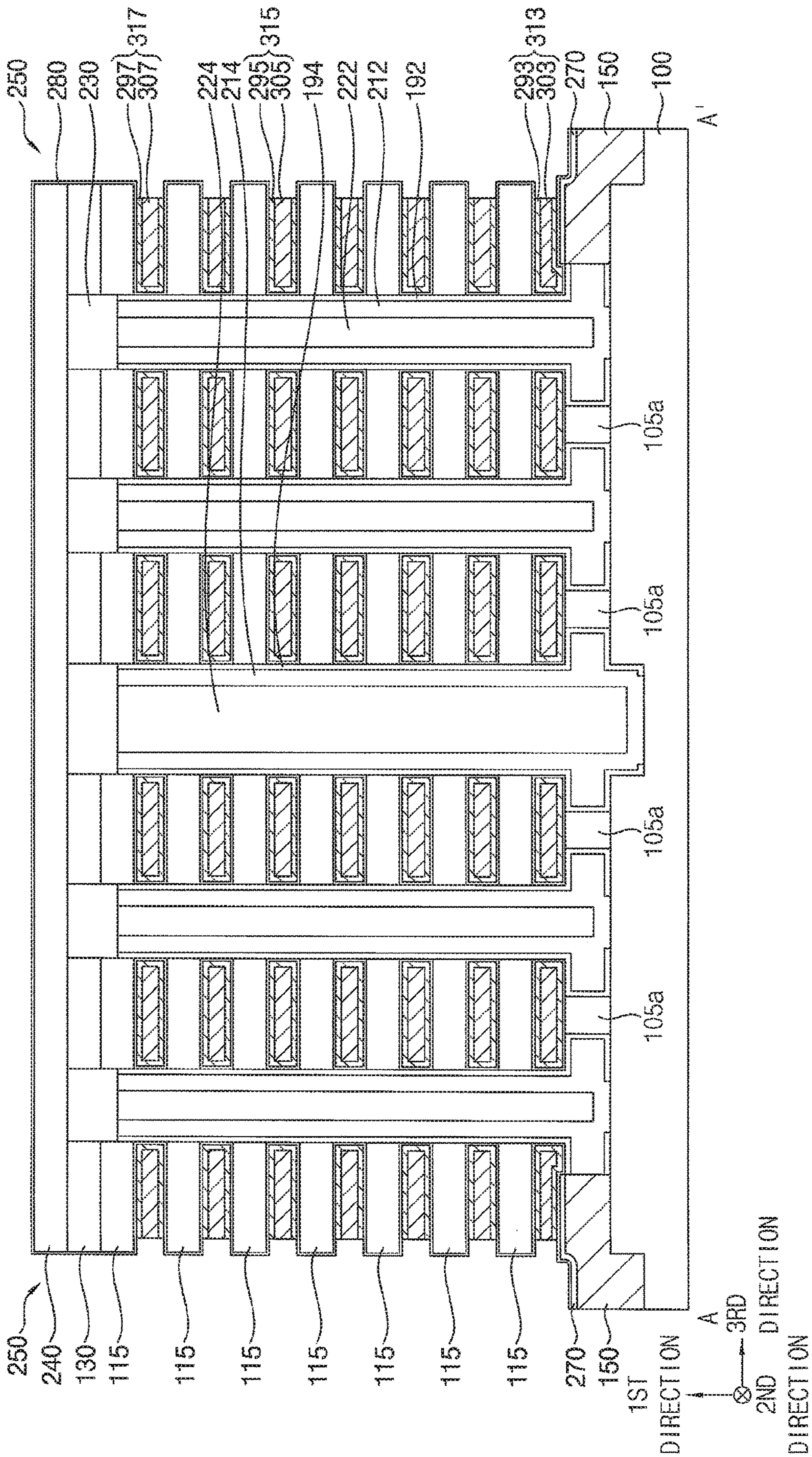

Referring to FIG. 23, the gate conductive layer 300 and the gate barrier layer 290 may be partially removed to form a gate conductive pattern and a gate barrier pattern, respectively, in each of the second gaps 260, which may form a gate electrode. In example embodiments, the gate conductive layer 300 and the gate barrier layer 290 may be partially removed by a wet etching process, and thus the gate electrode may partially fill each of the second gaps 260. That is, the gate electrode may fill a remaining portion of each of the second gaps 260 except for an entrance thereof.

In example embodiments, the gate electrode may be formed to extend in the second direction, and a plurality of gate electrodes may be formed in the third direction. That is, a plurality of gate electrodes each extending in the second direction may be spaced apart from each other in the third direction by the opening 250.

In example embodiments, the gate electrode may be formed at a plurality of levels spaced apart from each other in the first direction, and the gate electrodes at the plurality of levels may form a gate electrode structure. The gate electrode structure may include at least one first gate electrode 313, at least one second gate electrode 315, and at least one third gate electrode 317 sequentially stacked in the first direction over the upper surface of the substrate 100.

The first gate electrode 313 may include a first gate conductive pattern 303 extending in the second direction, and a first gate barrier pattern 293 covering a top and a bottom of the first gate conductive pattern 303 and corresponding portions of outer sidewalls of the first and second charge storage structures 192 and 194, the second gate electrode 315 may include a second gate conductive pattern 305 extending in the second direction, and a second gate barrier pattern 295 covering a top and a bottom of the second gate conductive pattern 305 and corresponding portions of the outer sidewalls of the first and second charge storage structures 192 and 194, and the third gate electrode 317 may include a third gate conductive pattern 307 extending in the second direction, and a third gate barrier pattern 297 covering a top and a bottom of the third gate conductive pattern 307 and corresponding portions of the outer sidewalls of the first and second charge storage structures 192 and 194.

In example embodiments, the first gate electrode 313 may serve as a ground selection line (GSL), the second gate electrode 315 may serve as a word line, and the third gate electrode 317 may serve as a string selection line (SSL). In an example embodiment, the first gate electrode 313 may be formed at a single level, the second gate electrode 315 may be formed at a plurality of levels, e.g., at even numbers of levels, and the third gate electrode 317 may be formed at two levels, however, inventive concepts are not limited thereto.

The first, second and third gate electrodes 313, 315 and 317 serving as the GSL, the word line and the SSL, respectively, may horizontally face portions of the sidewall of the first charge storage structure 192 on the outer sidewall of the channel 212, and particularly, the first gate electrode 313 serving as the GSL may also vertically face the gate insulation layer 270 on the epitaxial layer 150.

The gate insulation layer 270 may be formed between a portion of a lowermost one of the first gate electrodes 313 and the epitaxial layer 150, and thus the portion of the lowermost one of the first gate electrodes 313 may have a thickness in the first direction less than those of the second and third gate electrodes 315 and 317. That is, opposite ends of the first gate electrode 313 in the third direction under which the epitaxial layer 150 may be formed may have a thickness less than those of other portions of the first gate electrode 313 or those of the second and third gate electrodes 315 and 317. In example embodiments, since the gate insulation layer 270 may be formed between the lowermost one of the first gate electrodes 313 serving as the GSL and the epitaxial layer 150, the epitaxial layer 150 may serve as a channel of a ground selection transistor (GST) including the lowermost one of the first gate electrodes 313.

The first tunnel insulation pattern 182, the first charge storage pattern 172, the first blocking pattern 162, the second blocking layer 280, and one of the first to third gate electrodes 313, 315 and 317 may be sequentially stacked in the horizontal direction from the outer sidewall of the channel 212.

Figure 24:
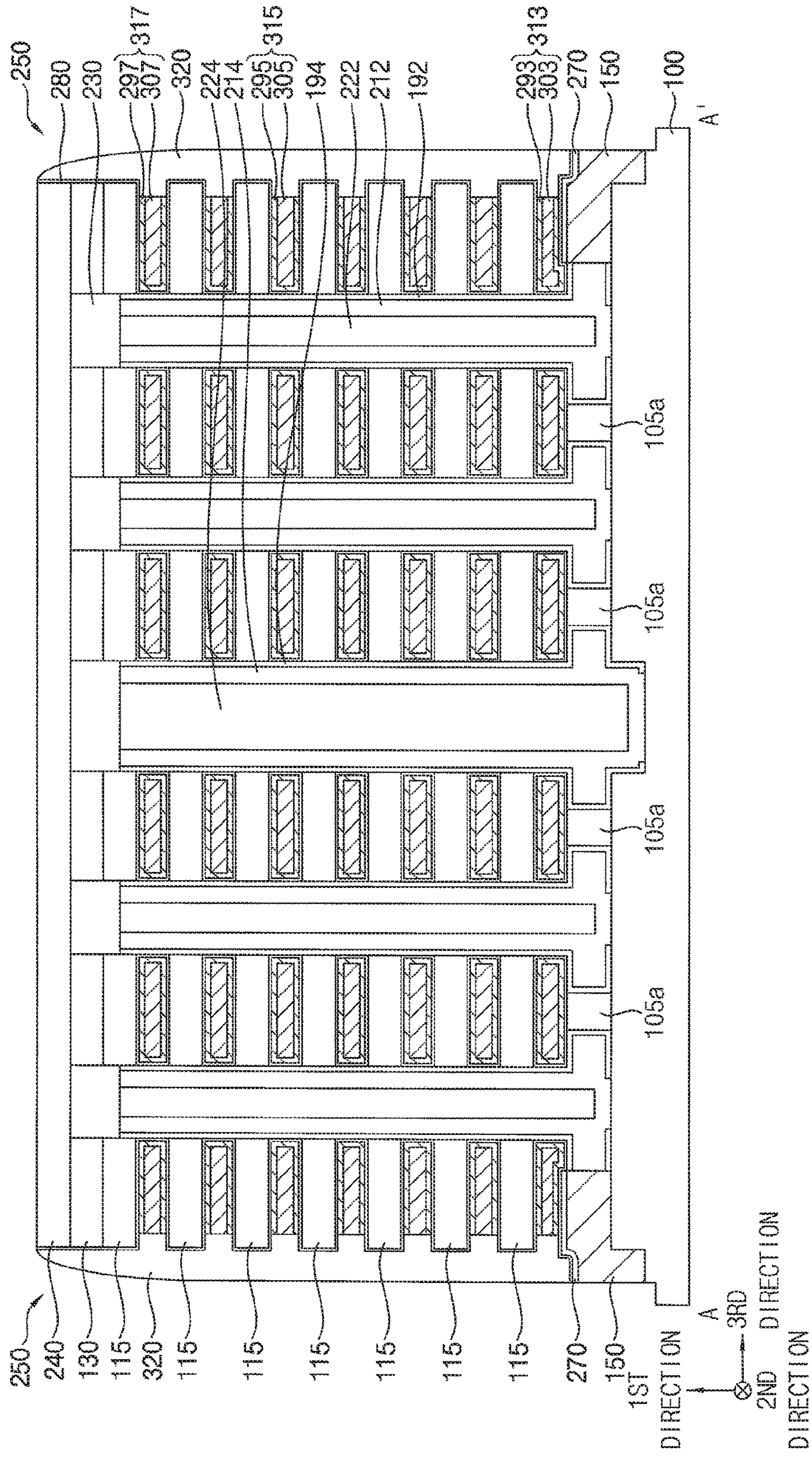

Referring to FIG. 24, impurities may be implanted into an upper portion of the substrate 100 through the second blocking layer 280 exposed due to the partial removal of the gate conductive layer 300 and the gate barrier layer 290 and portions of the gate insulation layer 270 and the epitaxial layer 150 thereunder to form an impurity region (not shown).

A second spacer layer may be formed on the second blocking layer 280, and may be anisotropically etched to form a second spacer 320 on sidewalls of the opening 250 so that a portion of the second blocking layer 280 on the impurity region may be exposed. The second spacer layer may be formed of an oxide, e.g., silicon oxide.

Alternatively, before forming the second spacer 320, impurities may be lightly implanted into an upper portion of the substrate 100 to form a first impurity region (not shown), and after forming the second spacer 320, impurities may be heavily implanted into the upper portion of the substrate 100 to form a second impurity region (not shown).

A portion of the second blocking layer 280 not covered by the second spacer 320 and portions of the gate insulation layer 270 and the epitaxial layer 150 thereunder may be etched using the second spacer 320 as an etching mask to expose an upper surface of the substrate 100 under which the impurity region is formed, and a portion of the second blocking layer 280 on the second insulating interlayer 240 may be also removed.

Figure 25:
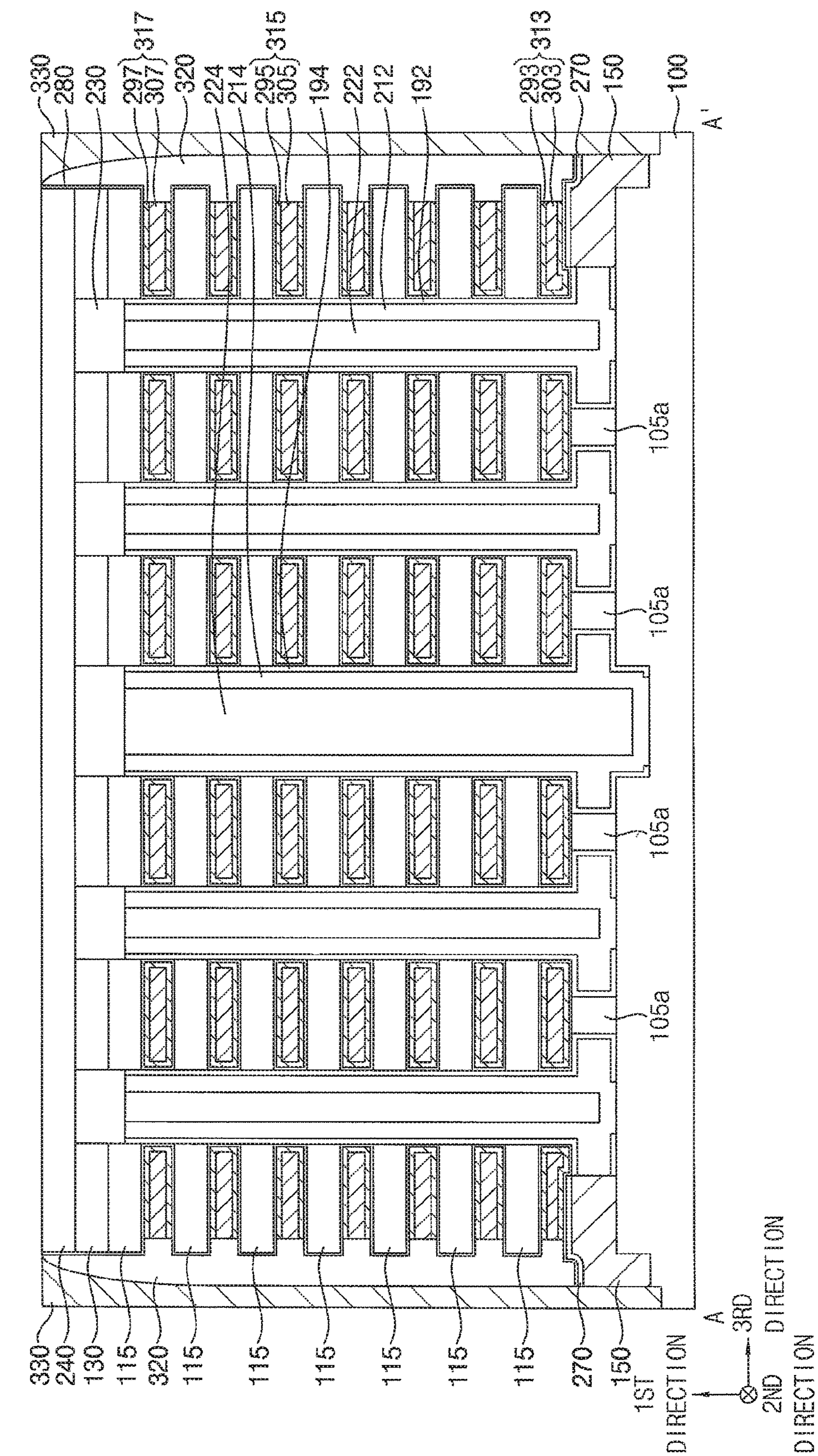
Figure 26:
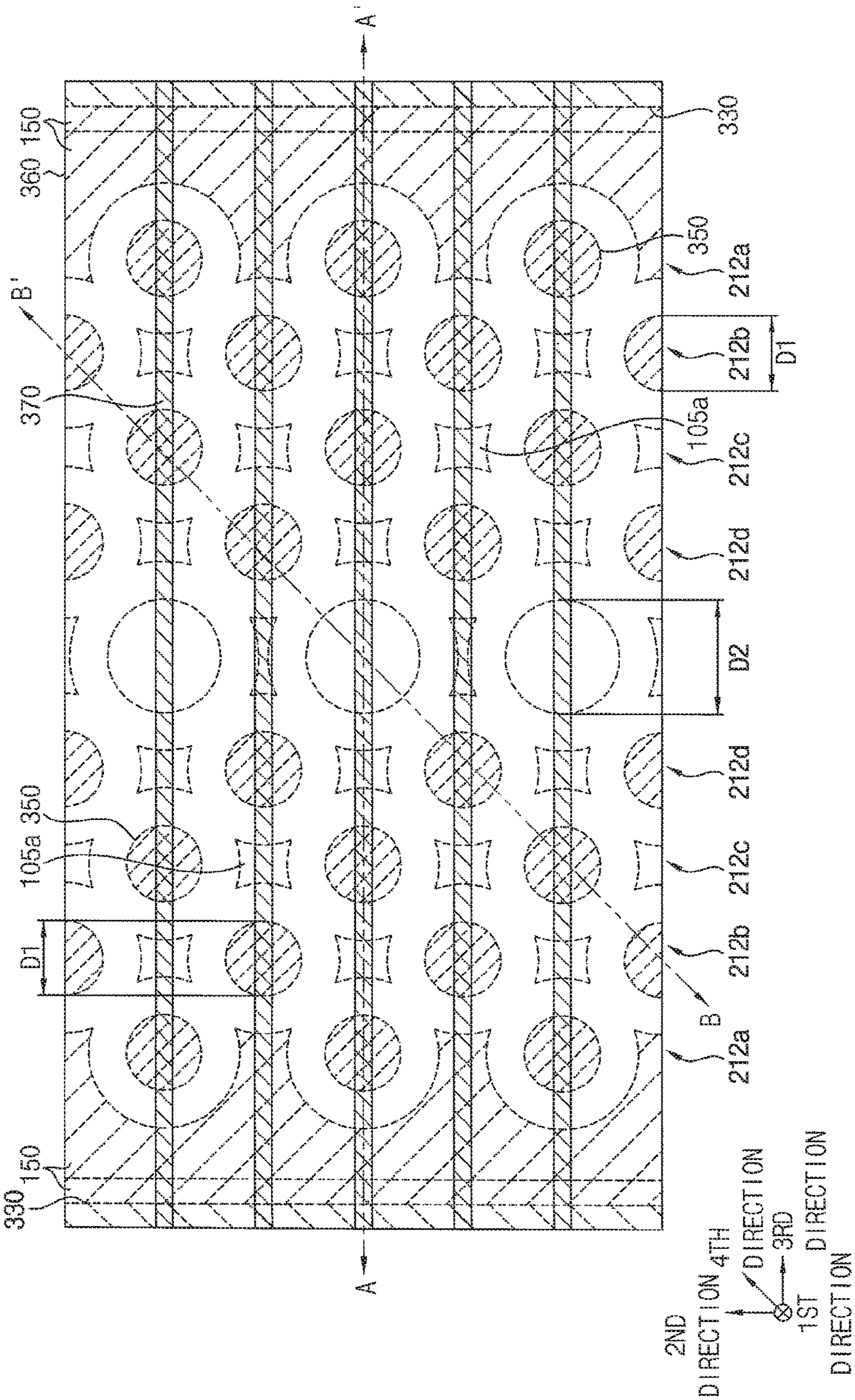

Referring to FIG. 25, a conductive layer may be formed on the exposed upper surface of the substrate 100, the second spacer 320 and the second insulating interlayer 240 to sufficiently fill a remaining portion of the opening 250, and may be planarized until an upper surface of the second insulating interlayer 240 may be exposed to form a common source line (CSL) 330. The conductive layer may be formed of, e.g., a metal, a metal nitride and/or a metal silicide.

In example embodiments, the CSL 330 may extend in the first direction, and also extend in the second direction. A bottom of the CSL 330 may be covered by the impurity region.

Referring to FIGS. 26, 27A, 27B, 28A and 28B, a third insulating interlayer 340 may be formed on the second insulating interlayer 240, the CSL 330, the second spacer 320 and the second blocking layer 280, and a first contact plug 350 may be formed through the second and third insulating interlayers 240 and 340 to contact the capping pattern 230. However, no contact plug may be formed on the capping pattern 230 on the second structure including the dummy channel 214.

A fourth insulating interlayer (not shown) may be formed on the third insulating interlayer 340 and the first contact plug 350. A bit line 370 may be formed through the fourth insulating interlayer to contact the first contact plug 350.

The third insulating interlayer 340 and the fourth insulating interlayer may be formed of an oxide, e.g., silicon oxide, and the first contact plug 350 and the bit line 370 may be formed of a metal, e.g., tungsten, tantalum, titanium, etc., or a metal nitride, e.g., titanium nitride, tantalum nitride, tungsten nitride, etc.

In example embodiments, the bit line 370 may extend in the third direction, and a plurality of bit lines 370 may be formed in the second direction.

The vertical memory device may be manufactured by the above processes.

As illustrated above, in the method of manufacturing the vertical memory device, after forming the support layer 105 on the substrate 100, the sacrificial layer 120 and the insulation layer 110 may be alternately and repeatedly formed on the support layer 105, and the channel holes 142 may be formed therethrough. The dummy channel holes 144 having widths greater than those of the channel holes 142 may be also formed so that at least the dummy channel holes 144 may expose the upper surface of the substrate 100 even if the channel holes 142 may not expose the upper surface of the substrate 100. Thus, at least the dummy channels 214 filling the dummy channel holes 144 may contact the upper surface of the substrate 100, and may be electrically connected to the impurity region, e.g., a p-type impurity region at the upper portion of the substrate 100.

The portions of the support layer 105 exposed by the channel holes 142 and the dummy channel holes 144 may be partially removed to form the first and second support patterns 105*a* and 105*b*, and the channel holes 142 and the dummy channel holes 144 may be in communication with each other. Thus, the channels 212 and the dummy channels 214 filling the channel holes 142 and the dummy channel holes 144, respectively, may contact each other at least between the upper surface of the substrate 100 and the lowermost one of the sacrificial layers 120.

Accordingly, the channels 212 may be electrically connected to the impurity region at the upper portion of the substrate 100 at least through the dummy channels 214, and may be electrically connected to an outer wiring (not shown) through the impurity region.

Further, the second support pattern 105*b* exposed by the opening 250 for forming the gate electrodes 313, 315 and 317 may be removed to expose an upper surface of the substrate 100, and an SEG process may be performed on the exposed upper surface of the substrate 100. The epitaxial layer 150 may contact ones of the channels 212, e.g., the channels 212 included in the first and second channel columns 212*a* and 212*b* to be electrically thereto, and as a result, all of the channels 212 and the dummy channels 214 may be electrically connected to each other through the epitaxial layer 150.

FIGS. 29 to 32 are cross-sectional views illustrating stages of a method of manufacturing a vertical memory device in accordance with example embodiments. FIGS. 29 to 32 are cross-sectional views along a cutline A-A' of corresponding plan views, e.g., FIGS. 19, 26, etc. This method may include processes substantially the same as or similar to those illustrated with reference to FIGS. 1 to 28.

Thus, like reference numerals refer to like elements, and detailed descriptions thereon may be omitted below in the interest of brevity.

First, processes substantially the same as or similar to those illustrated with reference to FIGS. 1 to 18 may be performed.

Figure 29:
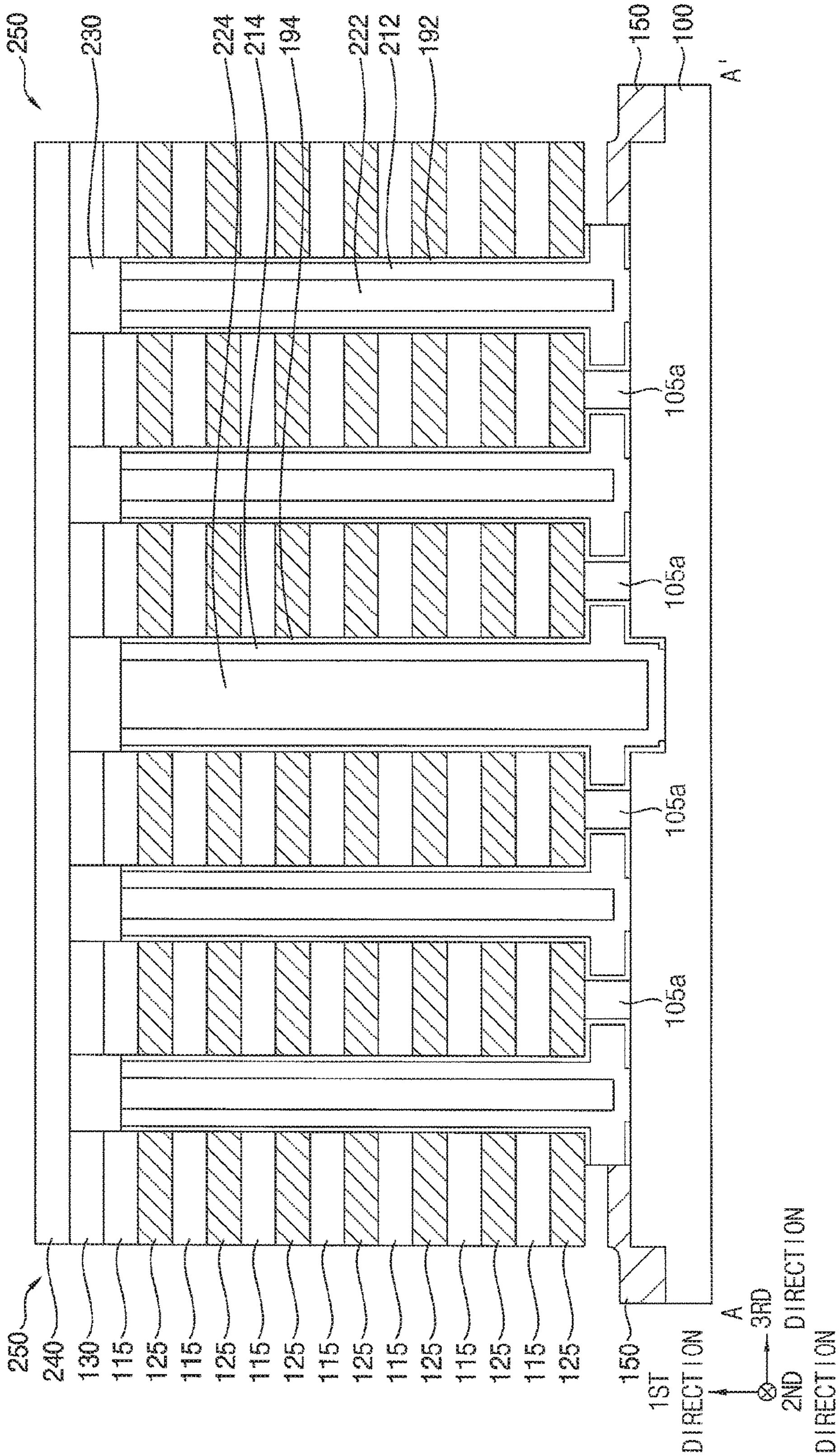
FIGS. 29 to 32 are cross-sectional views illustrating stages of a method of manufacturing a vertical memory device in accordance with example embodiments.

Referring to FIG. 29, a process substantially the same as or similar to that illustrated with reference to FIGS. 19 and 20 may be performed.

That is, an SEG process may be performed to form the epitaxial layer 150 on the upper surface of the substrate 100 exposed by the opening 250 and the first gap 255.

However, unlike that of FIGS. 19 and 20, the epitaxial layer 150 may not completely fill the first gap 255 but partially fill the first gap 255. Thus, a top surface of the epitaxial layer 150 may be formed to be lower than an upper surface of the first support pattern 105*a*.

Figure 30:
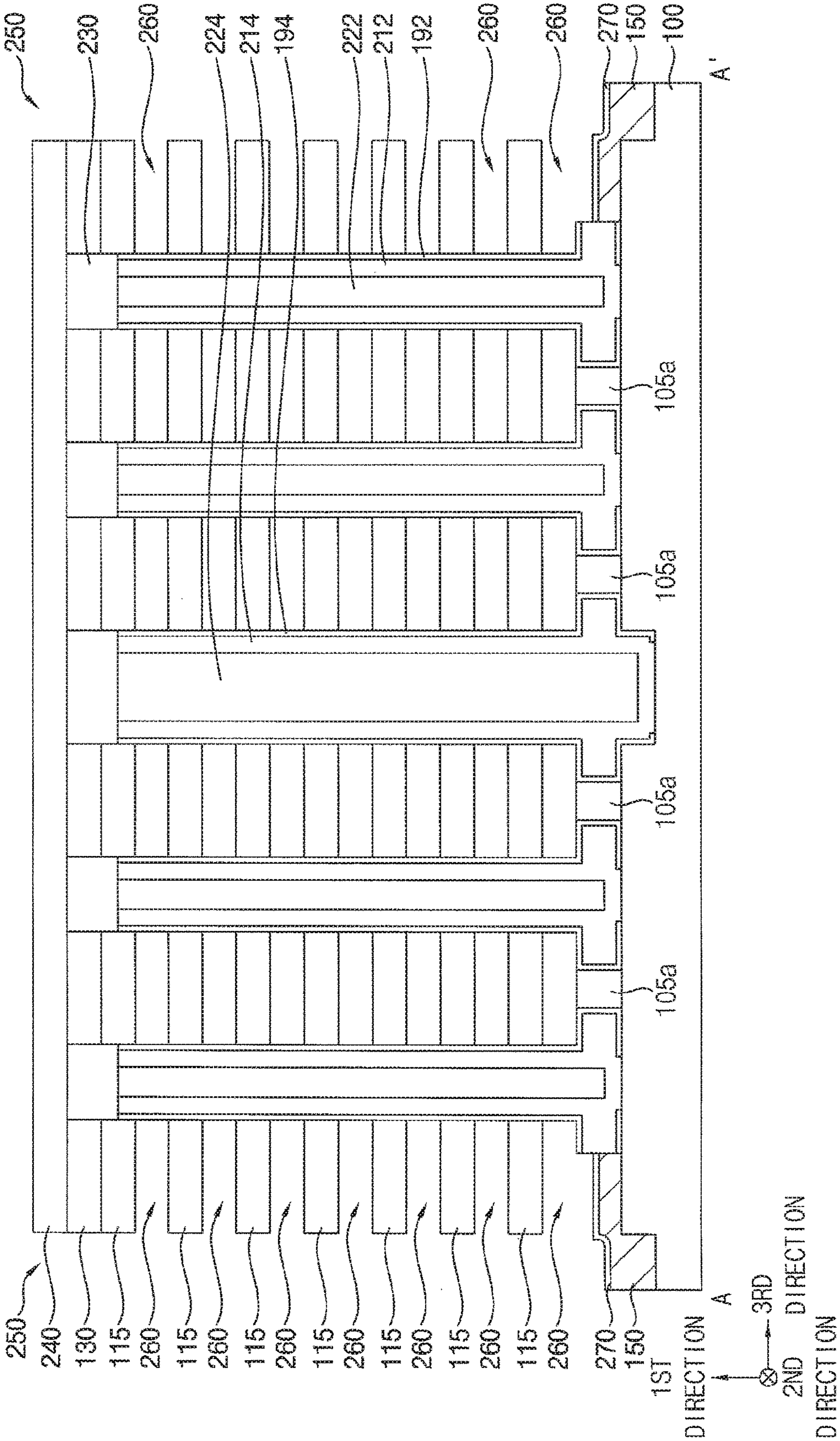

Referring to FIG. 30, a process substantially the same as or similar to that illustrated with reference to FIG. 21 may be performed.

Thus, the sacrificial patterns 125 exposed by the opening 250 may be removed to form the second gap 260 between neighboring ones of the insulation patterns 115 disposed in the first direction, and a portion of an outer sidewall of each of the first and second charge storage structures 192 and 194 and a portion of the upper surface of the epitaxial layer 150 may be exposed by the second gap 260. In ones of the second gap 260 between the upper surface of the substrate 100 and the lowermost one of the insulation patterns 115, a portion adjacent the opening 250, e.g., a portion under which the epitaxial layer 150 is formed may have a width in the first direction greater than those of other portions.

An oxidation process may be performed on the epitaxial layer 150 to form the gate insulation layer 270.

Figure 31:
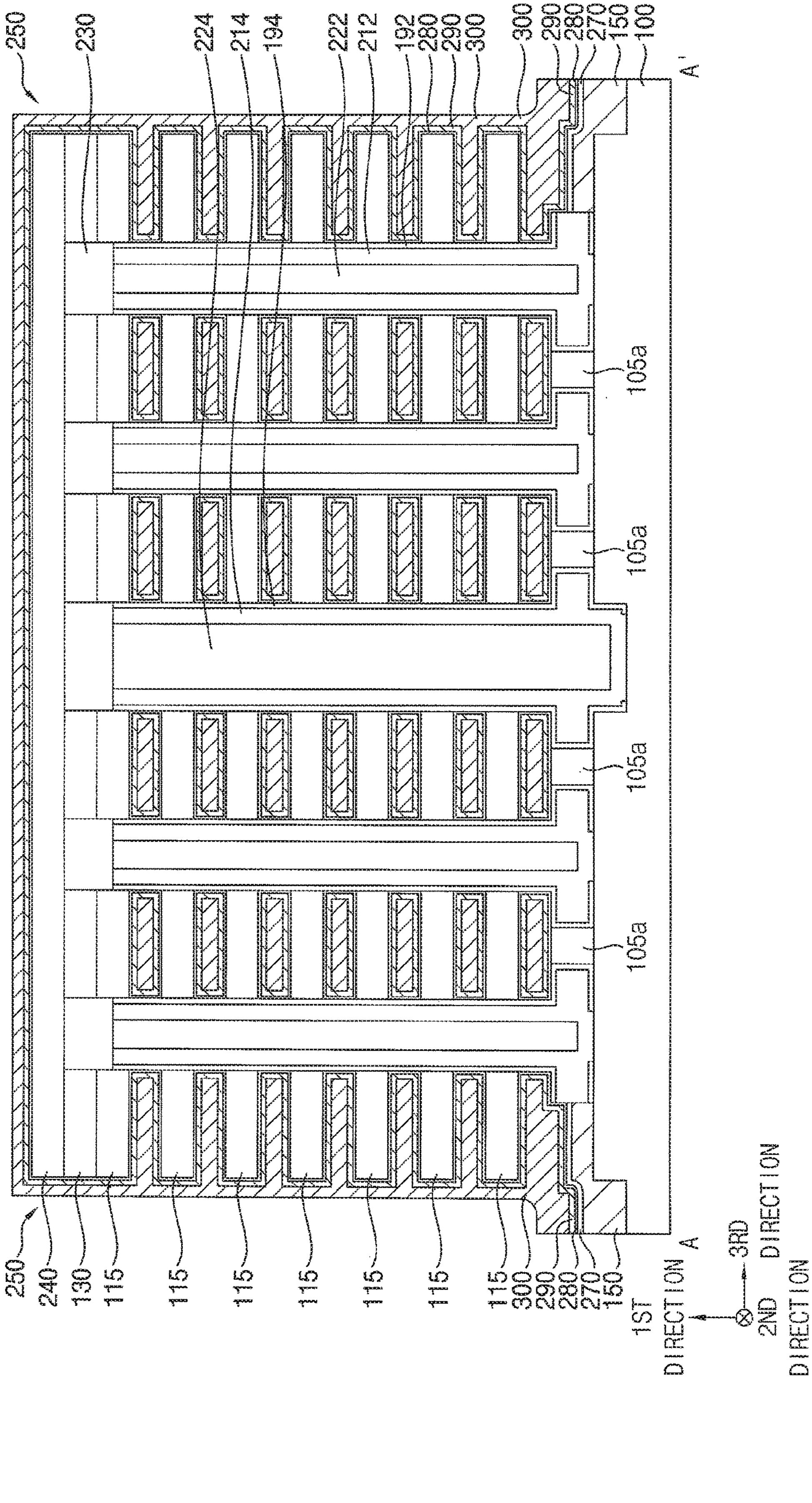

Referring to FIG. 31, a process substantially the same as or similar to that illustrated with reference to FIG. 22 may be performed.

Thus, after the second blocking layer 280 may be formed on the exposed portions of the outer sidewalls of the first and second charge storage structures 192 and 194, the upper surface of the gate insulation layer 270, the inner walls of the second gaps 260, the surfaces of the insulation patterns 115, and the upper surface of the second insulating interlayer 240, the gate barrier layer 290 may be formed on the second blocking layer 280, and the gate conductive layer 300 may be formed on the gate barrier layer 290 to sufficiently fill remaining portions of the second gaps 260.

Figure 32:
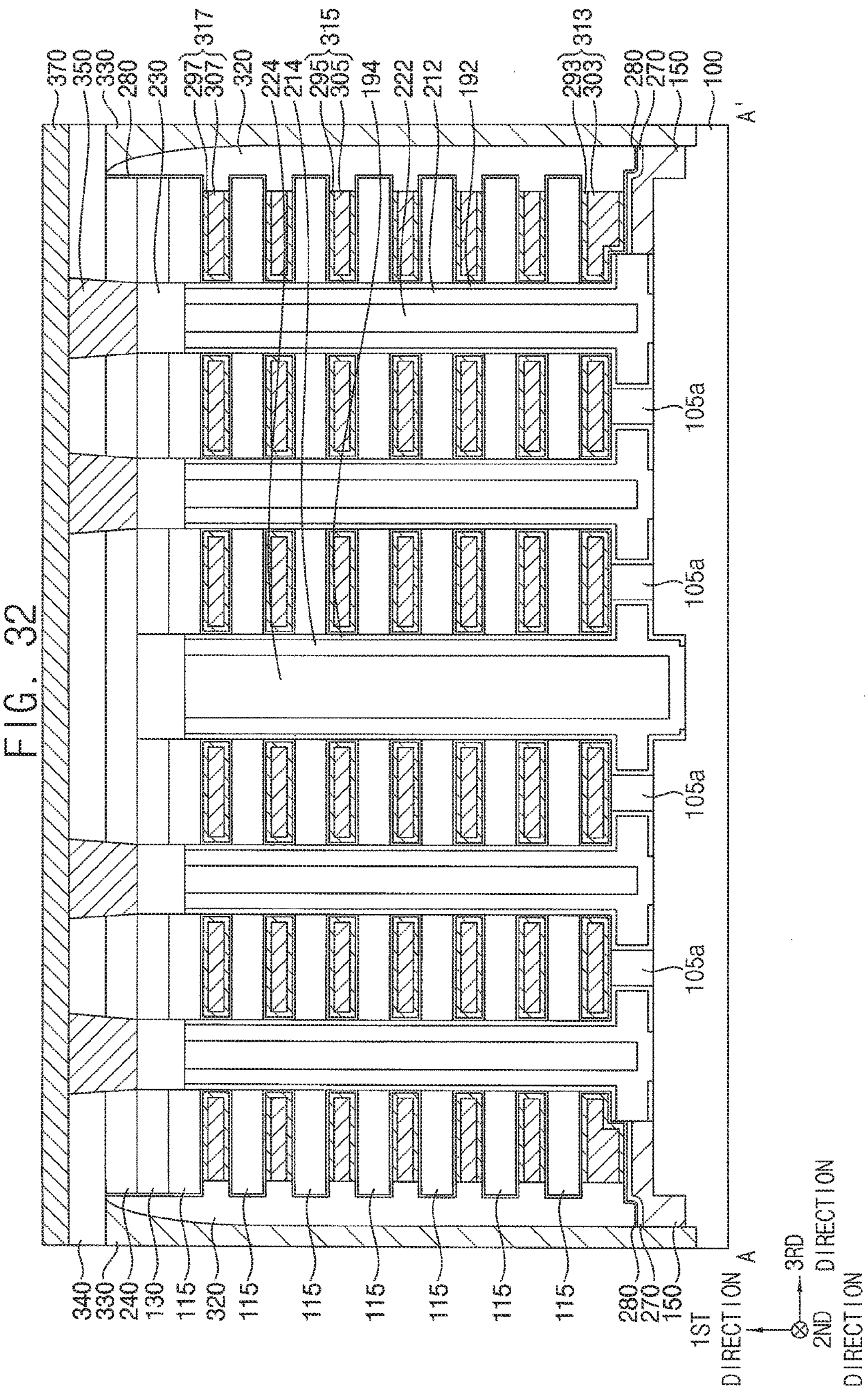

Referring to FIG. 32, processes substantially the same as or similar to those illustrated with reference to FIGS. 23 to 28 may be performed to complete the vertical memory device.

In the vertical memory device, the epitaxial layer 150 may have the top surface lower than the upper surface of the first support pattern 105*a*, and thus the portion of the first gate electrode 313 on the epitaxial layer 150 may have a thickness greater those of other portions thereof.

FIGS. 33 to 36 are cross-sectional views illustrating stages of a method of manufacturing a vertical memory device in accordance with example embodiments. FIGS. 33 to 36 are cross-sectional views along a cutline A-A' of corresponding plan views, e.g., FIGS. 16, 19, 26, etc. This method may include processes substantially the same as or similar to those illustrated with reference to FIGS. 1 to 28. Thus, like reference numerals refer to like elements, and detailed descriptions thereon may be omitted below in the interest of brevity.

Figure 33:
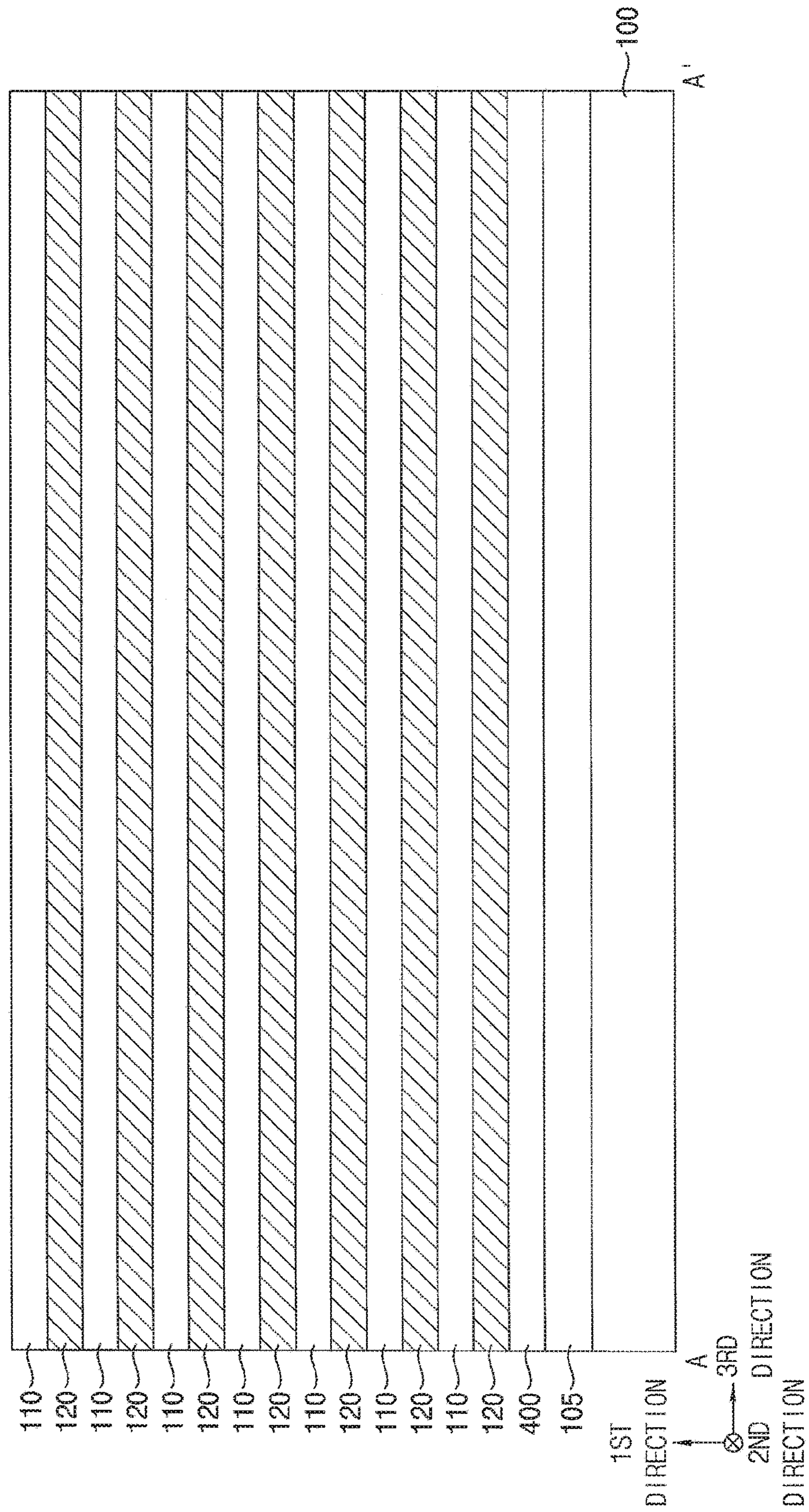
FIGS. 33 to 36 are cross-sectional views illustrating stages of a method of manufacturing a vertical memory device in accordance with example embodiments.

Referring to FIG. 33, a process substantially the same as or similar to that illustrated with reference to FIG. 1 may be performed.

However, after forming the support layer 105 on the substrate 100, an etch stop layer 400 may be further formed on the support layer 105, and the sacrificial layers 120 and the insulation layers 110 may be alternately and repeatedly formed on the etch stop layer 400.

The etch stop layer 400 may be formed of a material having an etching selectivity with respect to the support layer 105, e.g., polysilicon or an oxide.

Figure 34:
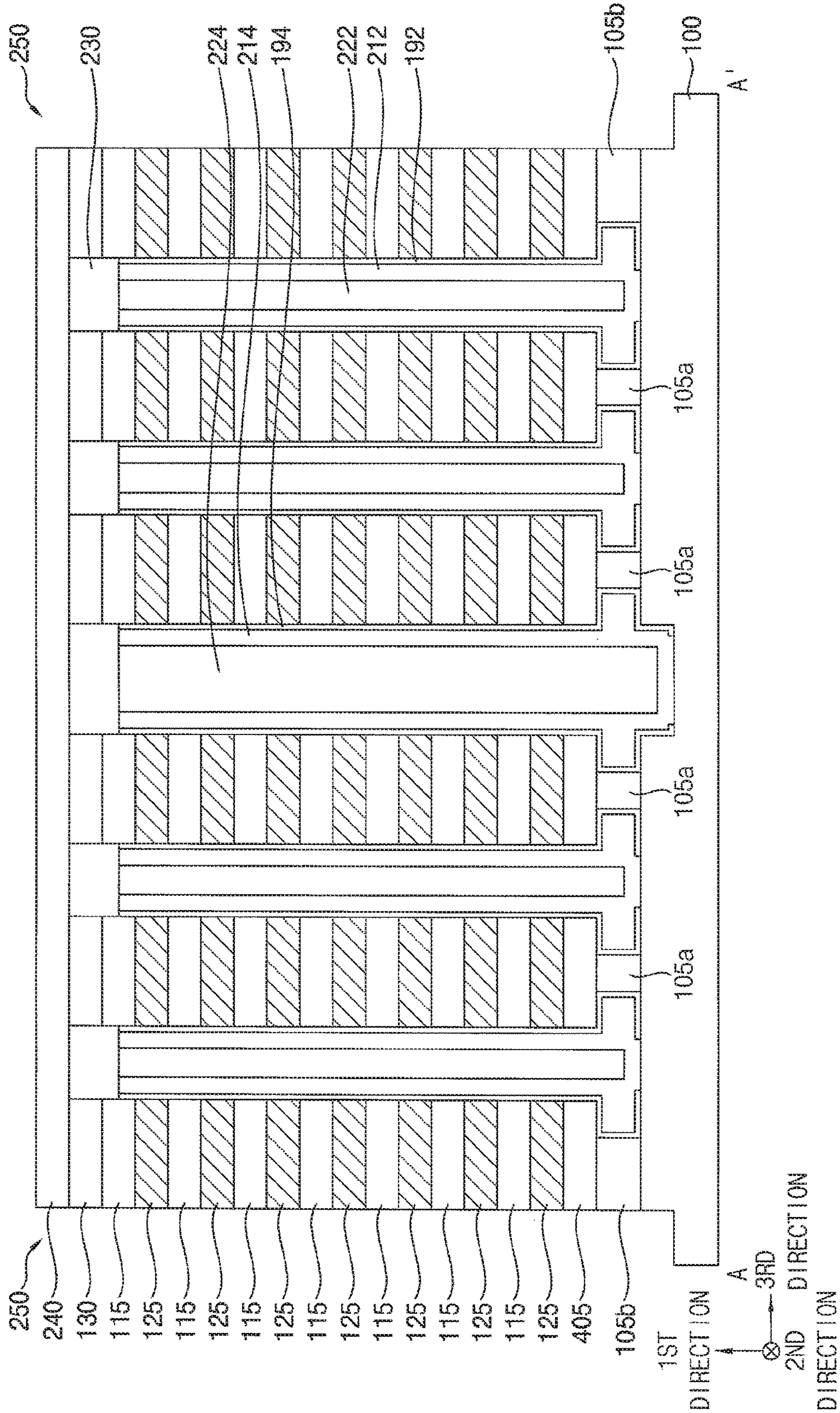

Referring to FIG. 34, processes substantially the same as or similar to those illustrated with reference to FIGS. 2 to 17 may be performed.

Thus, the second support pattern 105*b* may be exposed by the opening 250.

Figure 35:
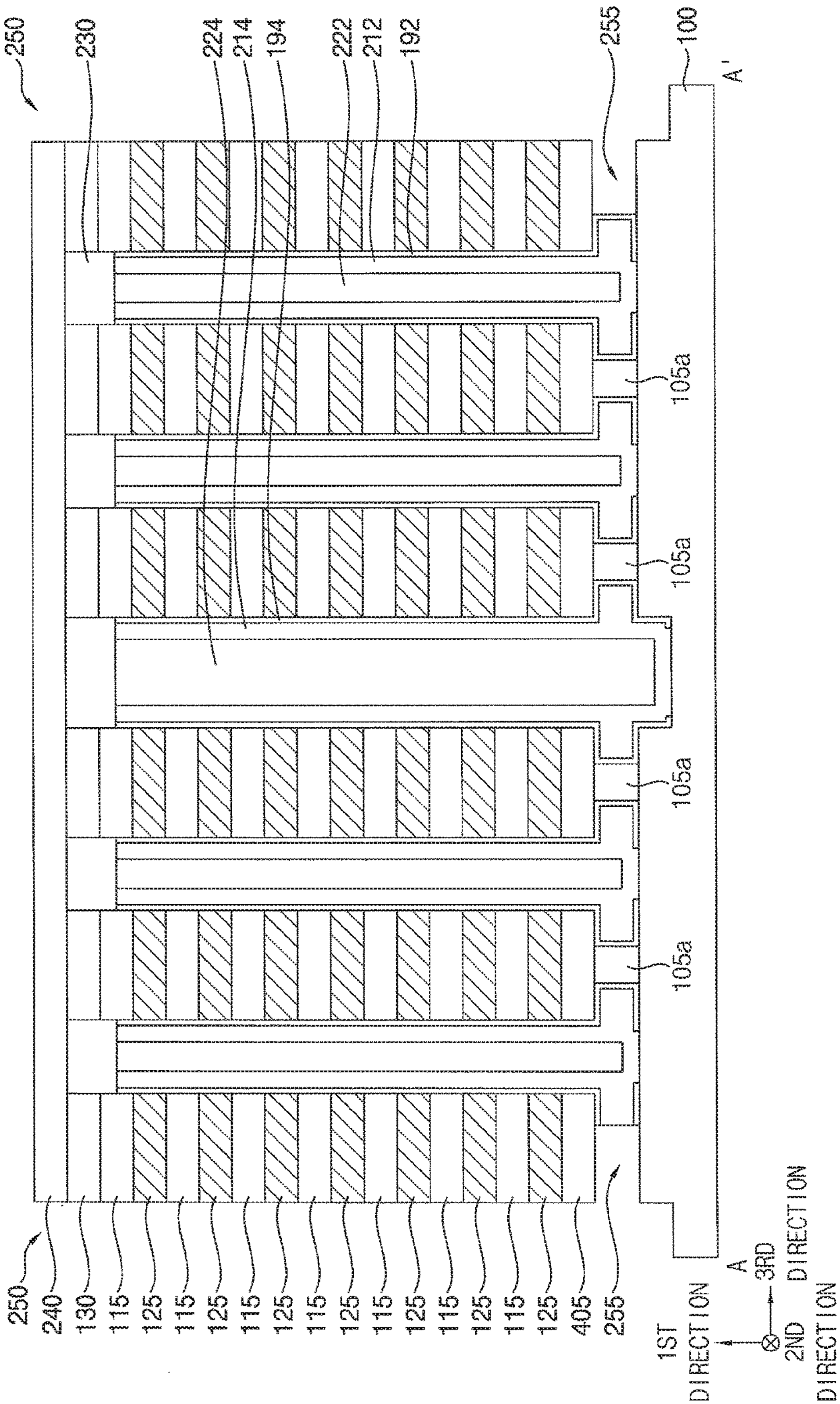

Referring to FIG. 35, a process substantially the same as or similar to that illustrated with reference to FIG. 18 may be performed.

Thus, the second support pattern 105*b* exposed by the opening 250 may be removed. In example embodiments, the second support pattern 105*b* may be removed by a wet etching process. Even if the support pattern 105 includes a material having an etching selectivity with respect to the substrate 100, the sacrificial layer 120 and the insulation layer 110, e.g., silicon-germanium, a lowermost one of the sacrificial layers 120 adjacent the second support pattern 105*b* removed in the wet etching process may be partially removed. However, in example embodiments, the etch stop layer 400 having an etching selectivity with respect to the second support pattern 105*b* may be formed between the second support pattern 105*b* and the lowermost one of the sacrificial layers 120, and thus the lowermost one of the sacrificial layers 120 may be rarely removed.

Figure 36:
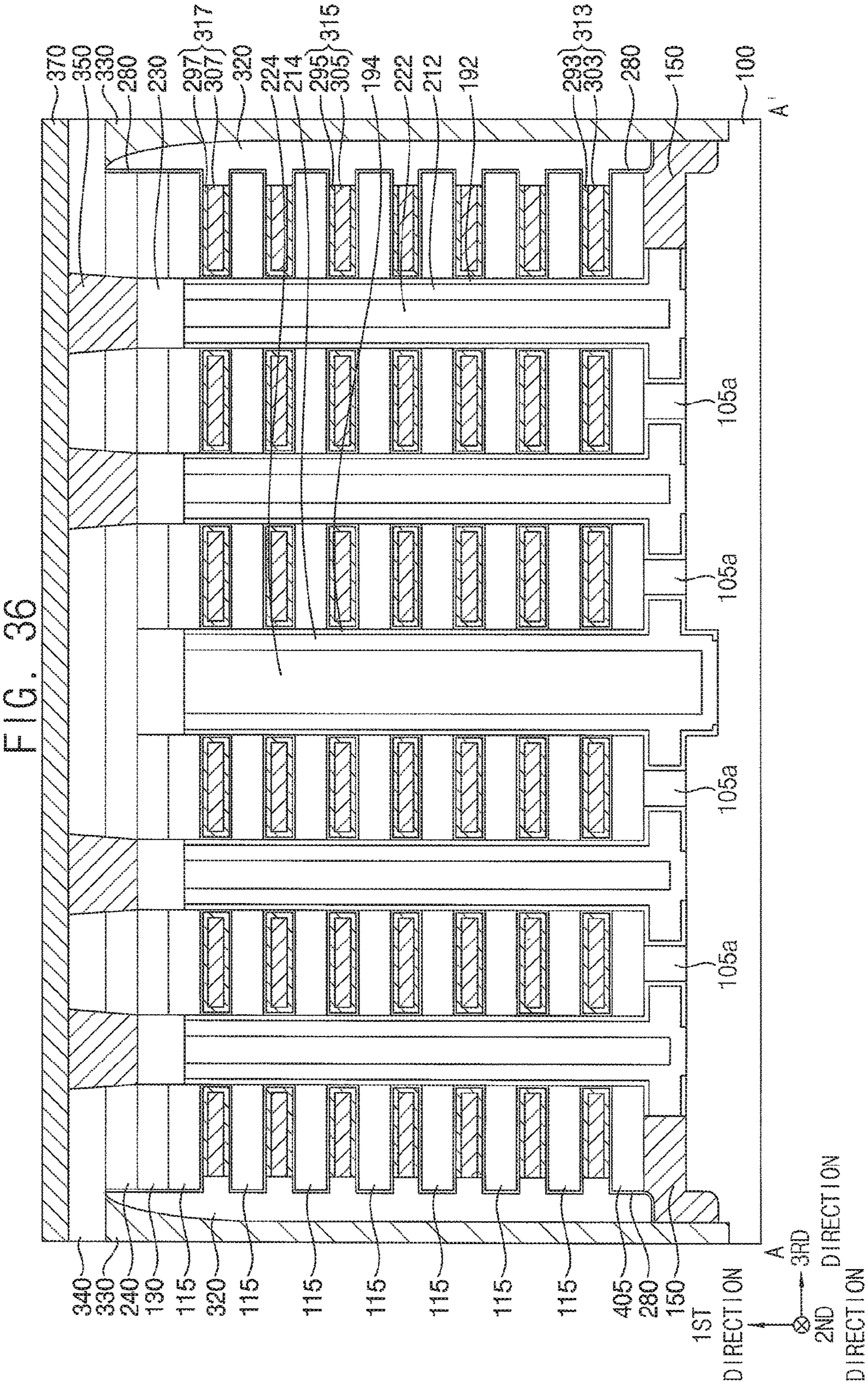

Referring to FIG. 36, processes substantially the same as or similar to those illustrated with reference to FIGS. 19 to 28 may be performed to complete the vertical memory device.

The vertical memory device may further include an etch stop pattern 405 between the epitaxial layer 150 on the substrate 100 and the lowermost one of the first gate electrode 313, and thus the lowermost first gate electrode 313 may have a constant thickness.

FIGS. 37 to 54B are cross-sectional views illustrating stages of a method of manufacturing a vertical memory device in accordance with example embodiments. Particularly, FIGS. 37, 40, 43, 46A, 46B, 49A, 49B, 52A and 52B are plan views, and FIGS. 38-39, 41-42, 44-45, 47A, 47B, 48A, 47B, 50A, 50B, 51A, 51B, 53A, 53B, 54A and 54B are cross-sectional views.

Among the cross-sectional views, FIGS. 38, 41, 44, 47, 50 and 53 are cross-sectional views along cutlines A-A' of corresponding plan views, respectively, and FIGS. 39, 42, 45, 48, 51 and 54 are cross-sectional views along cutlines B-B' of corresponding plan views, respectively. FIGS. 46A, 47A, 48A, 49A, 50A, 51A, 52A, 53A and 54A are cross-sectional views including a first support pattern extending linearly, and FIGS. 46B, 47B, 48B, 49B, 50B, 51B, 52B, 53B and 54B are cross-sectional views including a first support pattern extending in a zigzag layout.

This method may include processes substantially the same as or similar to those illustrated with reference to FIGS. 1 to 28B. Thus, like reference numerals refer to like elements, and detailed descriptions thereon may be omitted below in the interest of brevity.

First, a process substantially the same as or similar to that illustrated with reference to FIG. 1 may be performed.

Figure 4:
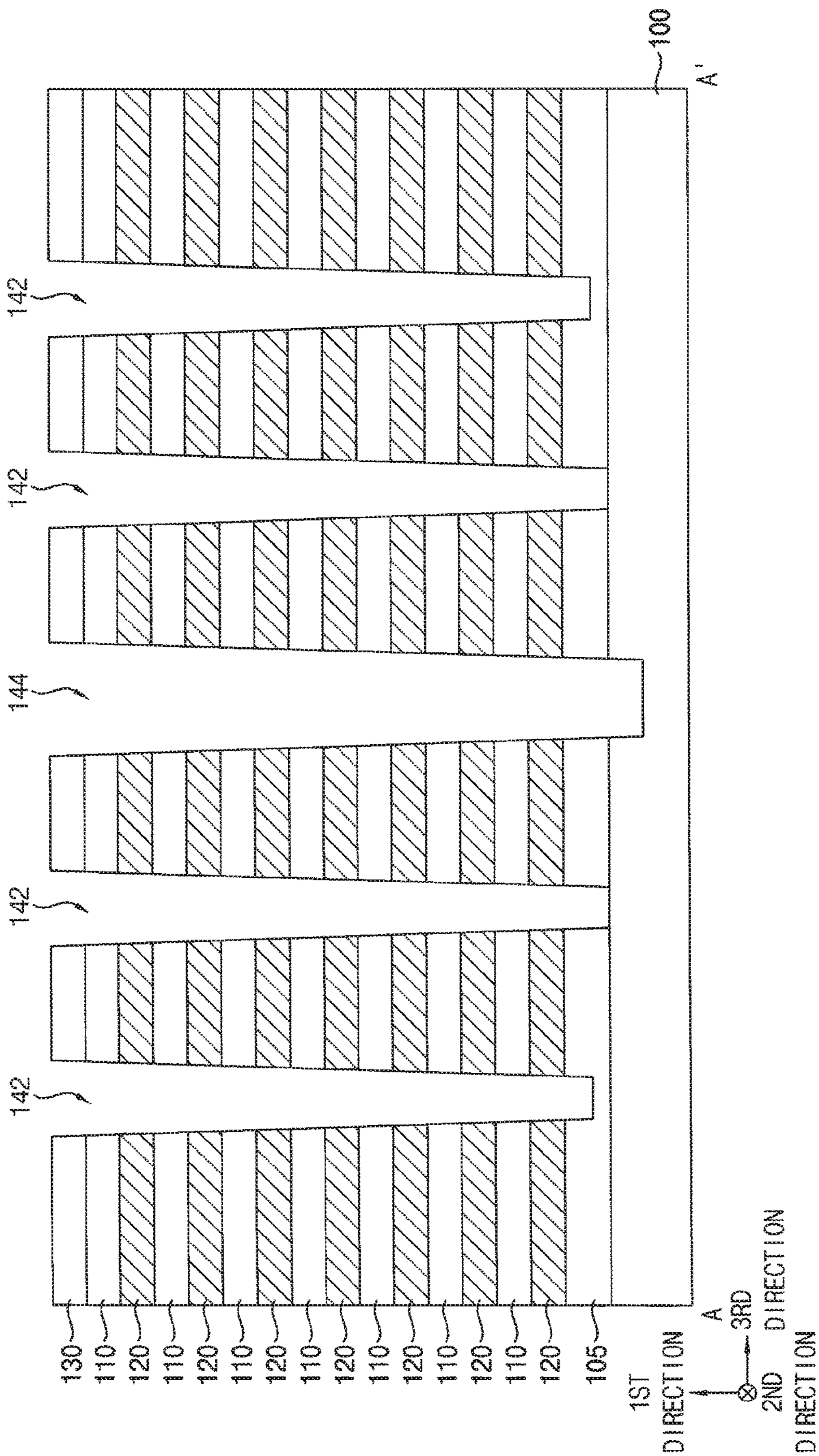
Figure 37:
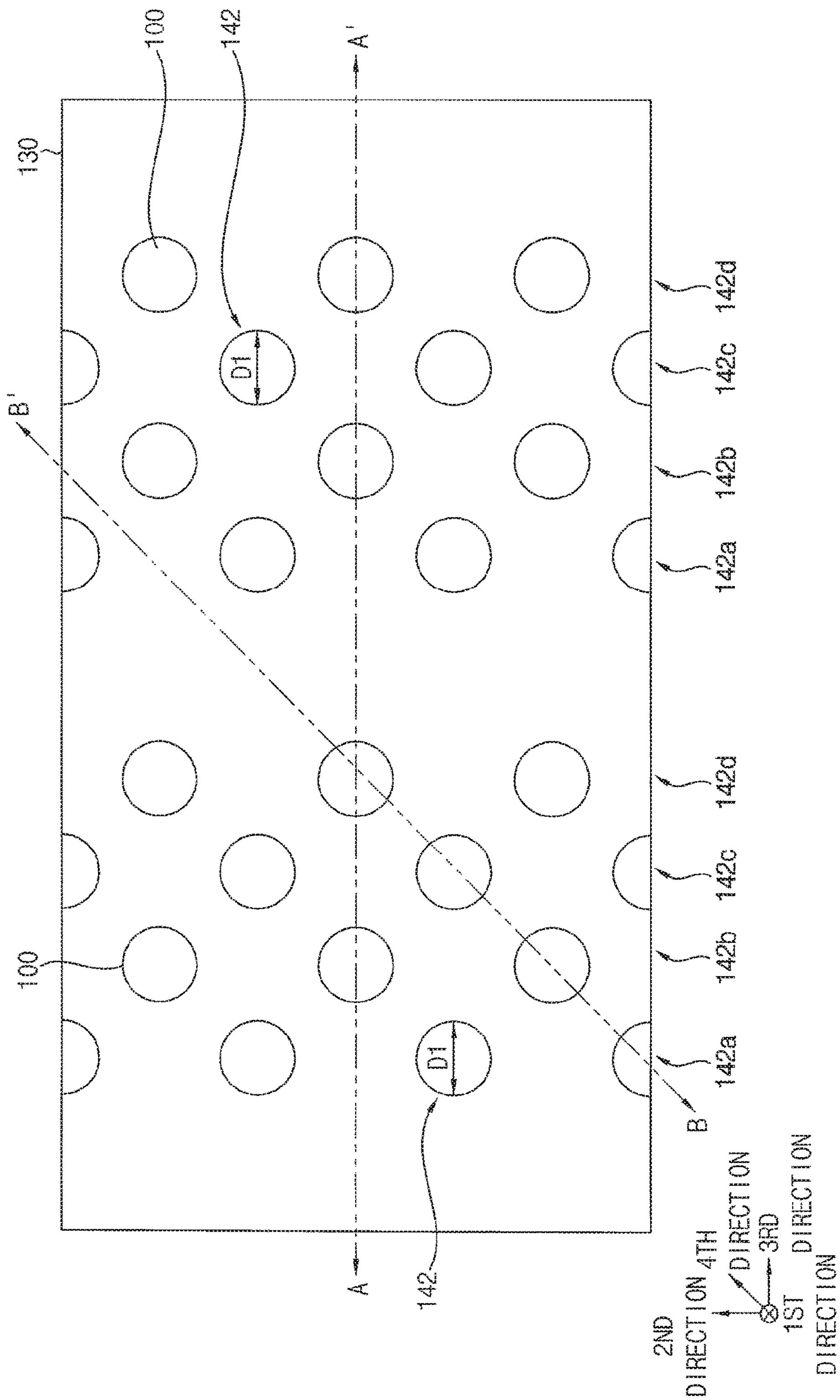
FIGS. 37 to 54B are cross-sectional views illustrating stages of a method of manufacturing a vertical memory device in accordance with example embodiments.
Figure 38:
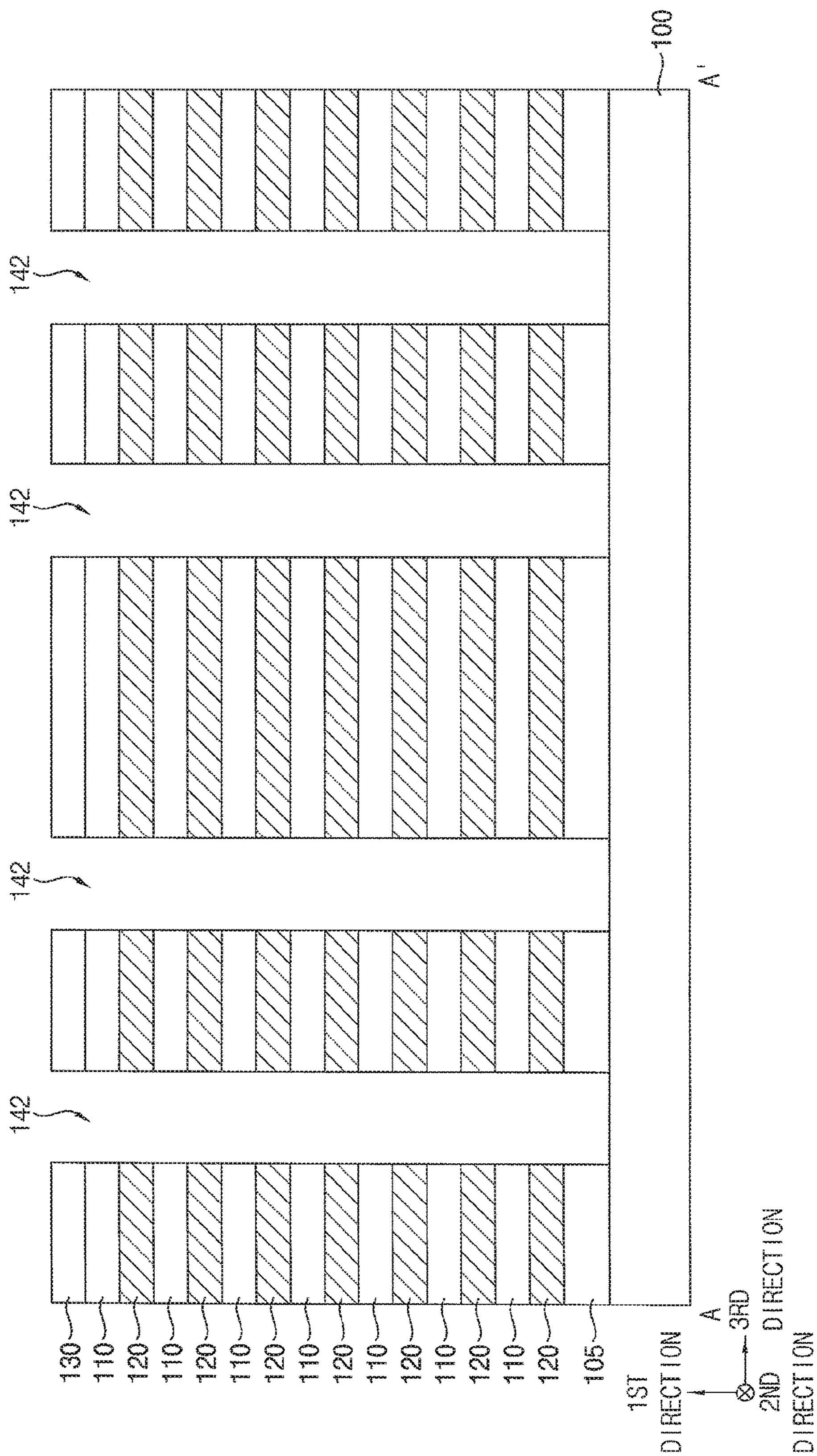
Figure 39:
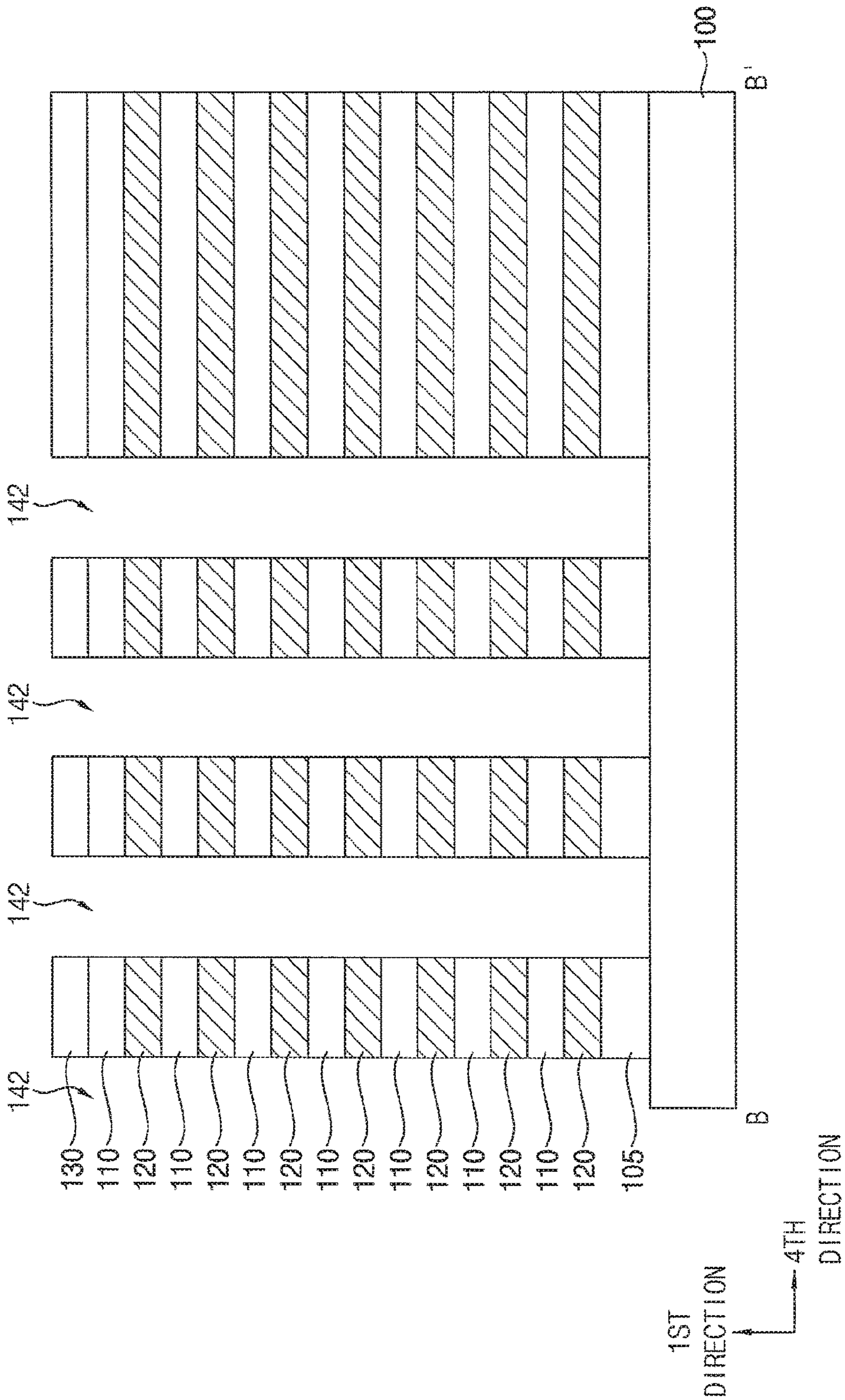

Referring to FIGS. 37 to 39, processes substantially the same as or similar to those illustrated with reference to FIGS. 2 to 4 may be performed.

However, in FIGS. 37 to 39, the dummy channels 144 may not be formed. Thus, each channel hole block may include the first, second, third and fourth channel hole columns 142*a*, 142*b*, 142*c* and 142*d* disposed in the third direction, and a plurality of channel hole blocks may be formed in the third direction. FIGS. 37 to 39 show two channel hole blocks in the third direction, each of which includes four channel hole columns.

Figure 40:
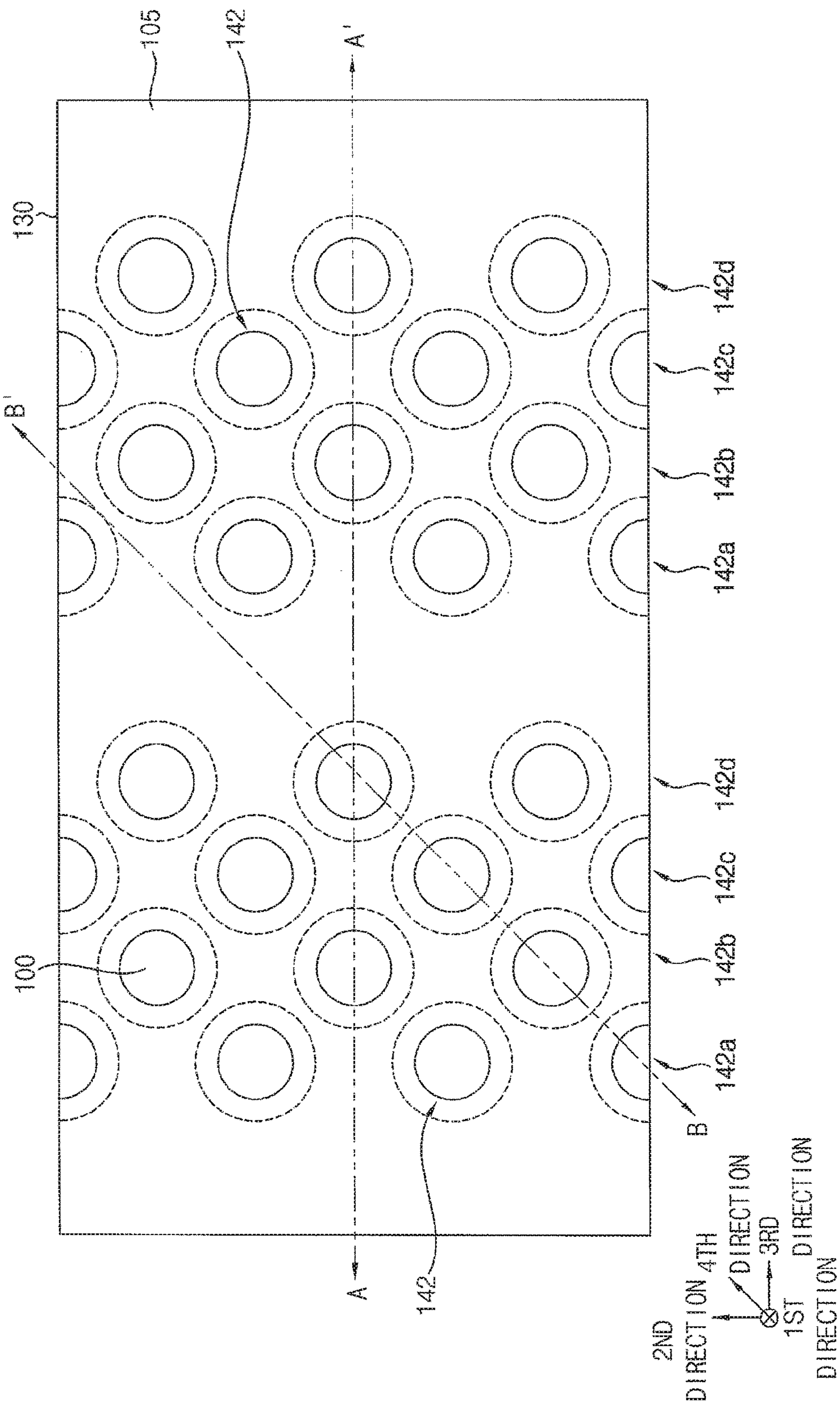
Figure 41:
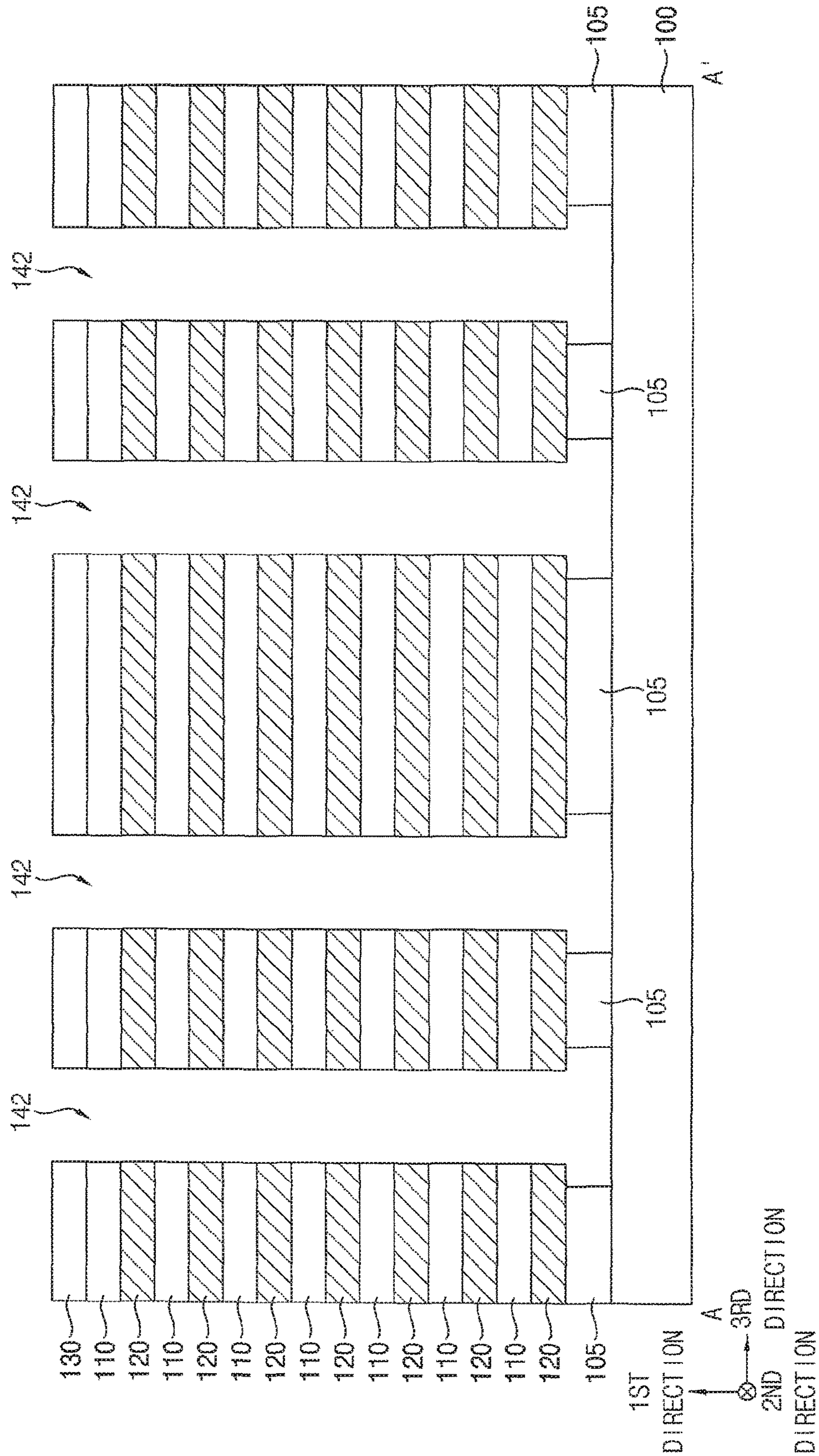
Figure 42:
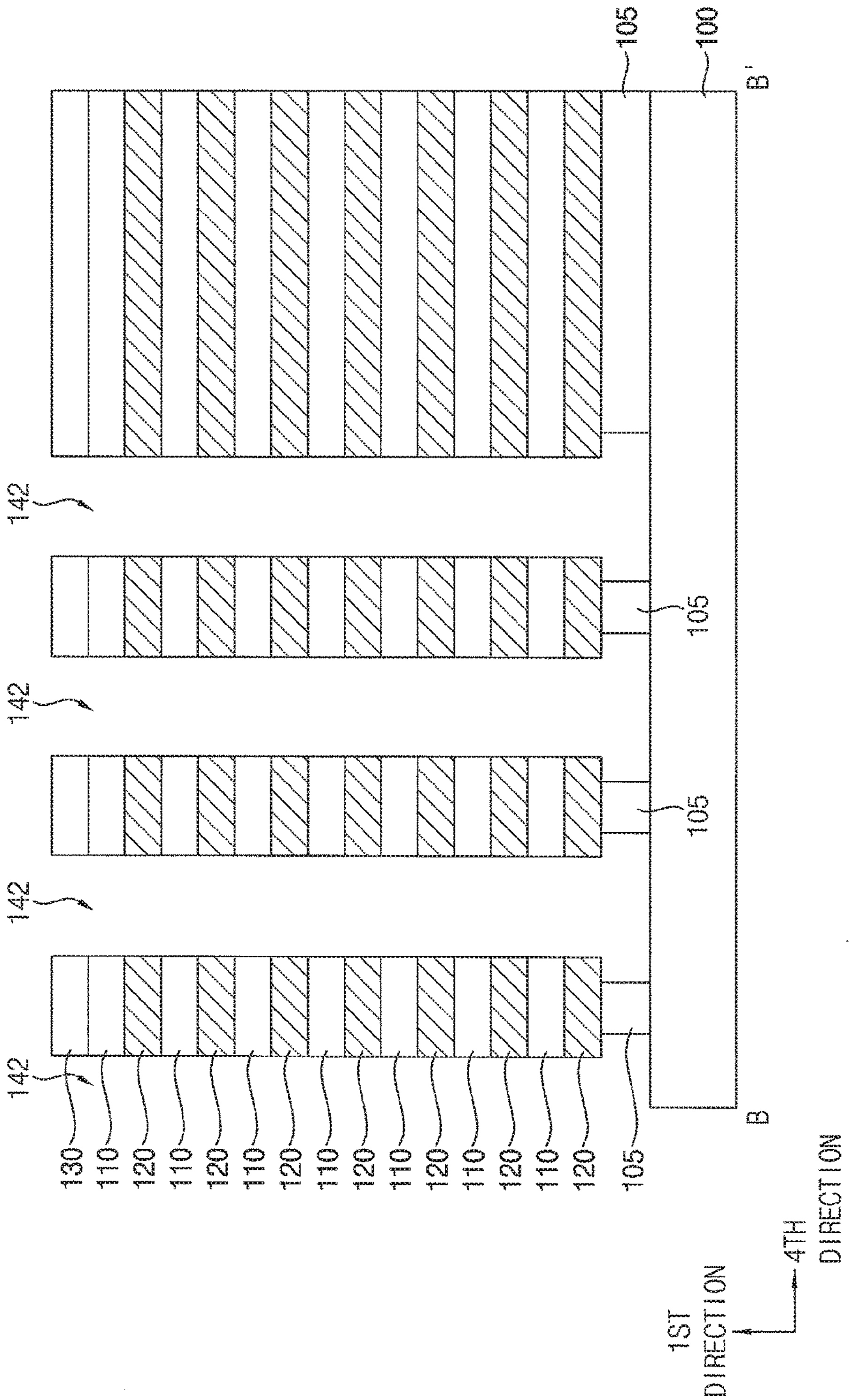

Referring to FIGS. 40 to 42, a process substantially the same as or similar to that illustrated with reference to FIGS. 5 to 7 may be performed.

Thus, the support layer 105 exposed by the channel holes 142 may be partially removed so that lower portions of the channel holes 142 may be enlarged in a direction substantially parallel to the upper surface of the substrate 100, e.g., in a horizontal direction.

However, even if the channel holes 142 are horizontally enlarged, they may not be in communication with each other. That is, the lower portions of the channel holes 142 may be enlarged such that the channel holes 142 included in neighboring ones of the channel hole columns 142*a*, 142*b*, 142*c* and 142*d* may not be in communication with each other.

Figure 43:
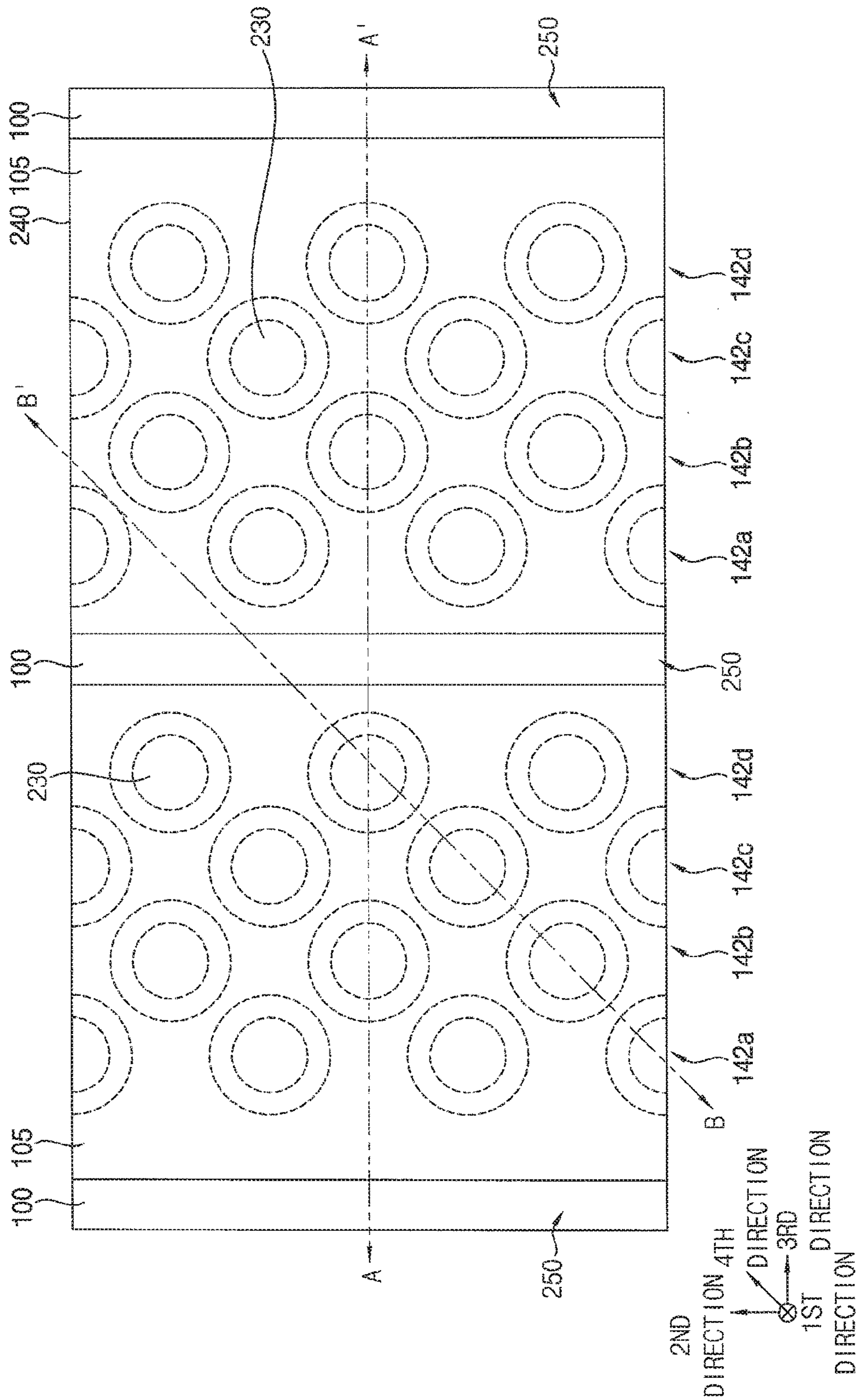
Figure 44:
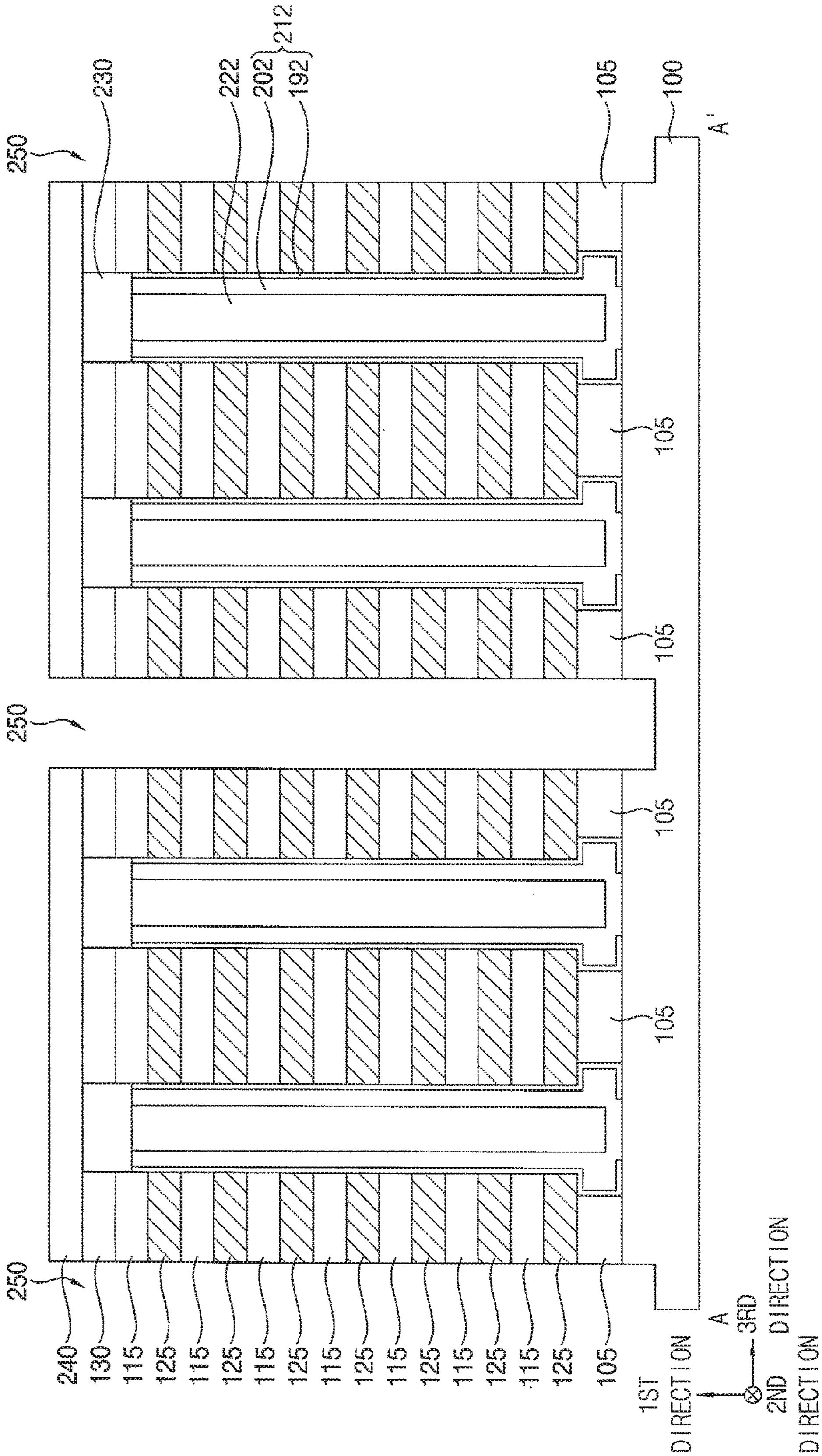
Figure 45:
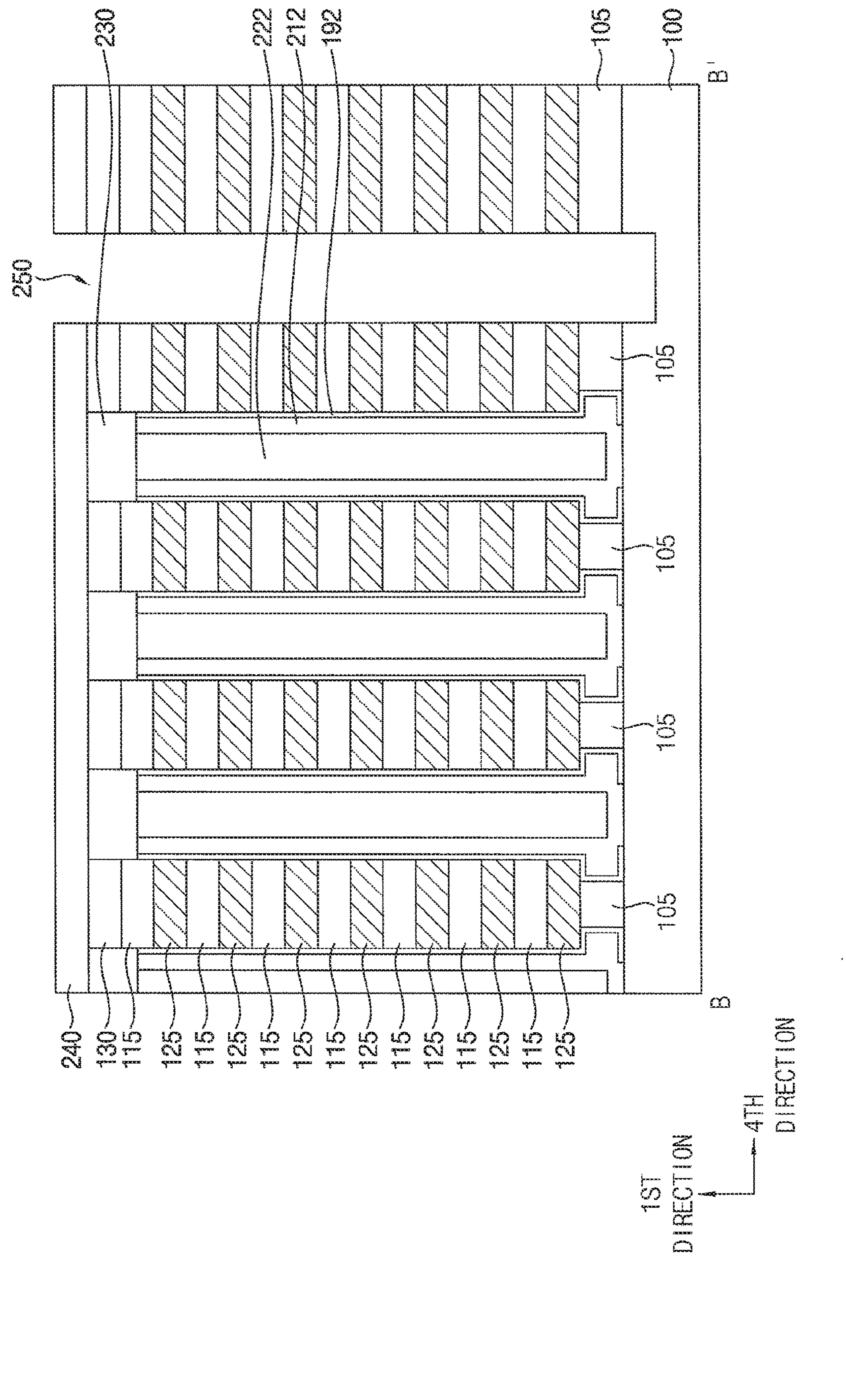

Referring to FIGS. 43 to 45, processes substantially the same as or similar to those illustrated with reference to FIGS. 8 to 17 may be performed.

Thus, the channels 212 may be formed to fill the channel holes 142, and the channels 212 may define a channel column, a channel block, and a channel array. The channel array may include a plurality of channel blocks spaced apart from each other in the third direction, and each channel block may include the first to fourth channel columns 212*a*, 212*b*, 212*c* and 212*d*.

The opening 250 may be formed to expose an upper surface of the substrate 100. The opening 250 may be formed to extend in the second direction, and each of the insulation layers 110 may be transformed into a plurality of insulation patterns 115 spaced apart from each other in the third direction, and each insulation pattern 115 may extend in the second direction. Each of the sacrificial layers 120 may be transformed into a plurality of sacrificial patterns 125 spaced apart from each other in the third direction, and each sacrificial pattern 125 may extend in the second direction.

In example embodiments, each of the channels 212 may include a first expansion portion having an enlarged width between the upper surface of the substrate 100 and the lowermost sacrificial pattern 125.

Figure 46A:
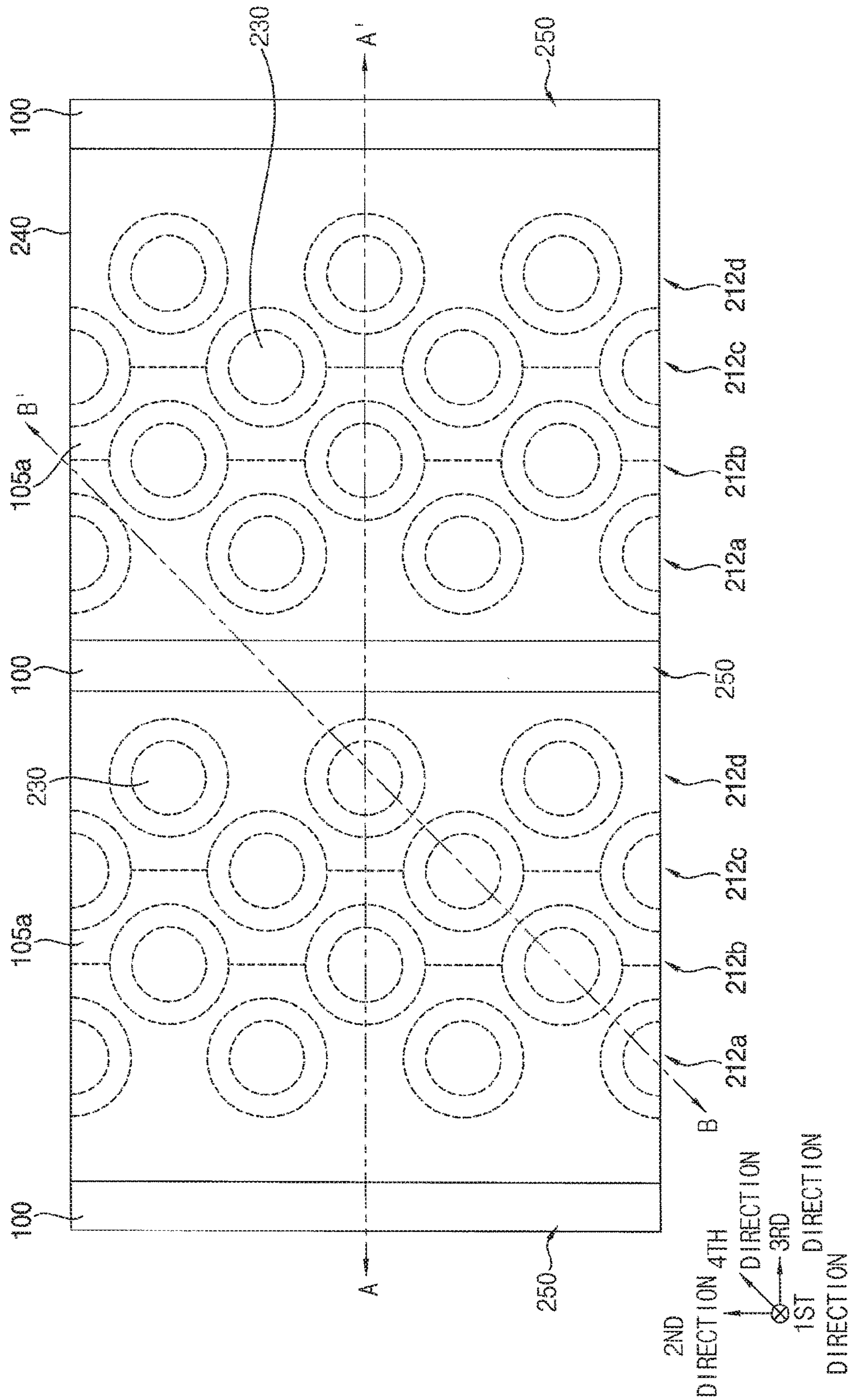
Figure 47A:
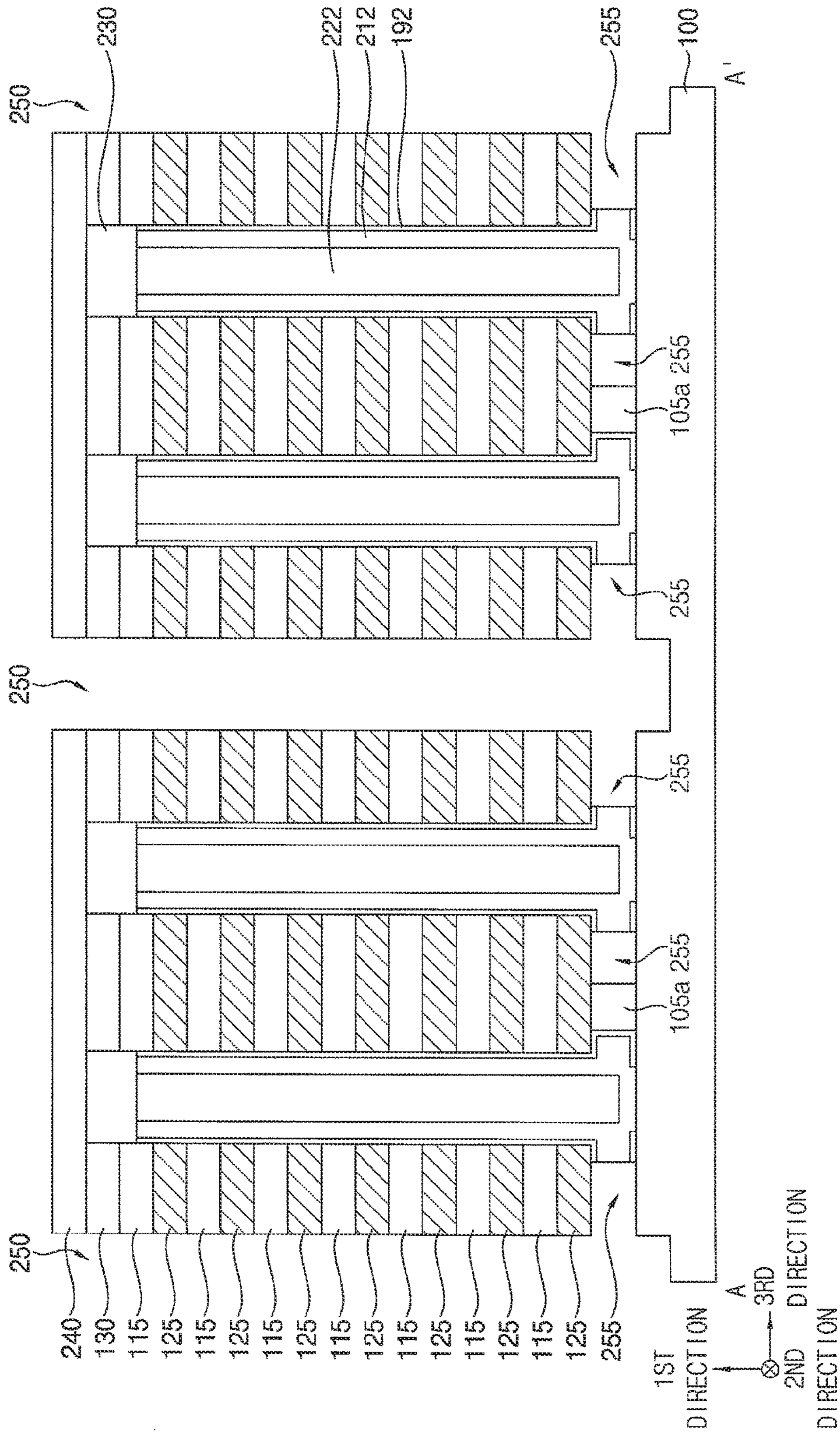
Figure 48A:
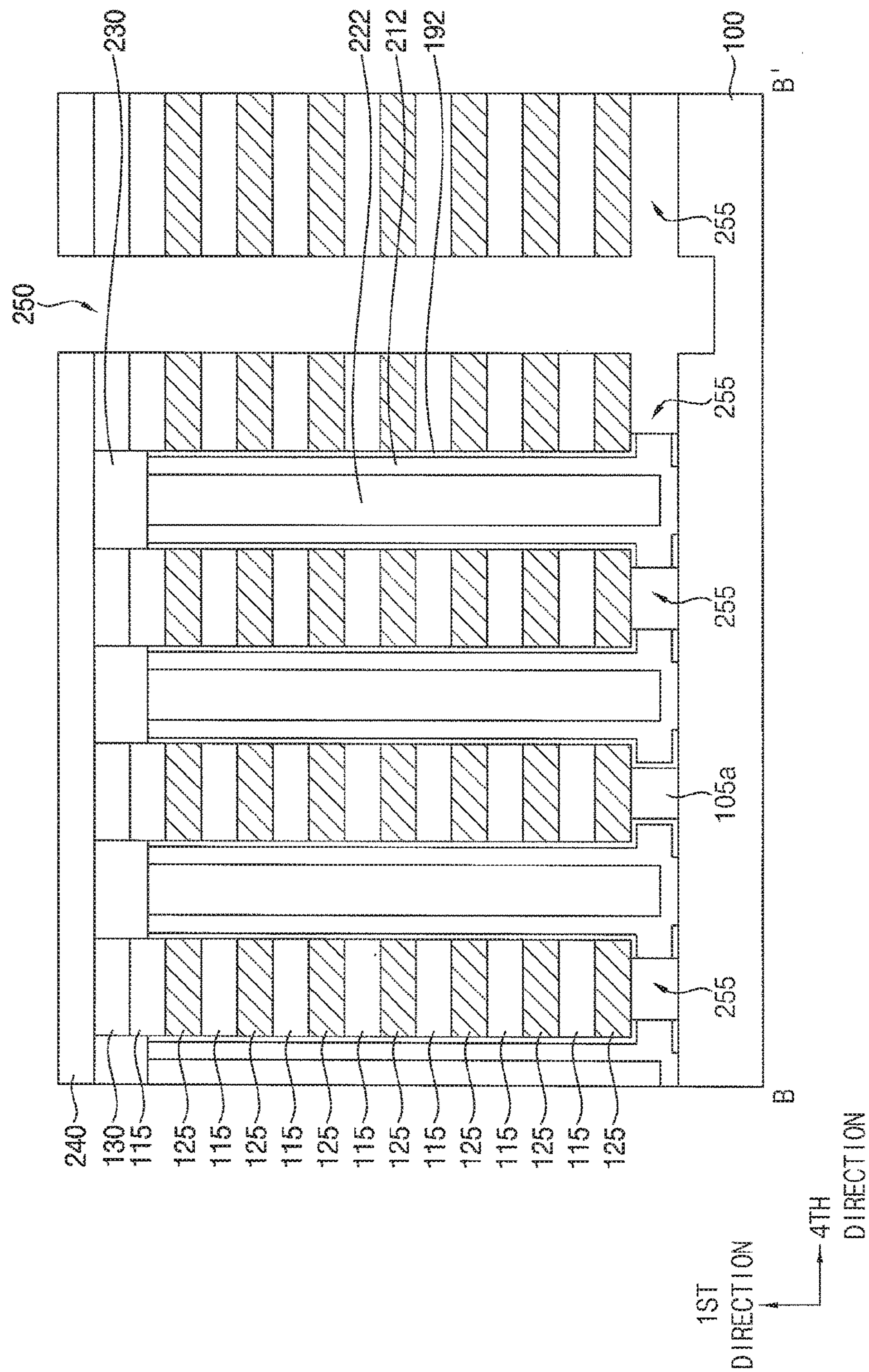

Referring to FIGS. 46A, 47A and 48A, a process substantially the same as or similar to that illustrated with reference to FIG. 18 may be performed.

Thus, the support layer 105 exposed by the opening 250 may be partially removed to form the first gap 255. After partially removing the support layer 105, a portion of the first charge storage structure 192 contacting the support layer 105 may be also removed.

In example embodiments, the first gap 255 may be formed by a wet etching process. That is, an etching solution may be provided through the opening 250 so that a portion of the support layer 105 adjacent the opening 250 may be etched first, and portions of the support layer 105 spaced apart by substantially the same distance from portions of the opening 250, respectively, extending in the second direction may be removed.

In example embodiments, the whole sidewalls of the first expansion portions of the channels 212 in the first and fourth channel columns 212*a* and 212*d* adjacent the opening 250 may be exposed by the first gap 255, and only portions of the sidewalls of the first expansion portions facing the opening 250 of the channels 212 in the second and third channel columns 212*b* and 212*c* may be exposed by the first gap 255. Thus, the first support pattern 105*a* that may be formed from the support layer 105 may extend in the second direction linearly.

Figure 46B:
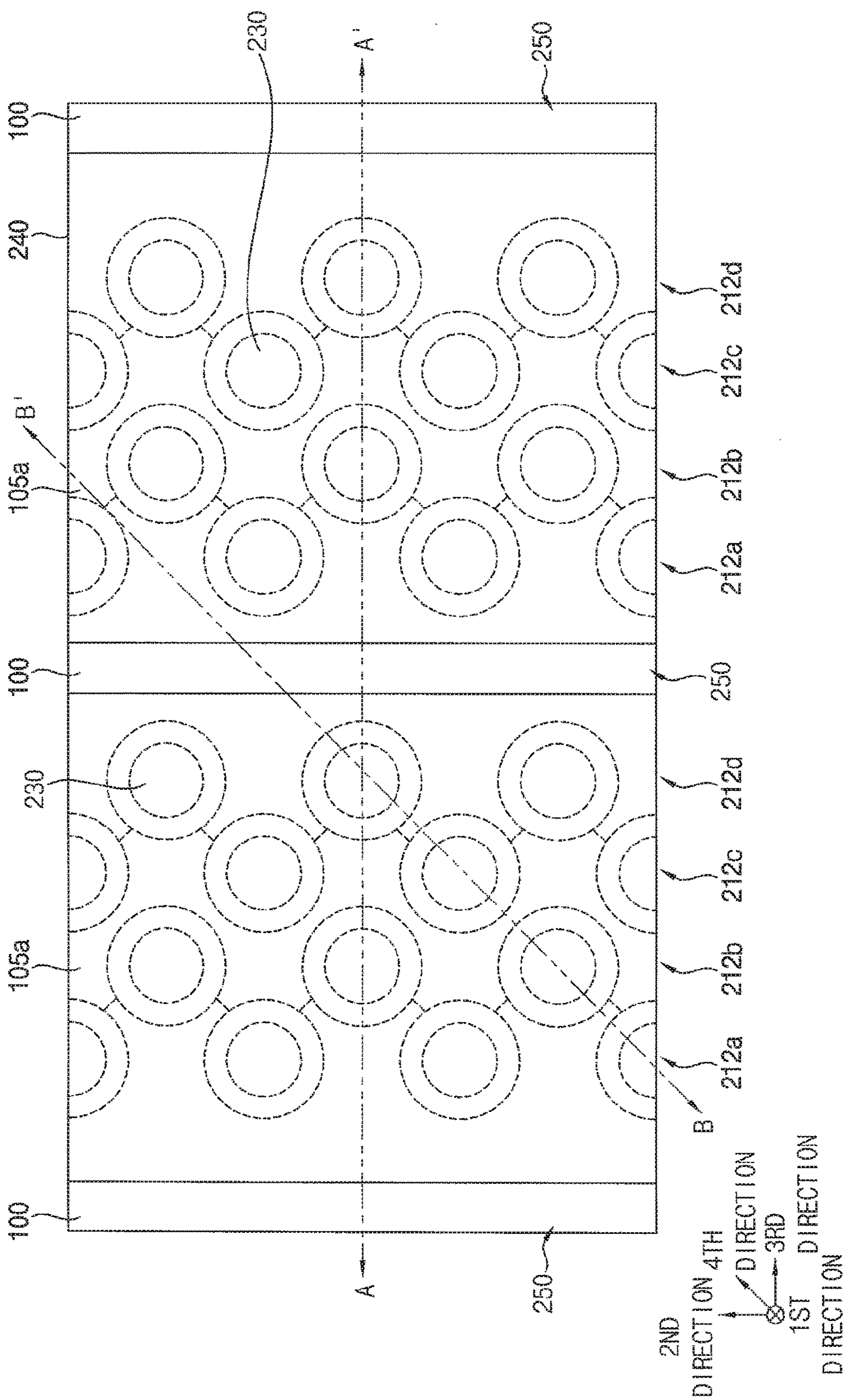
Figure 47B:
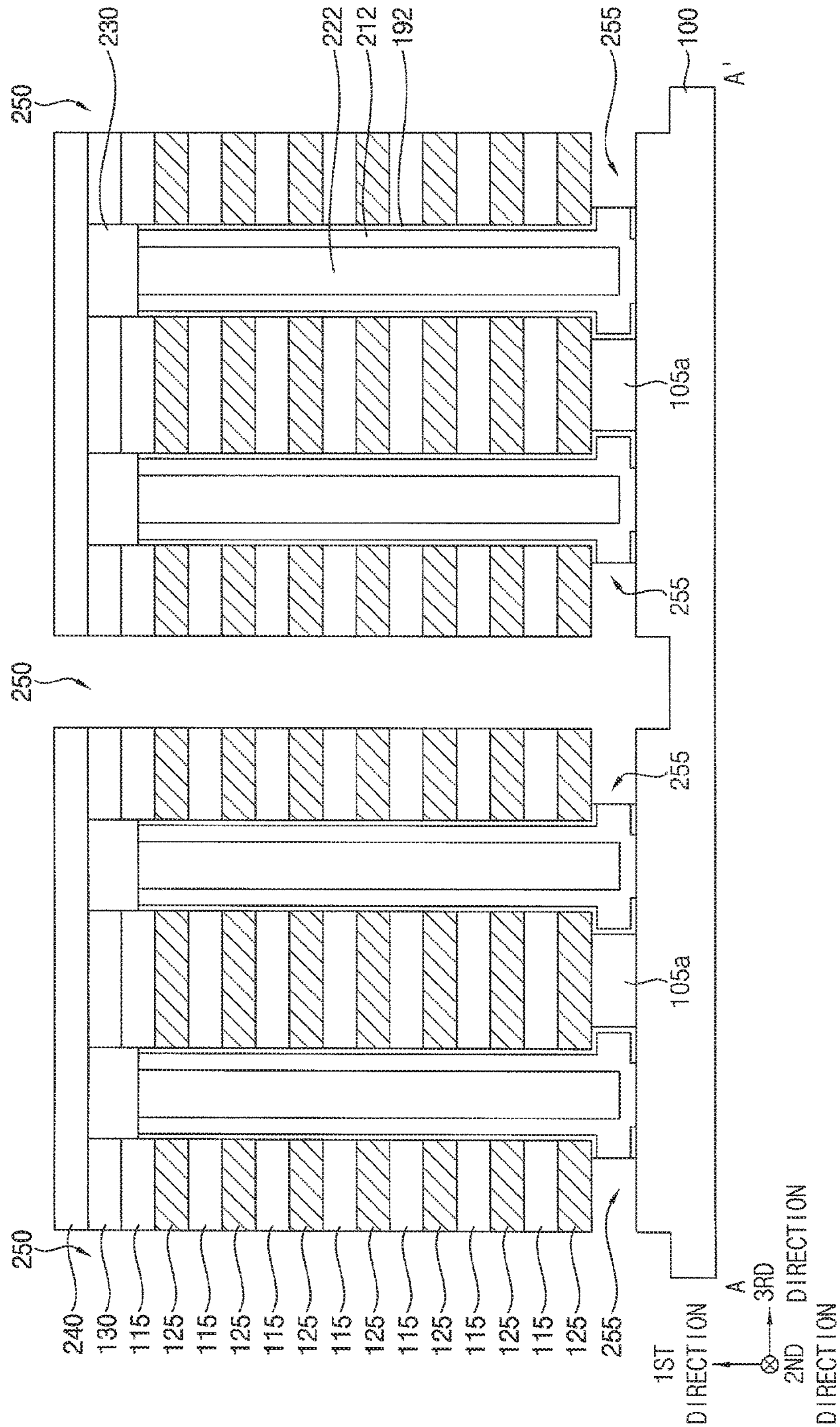
Figure 48B:
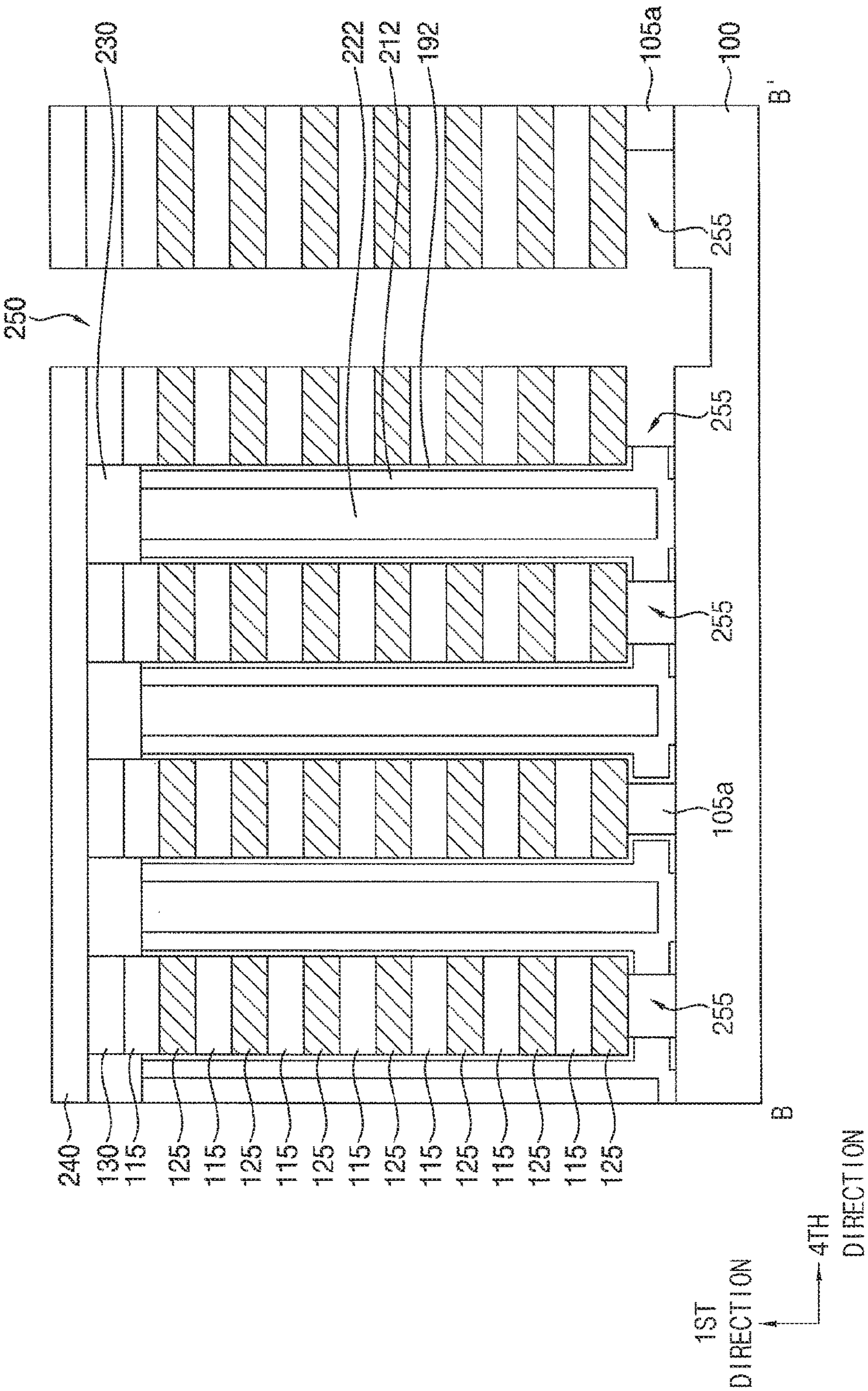

Referring to FIGS. 46B, 47B and 48B, the first support pattern 105*a* that may be formed from the support layer 105 may extend in the second direction in a zigzag layout.

That is, in the wet etching process, an etching solution may be provided through the opening 250 so that a portion of the support layer 105 adjacent the opening 250 may be etched first, however, when the etching solution meets the channels 212, the wet etching process may be delayed, and thus portions of the support layer 105 free of the channels 212 may be etched more quickly. Thus, the first support pattern 105*a* may have a zigzag layout in the second direction between the channels 212.

In example embodiments, the sidewalls of the first expansion portions of the channels 212 in the first and fourth channel columns 212*a* and 212*d*, which may be adjacent the opening 250, may be exposed by the first gap 255 more than the sidewalls of the first expansion portions of the channels 212 in the second and third channel columns 212*b* and 212*c*, which may be distant from the opening 250.

Figure 49A:
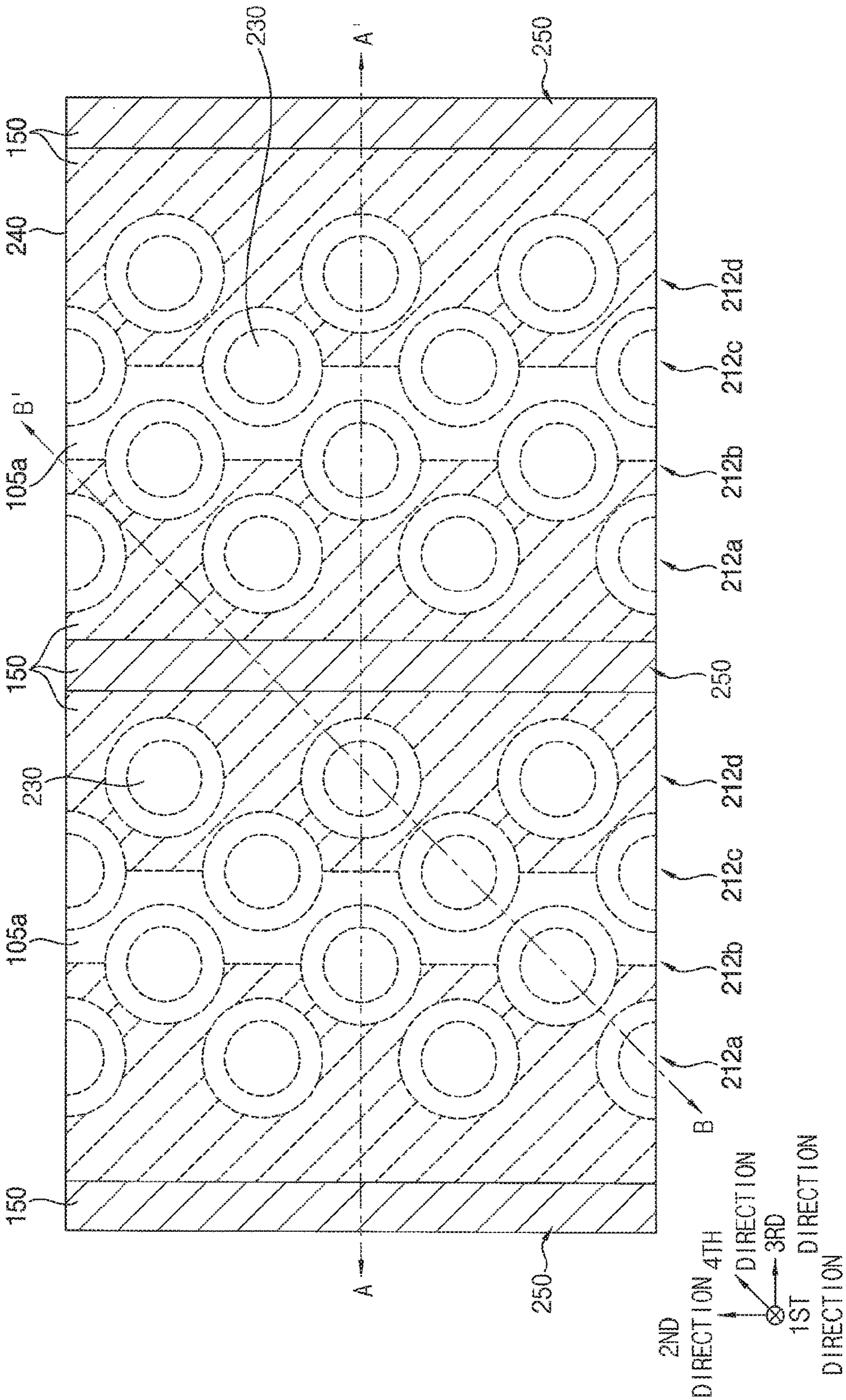
Figure 50A:
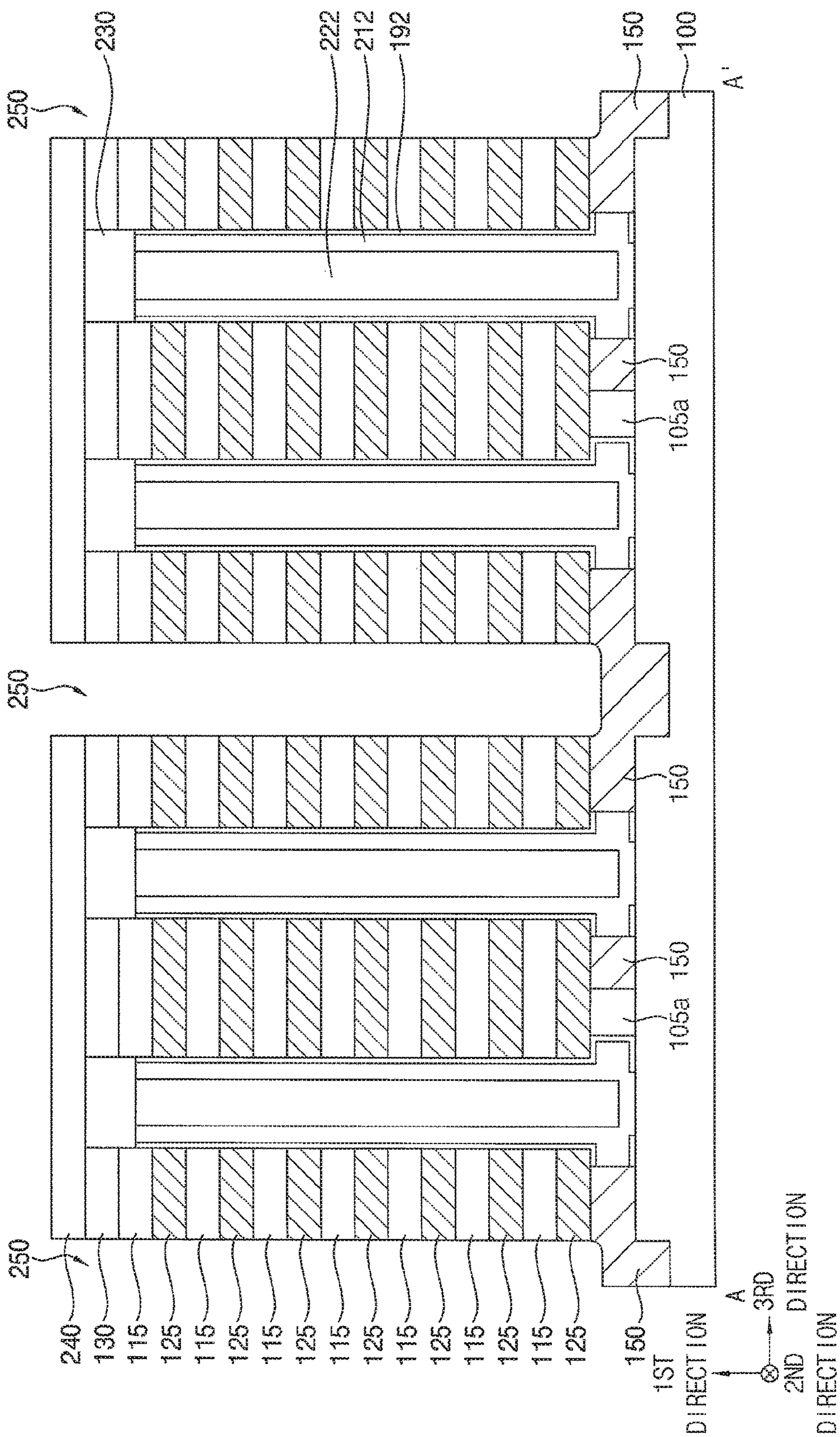
Figure 51A:
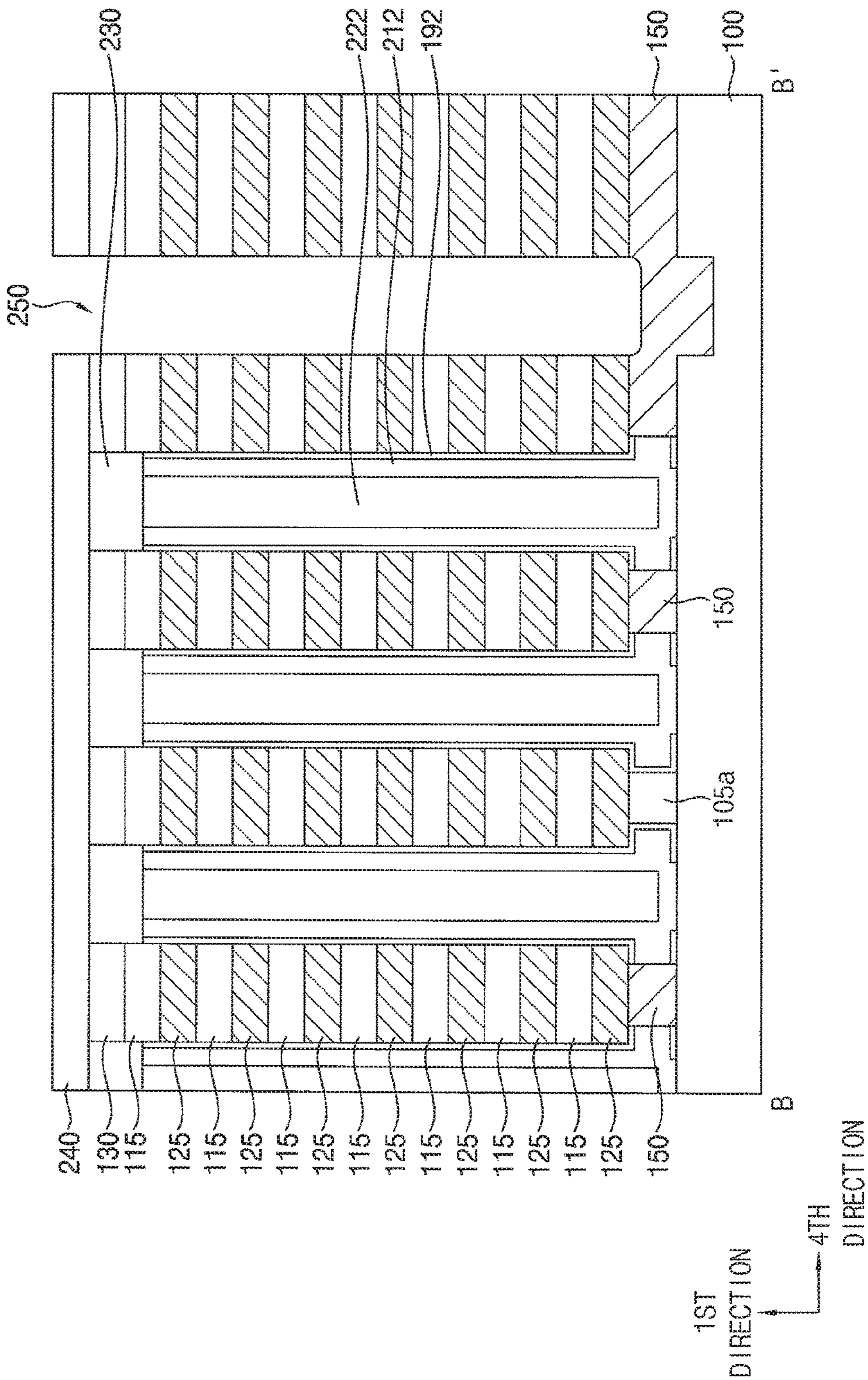

Referring to FIGS. 49A, 50A and 51A, a process substantially the same as or similar to that illustrated with reference to FIGS. 19 and 20 may be performed.

Thus, an SEG process may be performed to form the epitaxial layer 150 on the upper surface of the substrate 100 exposed by the opening 250 and the first gap 255.

In example embodiments, the epitaxial layer 150 may completely fill the first gap 255, and thus may contact the whole sidewalls of the first portions of the channels 212 in the first and fourth channel columns 212*a* and 212*d* and portions of the sidewalls of the first portions of the channels 212 in the second and third channel columns 212*b* and 212*c*.

Alternatively, like that of FIGS. 29 to 32, the epitaxial layer 150 may partially fill the first gap 255.

In example embodiments, the epitaxial layer 150 may extend in the second direction and vertically overlap opposite ends of each of the insulation patterns 115 and the sacrificial patterns 125 in the third direction, and may have a width in the third direction constant along the second direction.

Figure 49B:
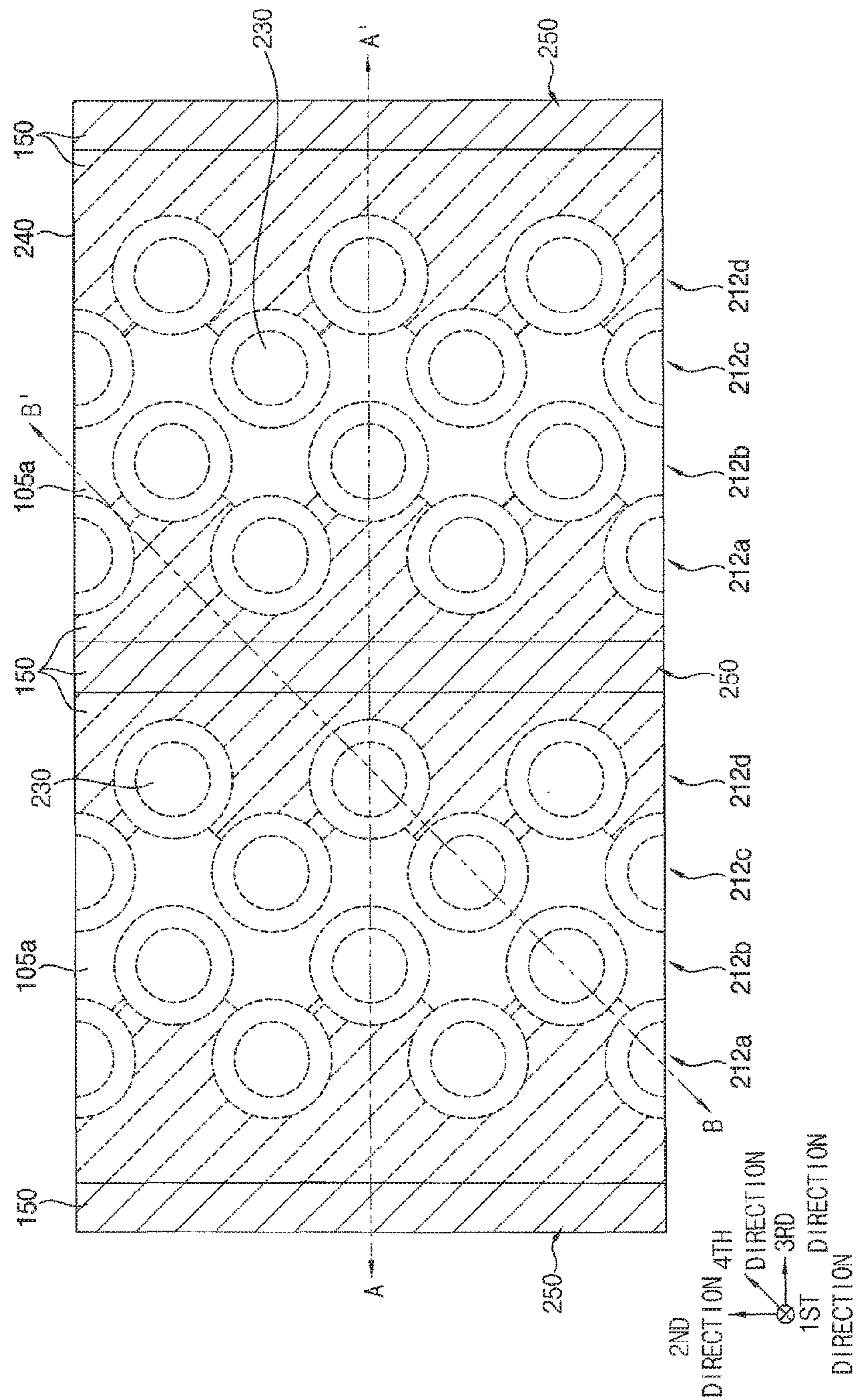
Figure 50B:
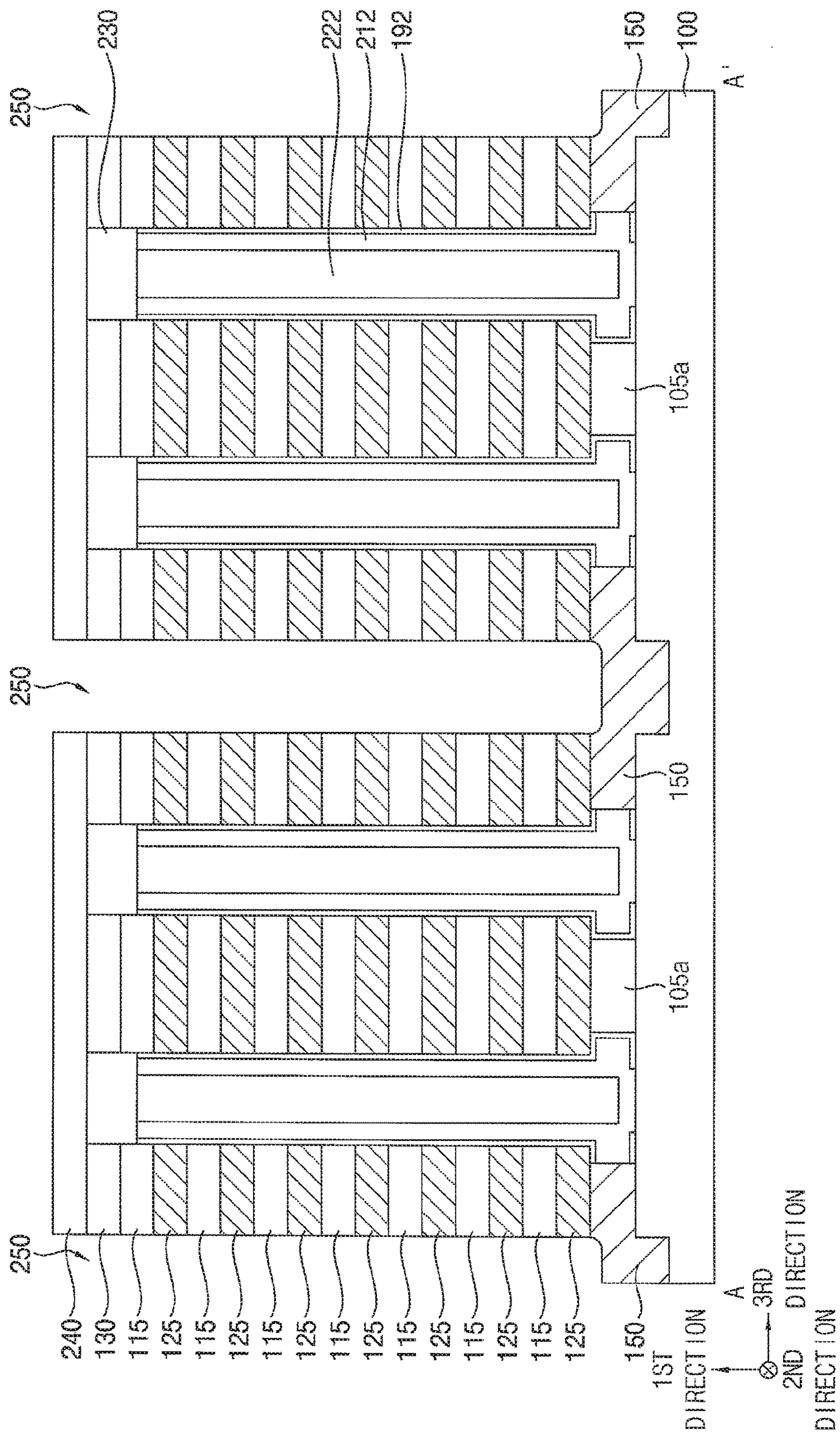
Figure 51B:
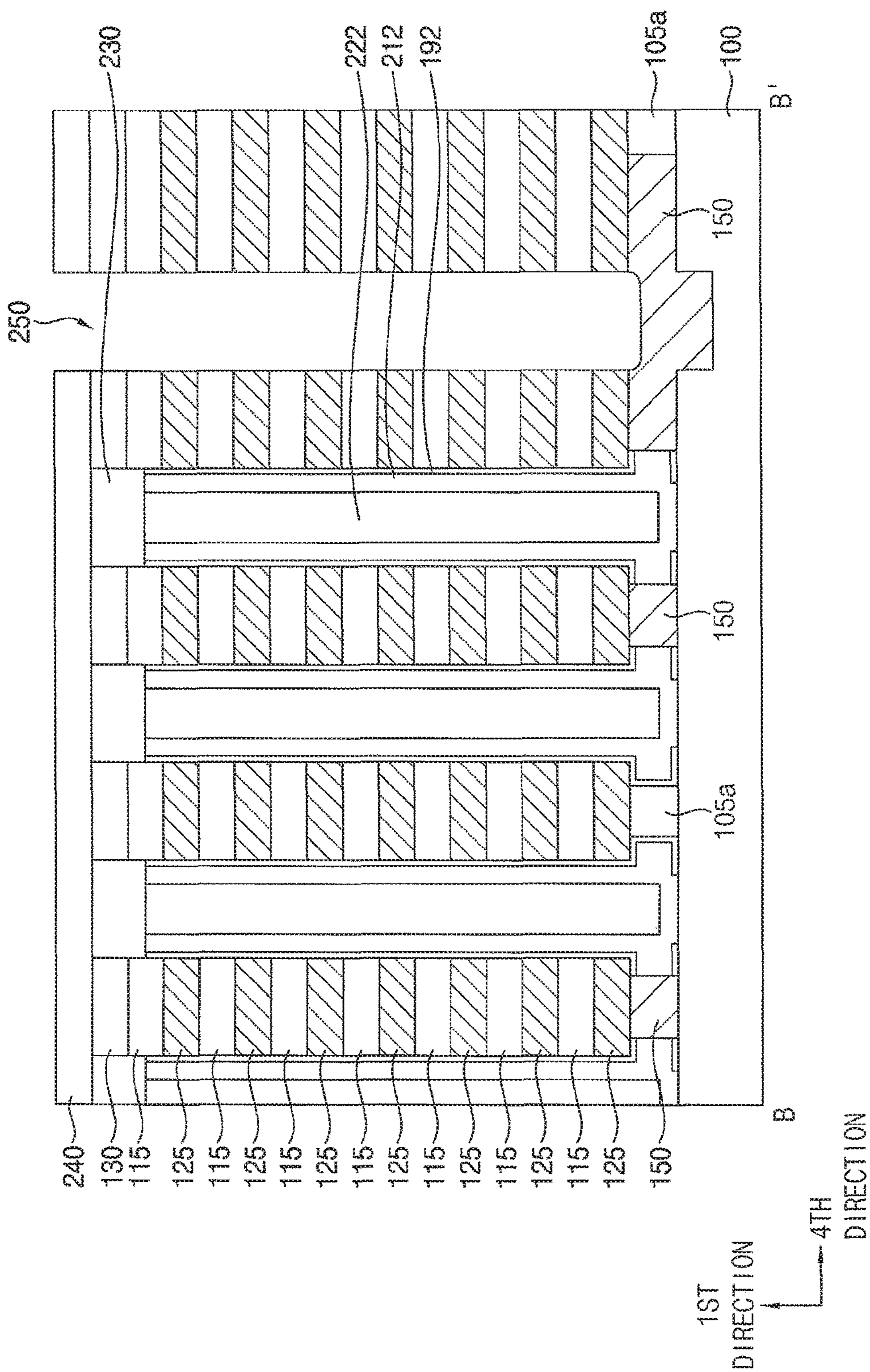

Referring to FIGS. 49B, 50B and 51B, the epitaxial layer 150 that may be formed through an SEG process on the upper surface of the substrate 100 exposed by the opening 250 and the first gap 255 may have a zigzag layout in the second direction. Thus, the epitaxial layer 150 may have a width in the third direction varying along the second direction.

Figure 52A:
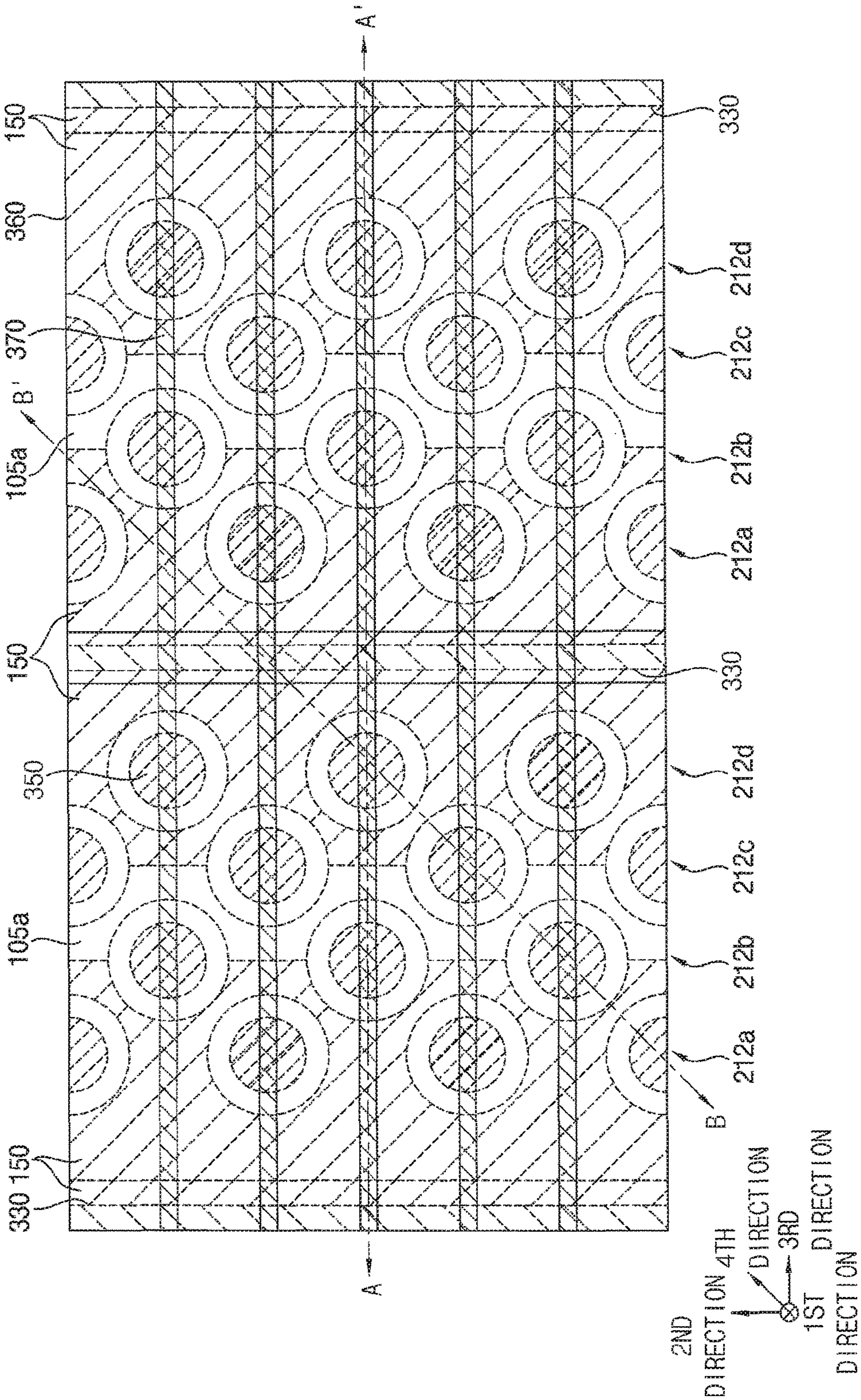
Figure 53A:
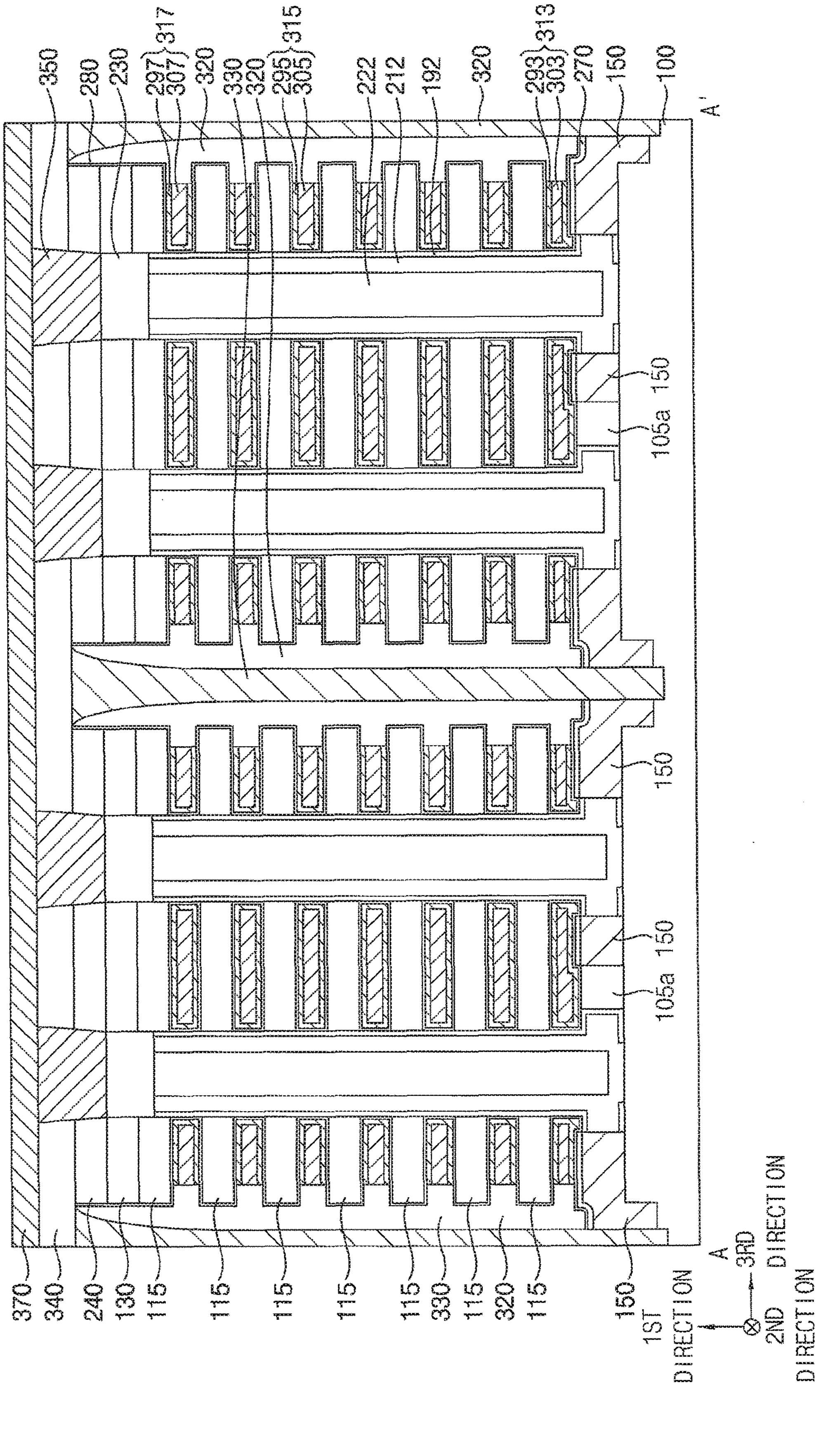
Figure 54A:
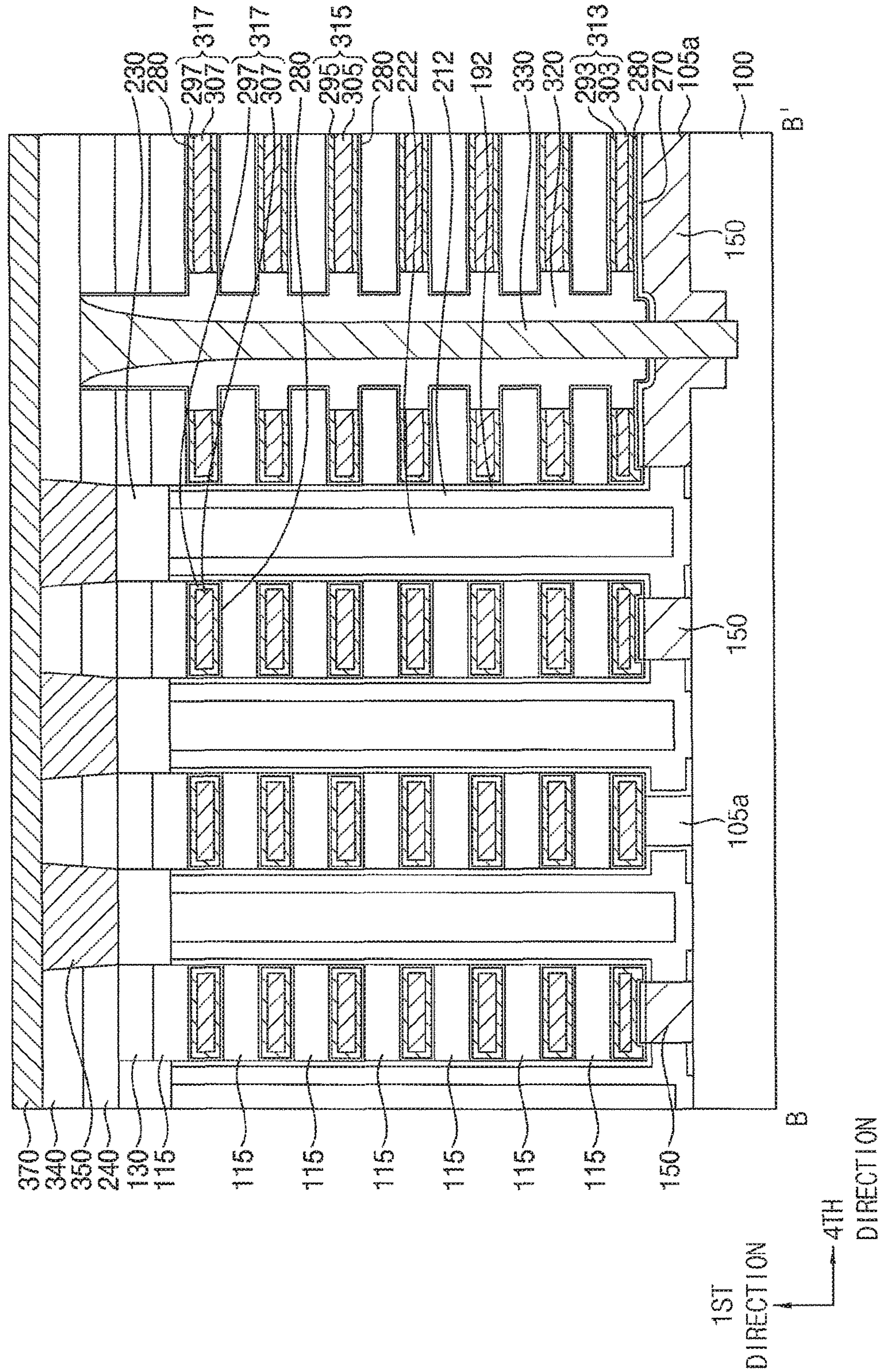

Referring to FIGS. 52A, 53A and 54A, processes substantially the same as or similar to those illustrated with reference to FIGS. 21 to 28 may be performed to complete the vertical memory device.

The vertical memory device, unlike that of FIGS. 1 to 28B, may not include the dummy channels 214, and the number of the channel columns in each channel block may be less than that of FIGS. 1 to 28B. Thus, the epitaxial layer 150 on the upper surface of the substrate 100 exposed by the opening 250 and the first gap 255 may electrically connect the channels 212 to each other in each channel block.

Particularly, the channels 212 in the first and second columns 212*a* and 212*b* may contact the epitaxial layer 150 vertically overlapping a first end of each of the gate electrodes 313, 315 and 317 in the third direction to be electrically connected thereto, and the channels 212 in the third and fourth columns 212*c* and 212*d* may contact the epitaxial layer 150 vertically overlapping a second end, which may be opposite the first end, of each of the gate electrodes 313, 315 and 317 in the third direction to be electrically connected thereto. Thus, each channel 212 may contact at least one of the epitaxial layers 150 grown from the upper surface of the substrate 100 to be electrically connected to the impurity region at the upper portion of the substrate 100, and thus may be electrically connected to an outer wiring electrically connected to the impurity region.

In the vertical memory device, the first support pattern 105*a* may extend in the second direction linearly to vertically overlap a central portion of each of the gate electrodes 313, 315 and 317 in the third direction, and the epitaxial layer 150 may extend in the second direction linearly to vertically overlap opposite edge portions of each of the gate electrodes 313, 315 and 317 in the third direction. Additionally, the CSL 330 extending in the second direction between the channel blocks spaced apart from each other in the third direction may penetrate through the epitaxial layer 150 to divide the epitaxial layer 150 into two pieces in the third direction. In example embodiments, the epitaxial layer 150 may have a width in the third direction constant along the second direction.

Figure 52B:
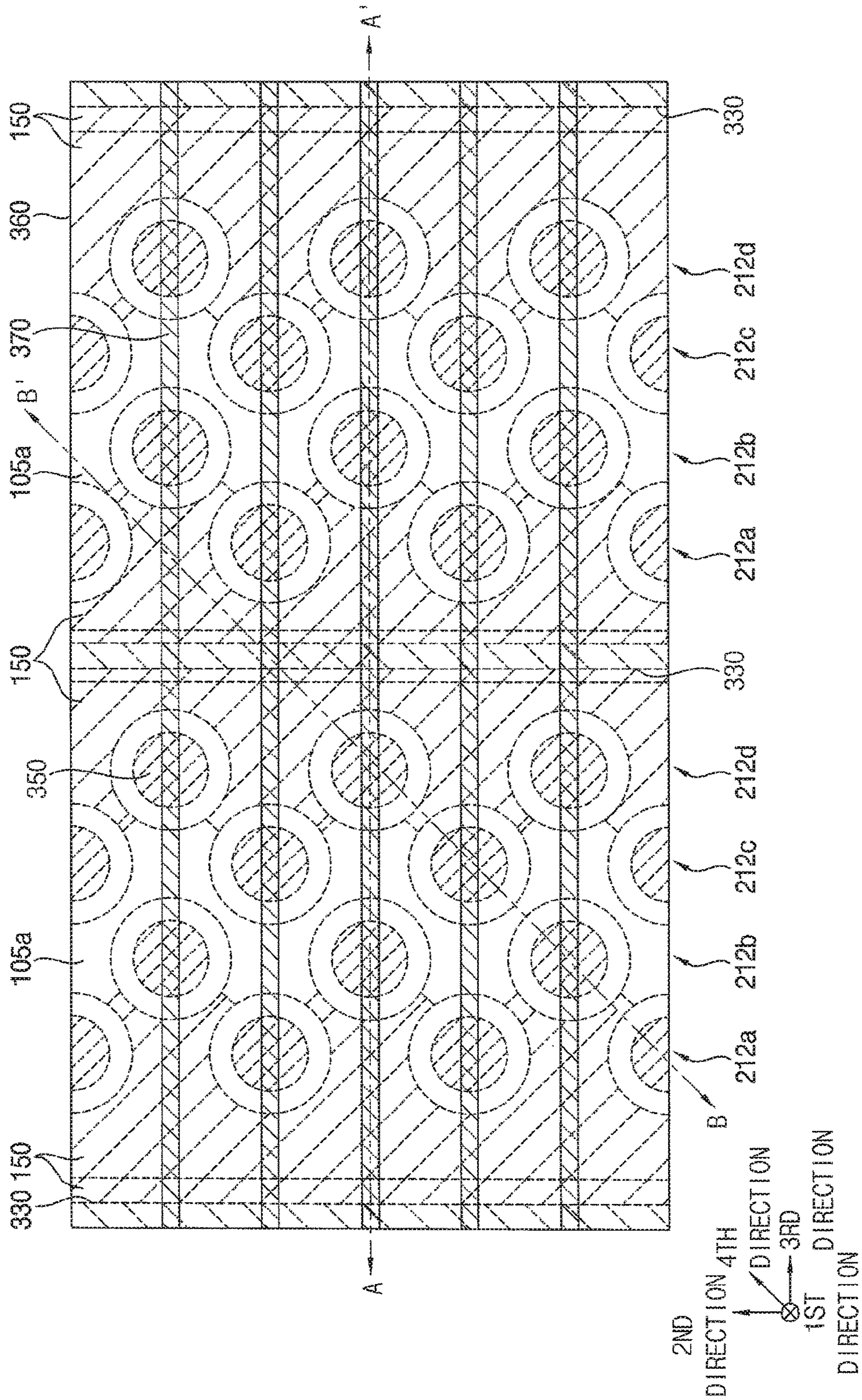
Figure 53B:
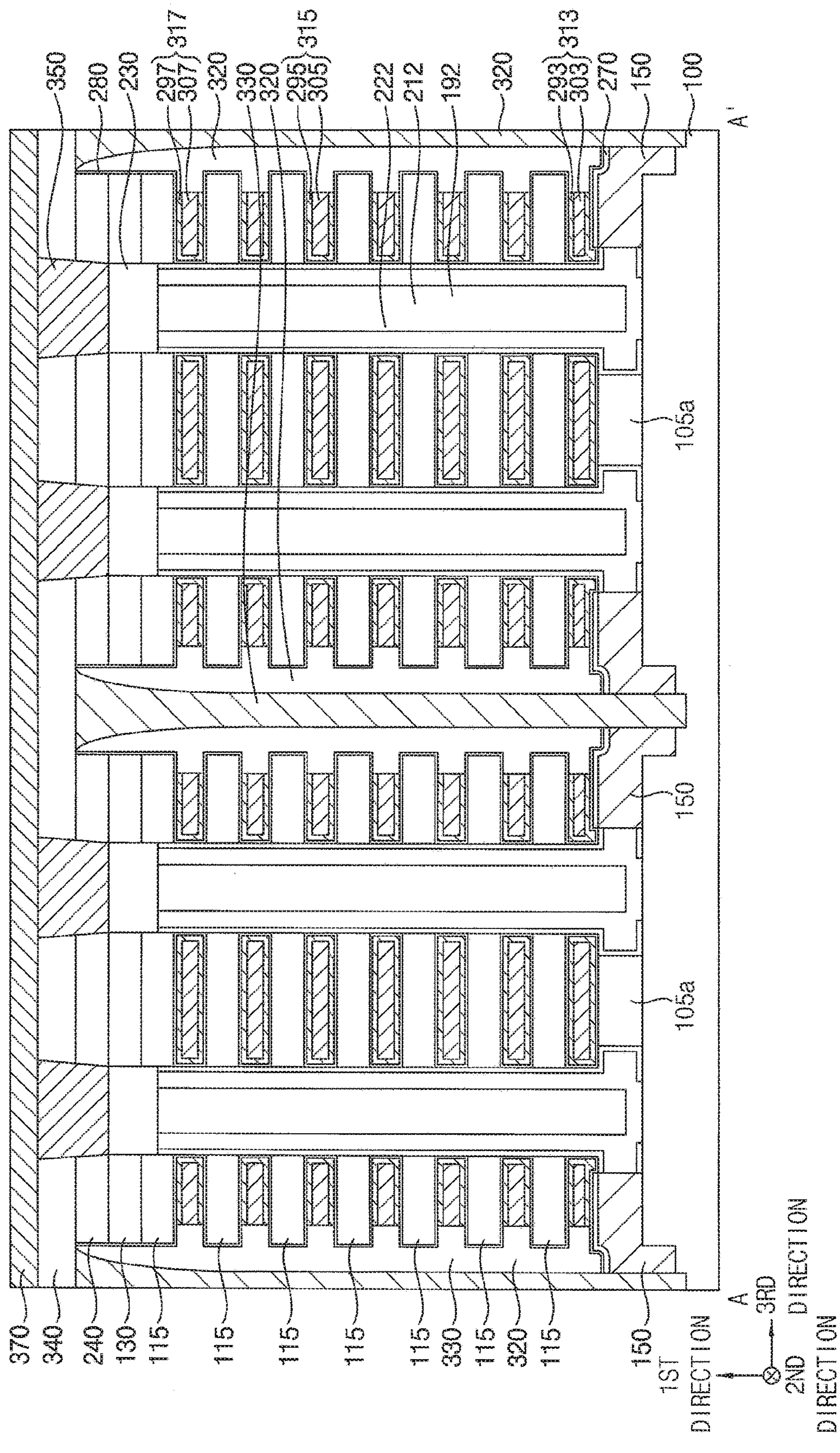
Figure 54B:
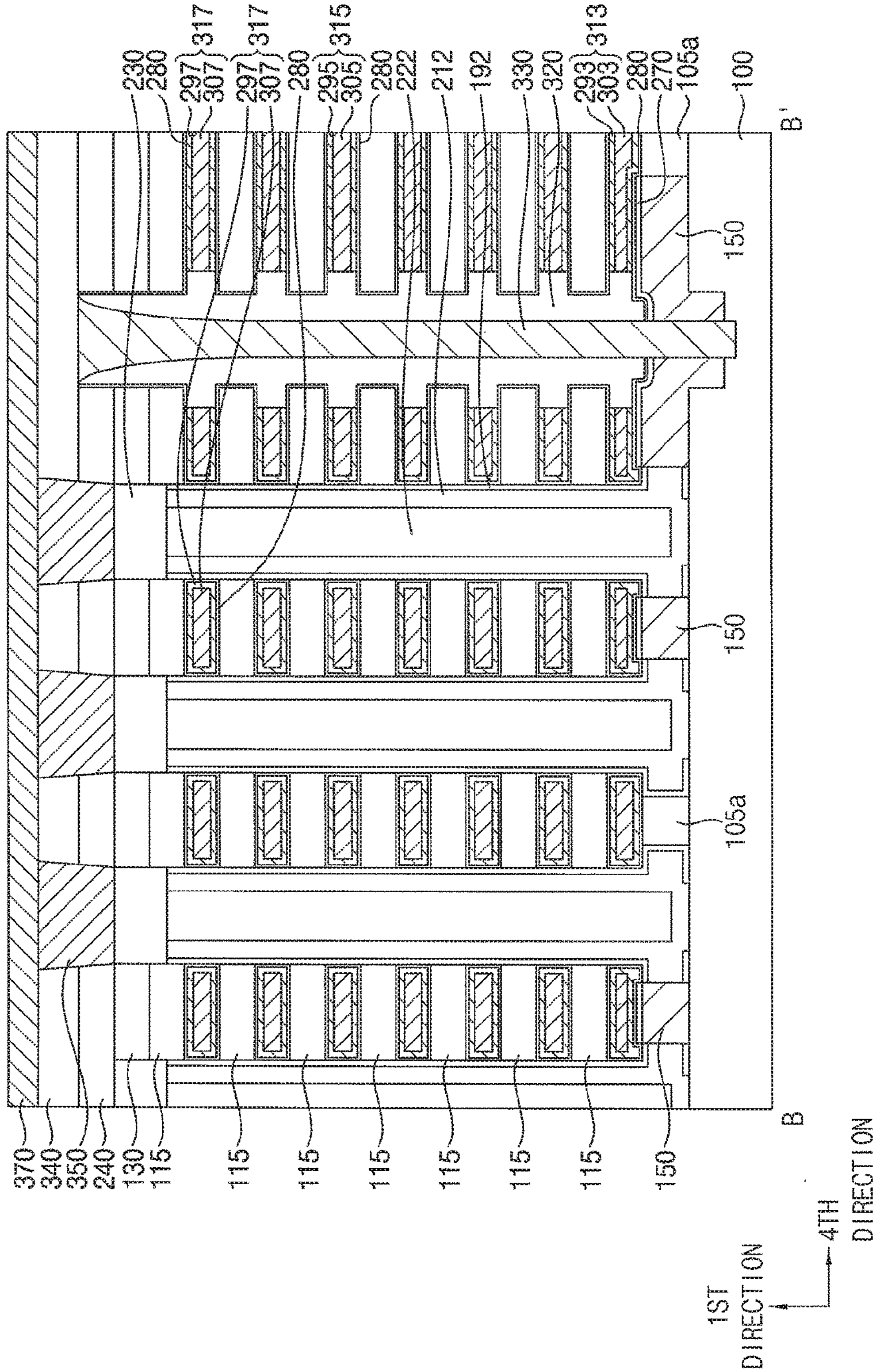

Referring to FIGS. 52B, 53B and 54B, the first support pattern 105*a* may extend in the second direction in a zigzag layout to vertically overlap a central portion of each of the gate electrodes 313, 315 and 317 in the third direction, and the epitaxial layer 150 may have a width in the third direction varying along the second direction.

Figure 55A:
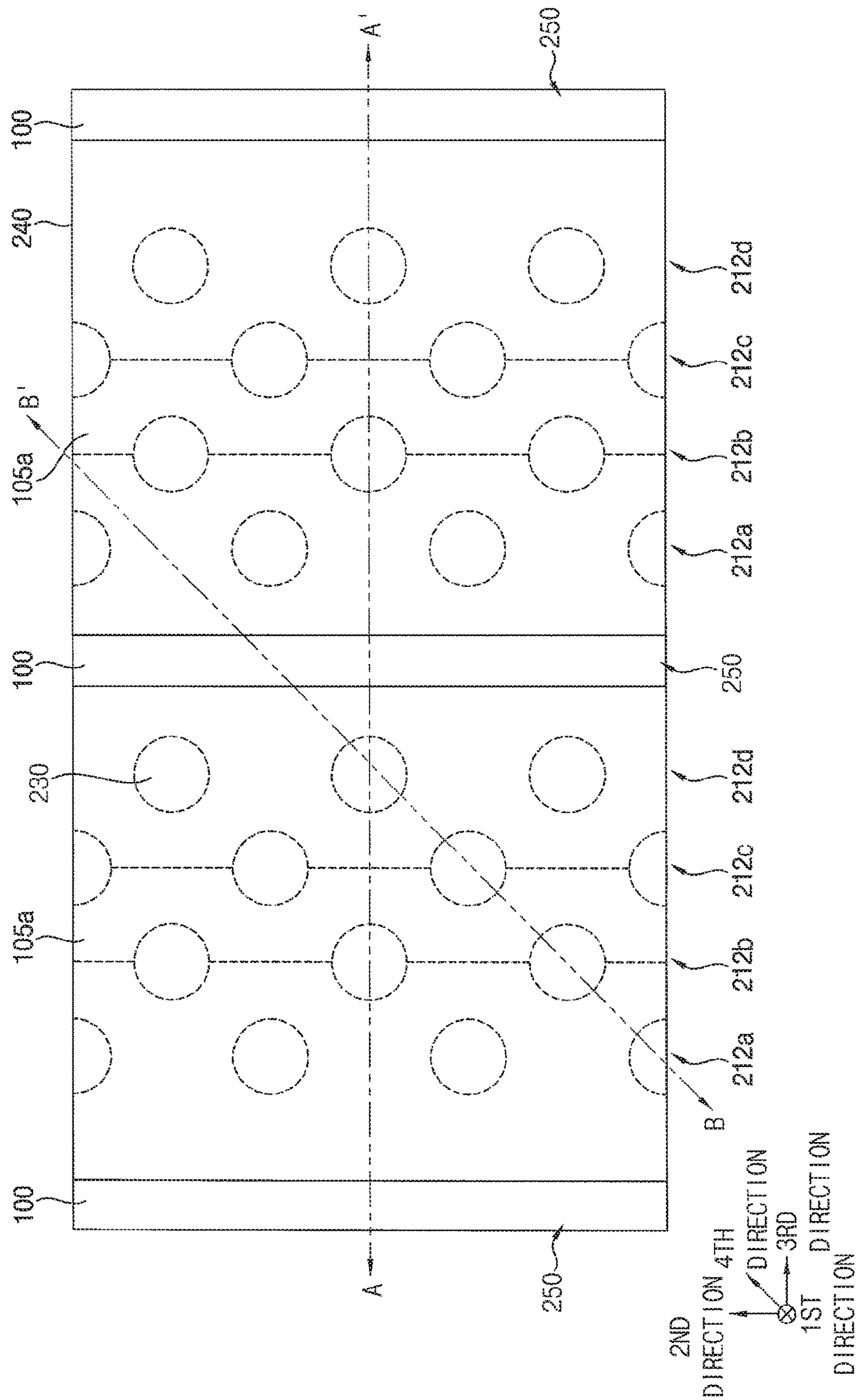
FIGS. 55A to 60B are cross-sectional views illustrating stages of a method of manufacturing a vertical memory device in accordance with example embodiments.

FIGS. 55A to 60 are cross-sectional views illustrating stages of a method of manufacturing a vertical memory device in accordance with example embodiments. Particularly, FIGS. 55A and 58 are plan views, and FIGS. 56A, 57A and 59-60 are cross-sectional views.

Figure 55B:
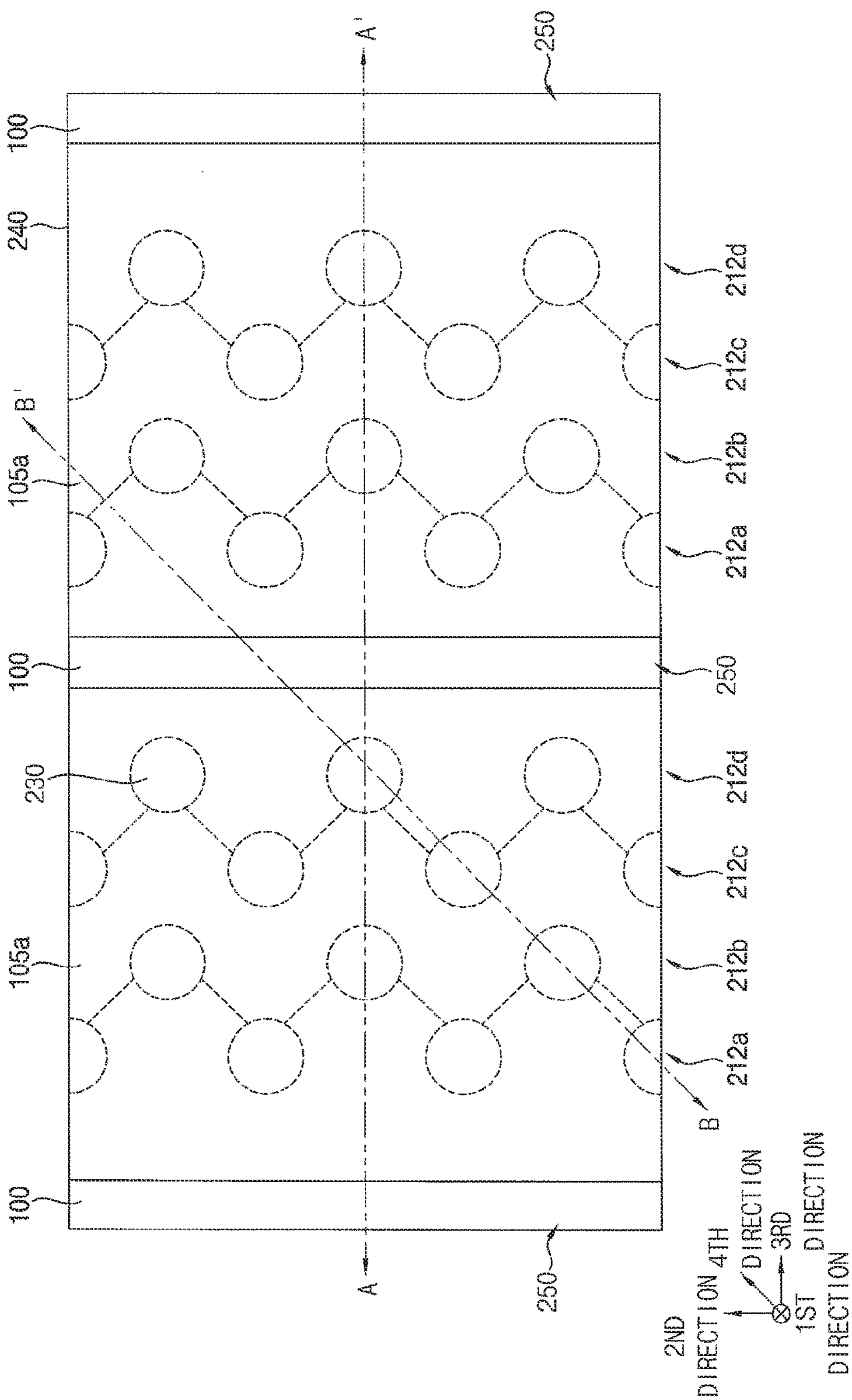
Figure 56A:
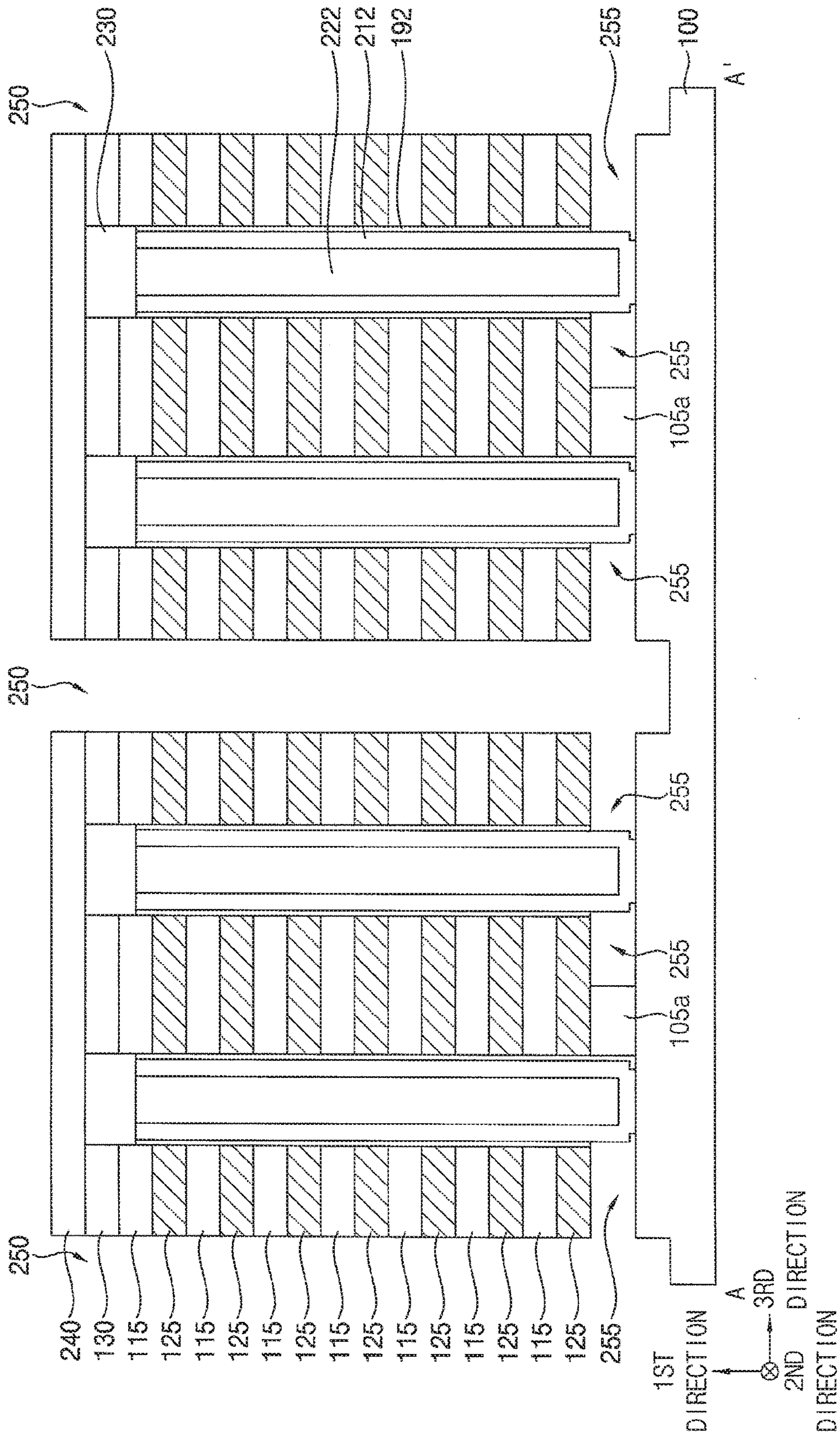
Figure 56B:
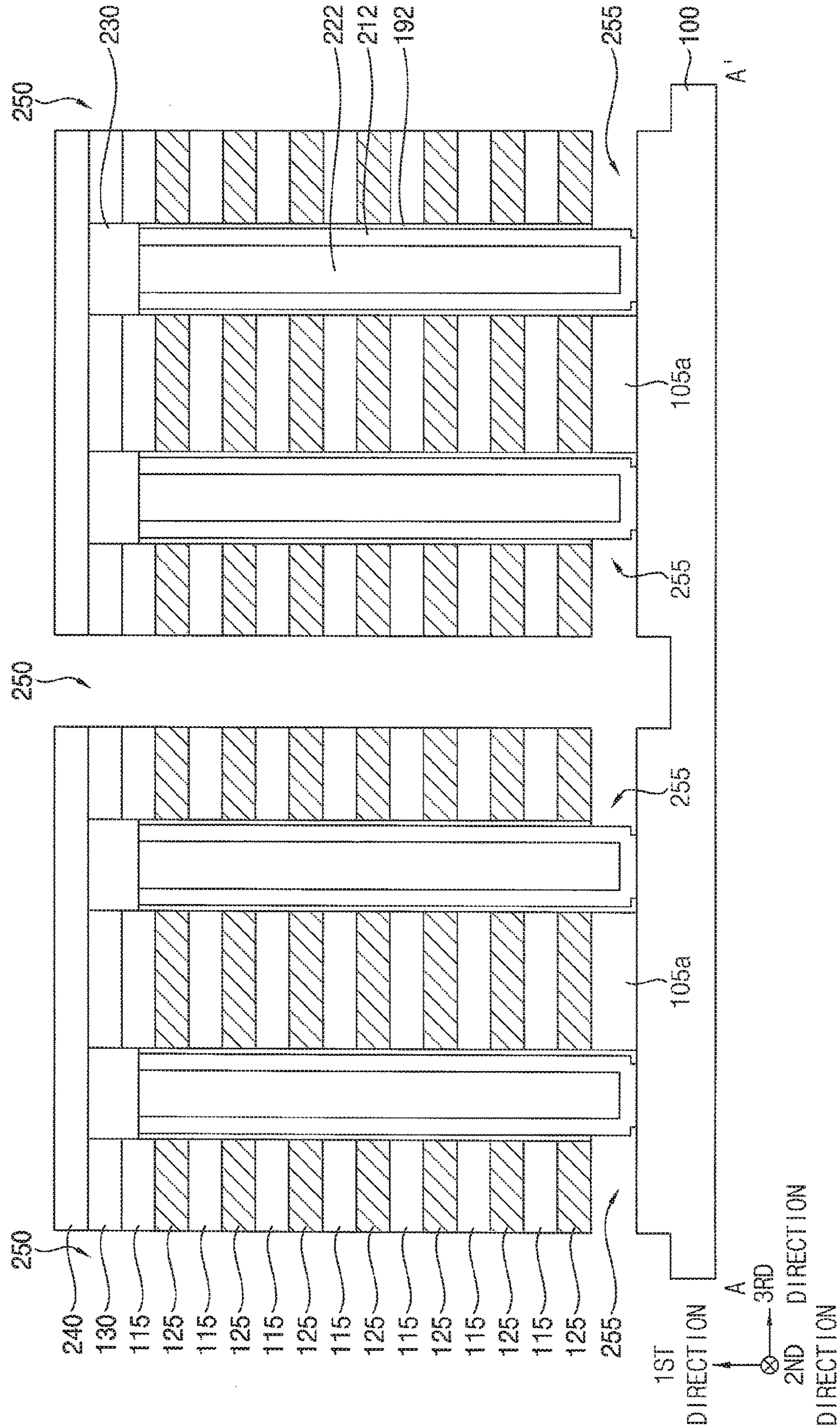
Figure 57A:
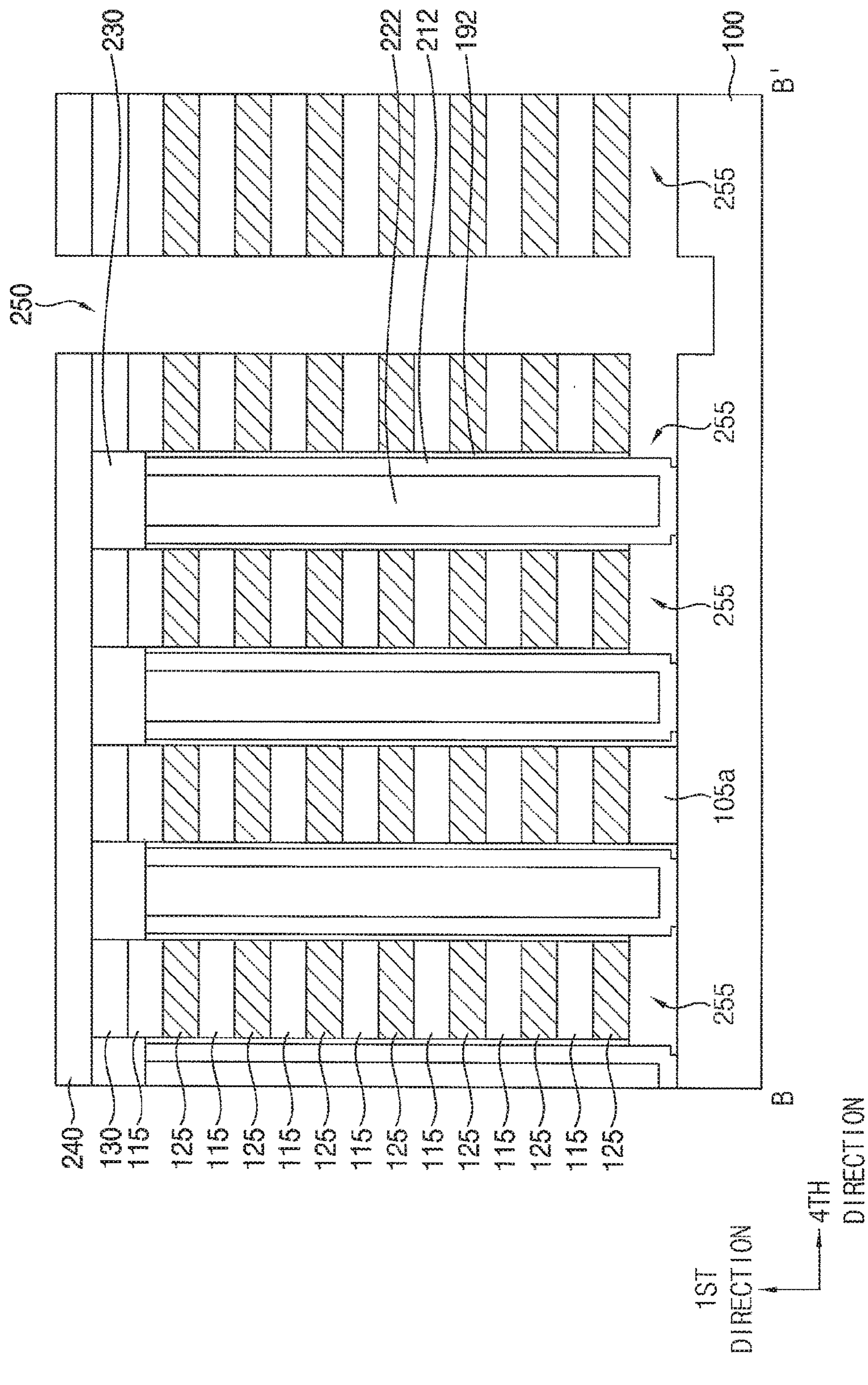
Figure 58A:
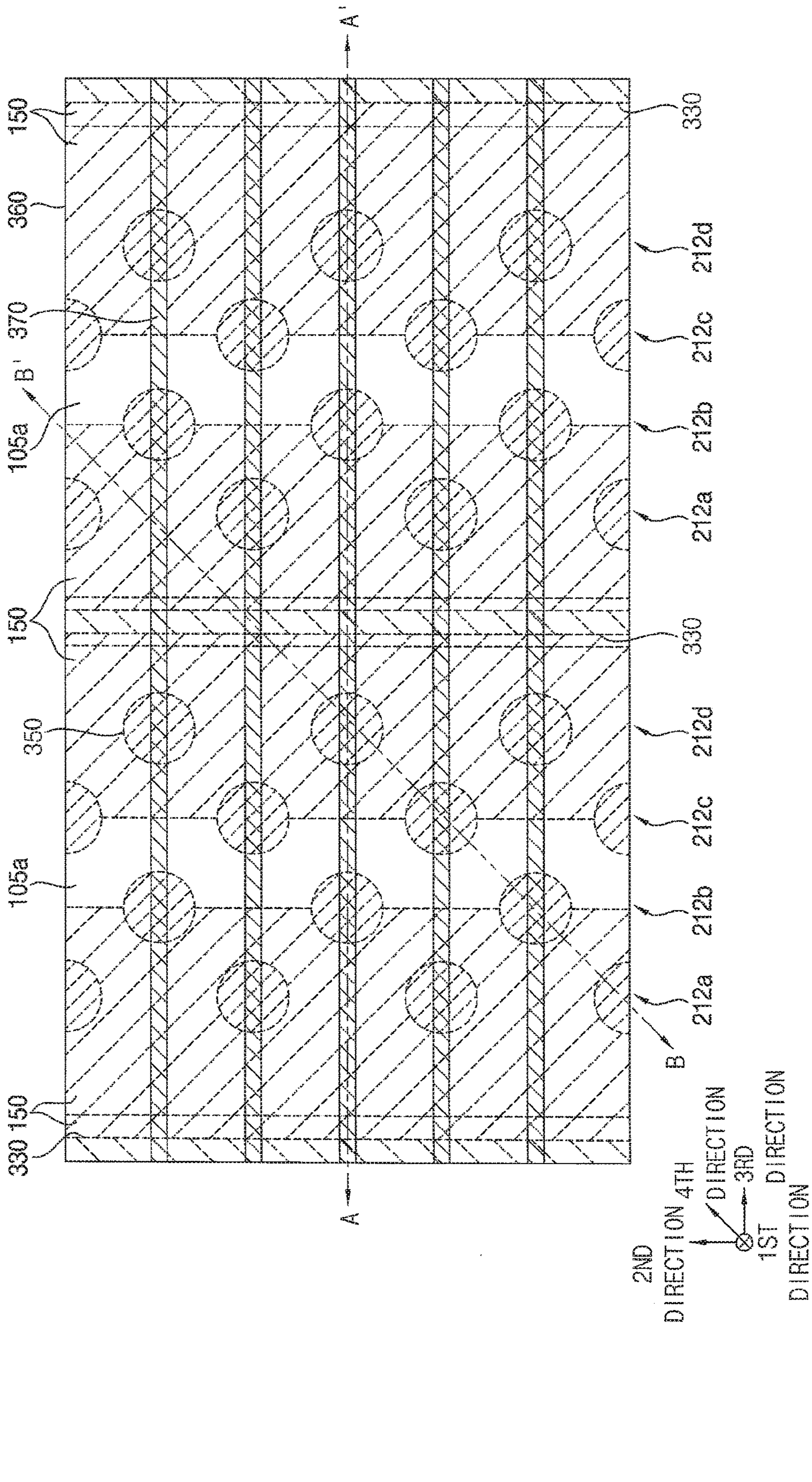
Figure 58B:
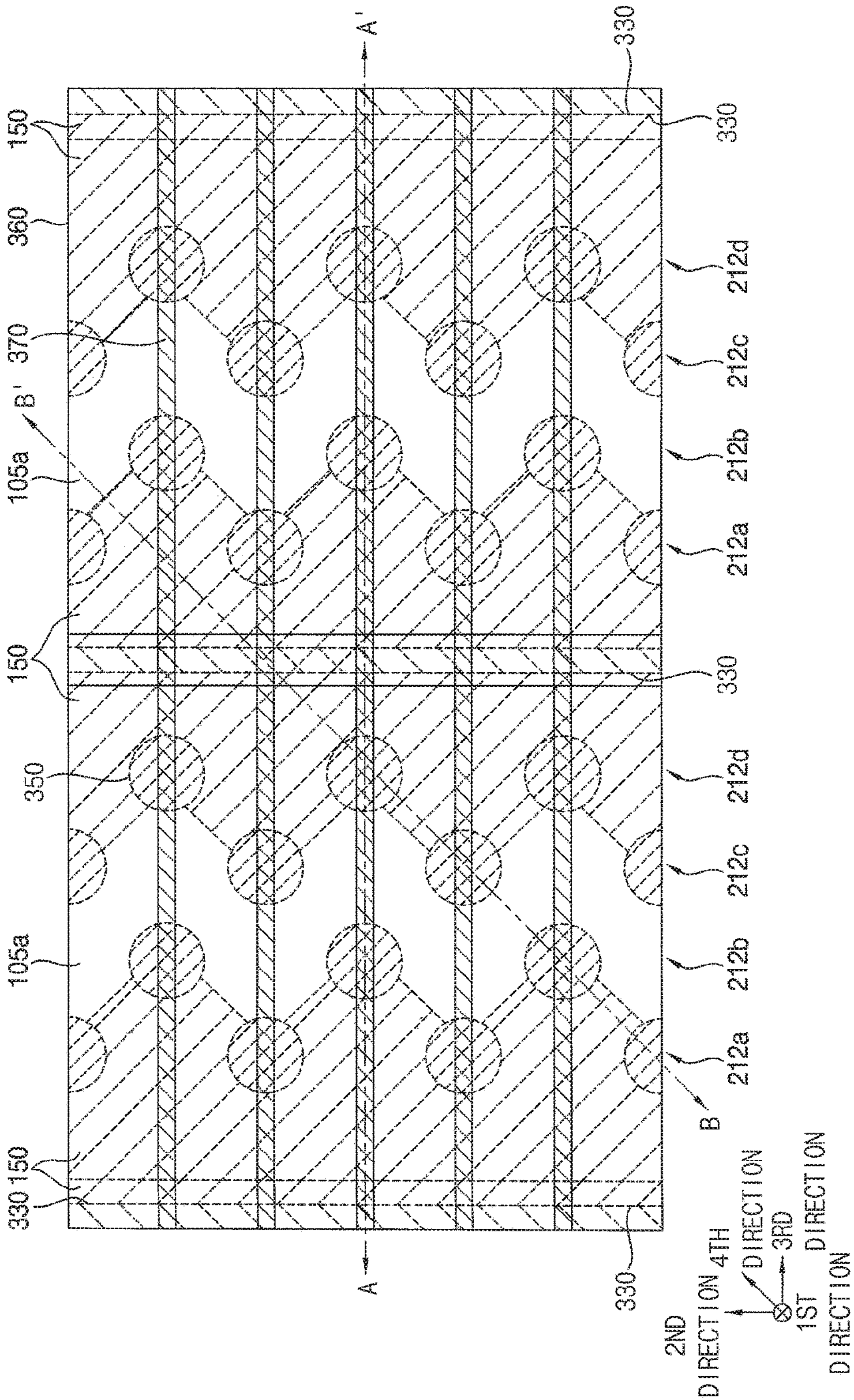
Figure 59A:
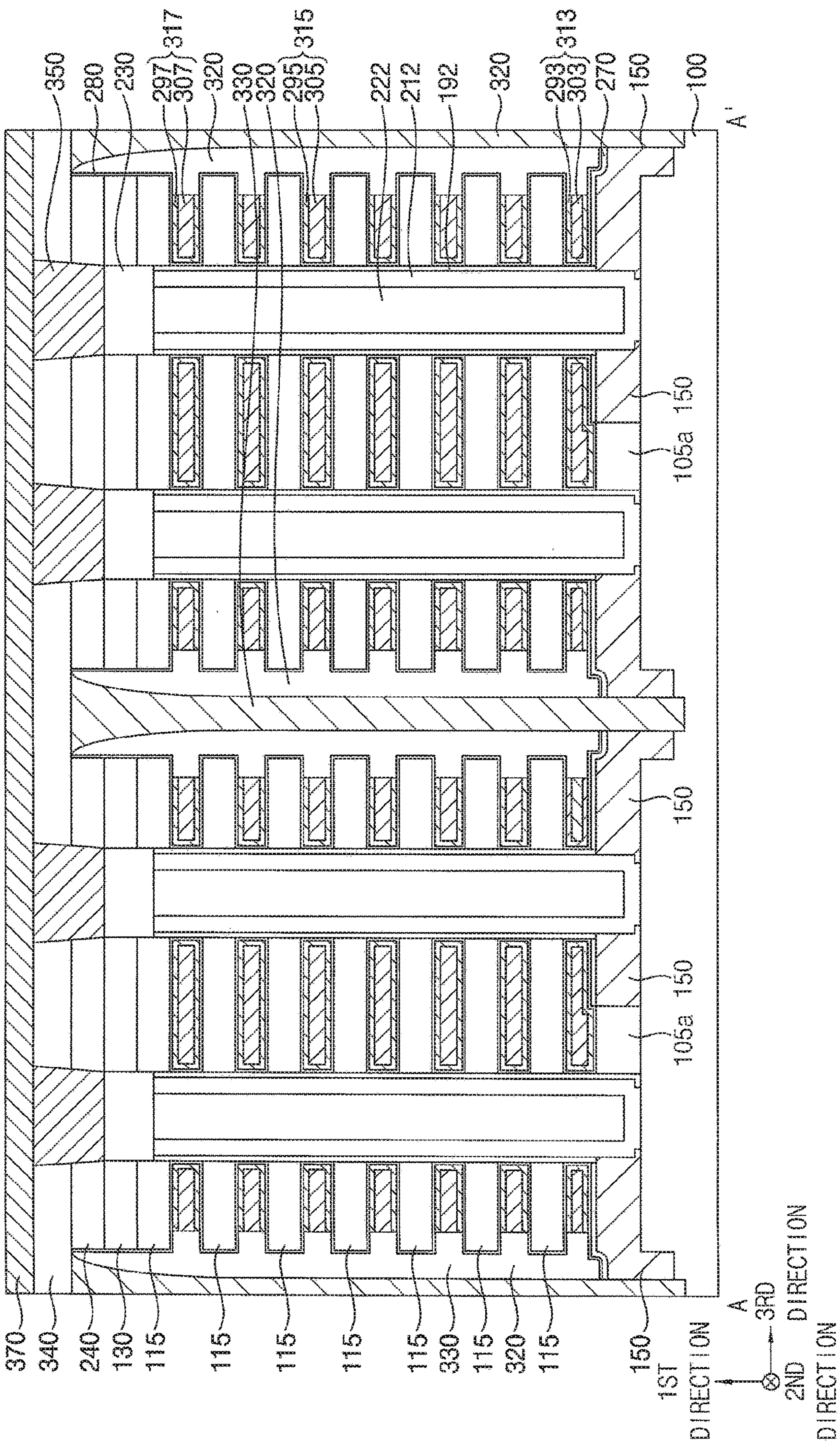
Figure 59B:
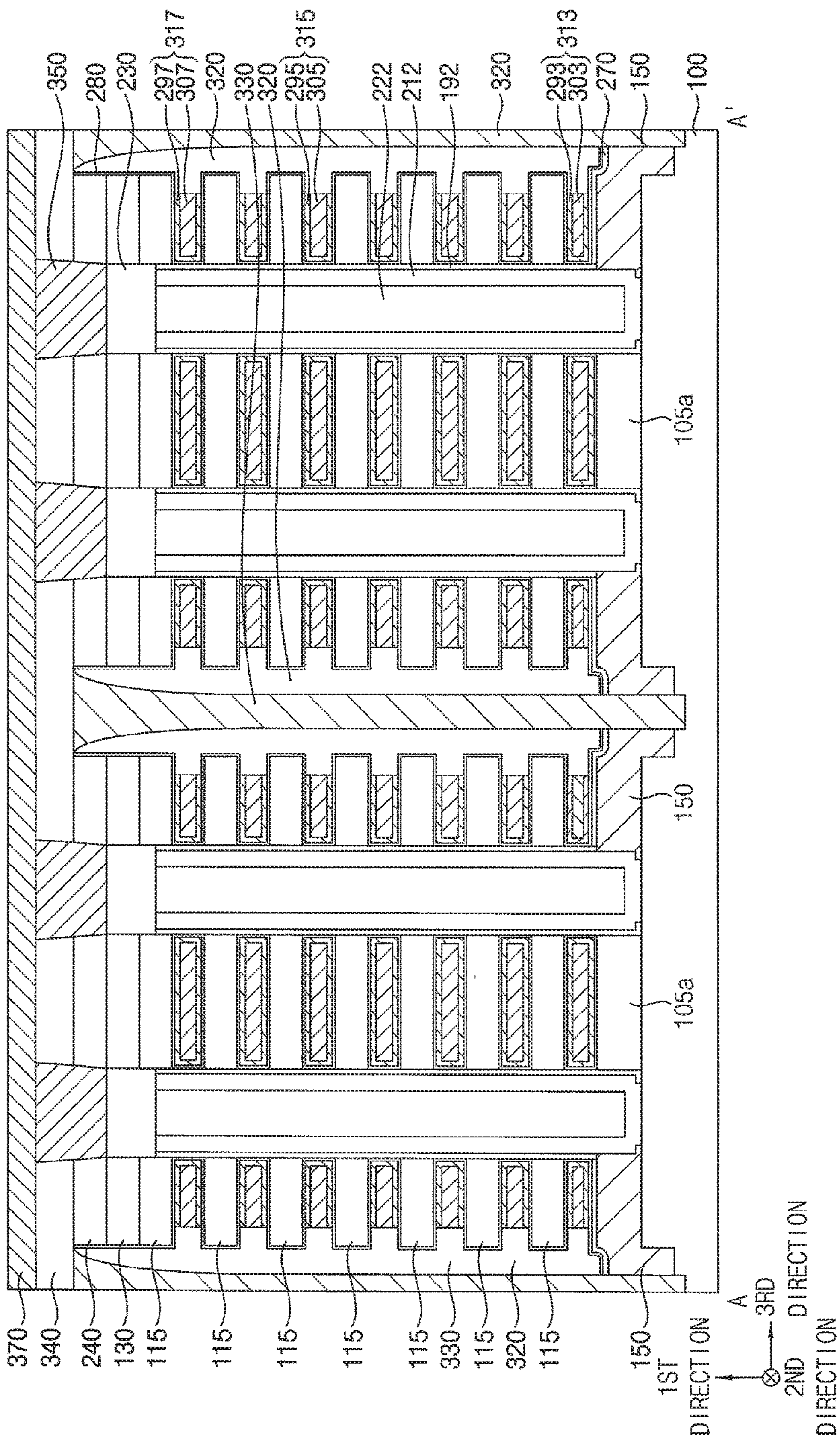
Figure 60A:
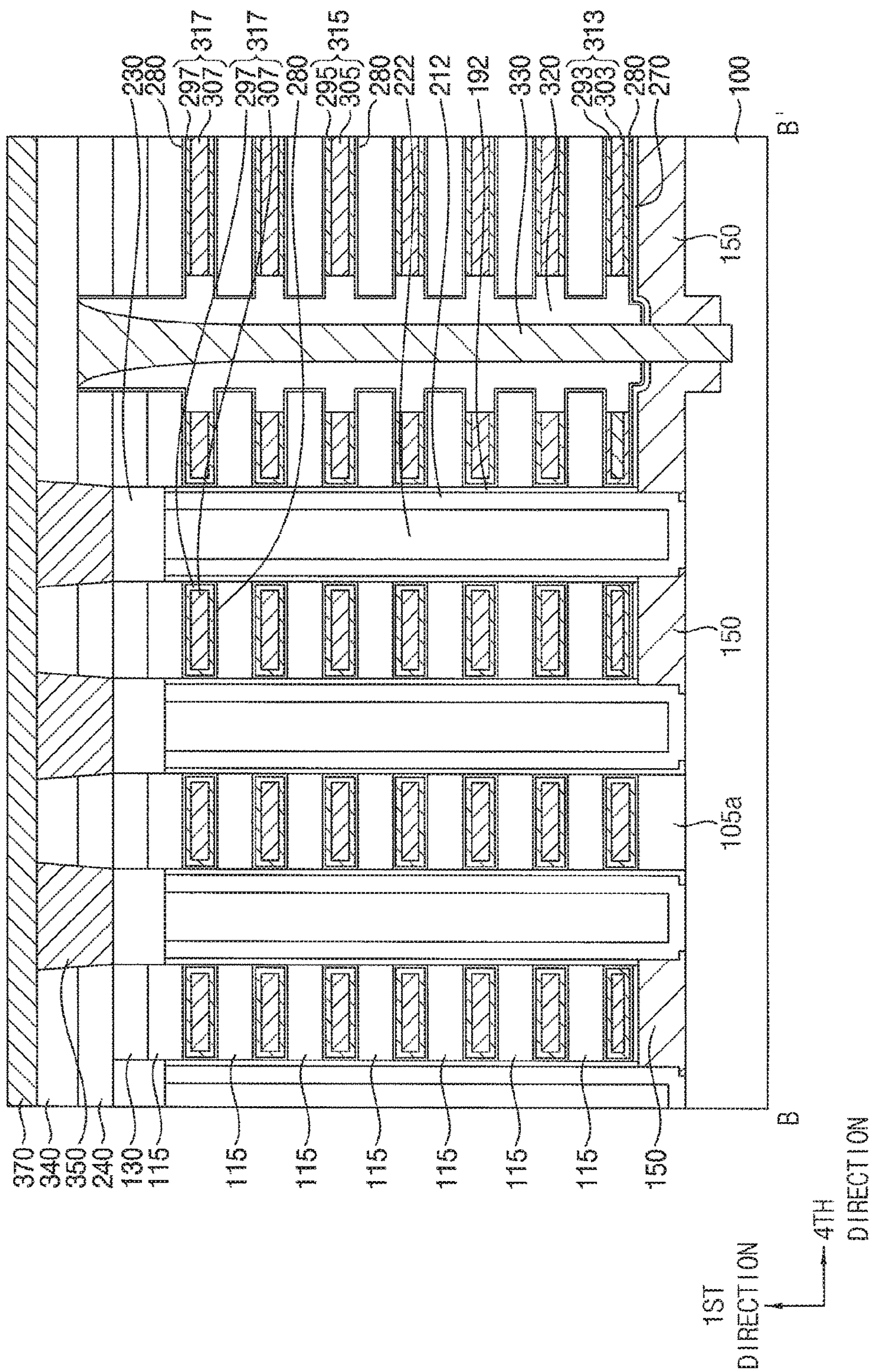
Figure 60B:
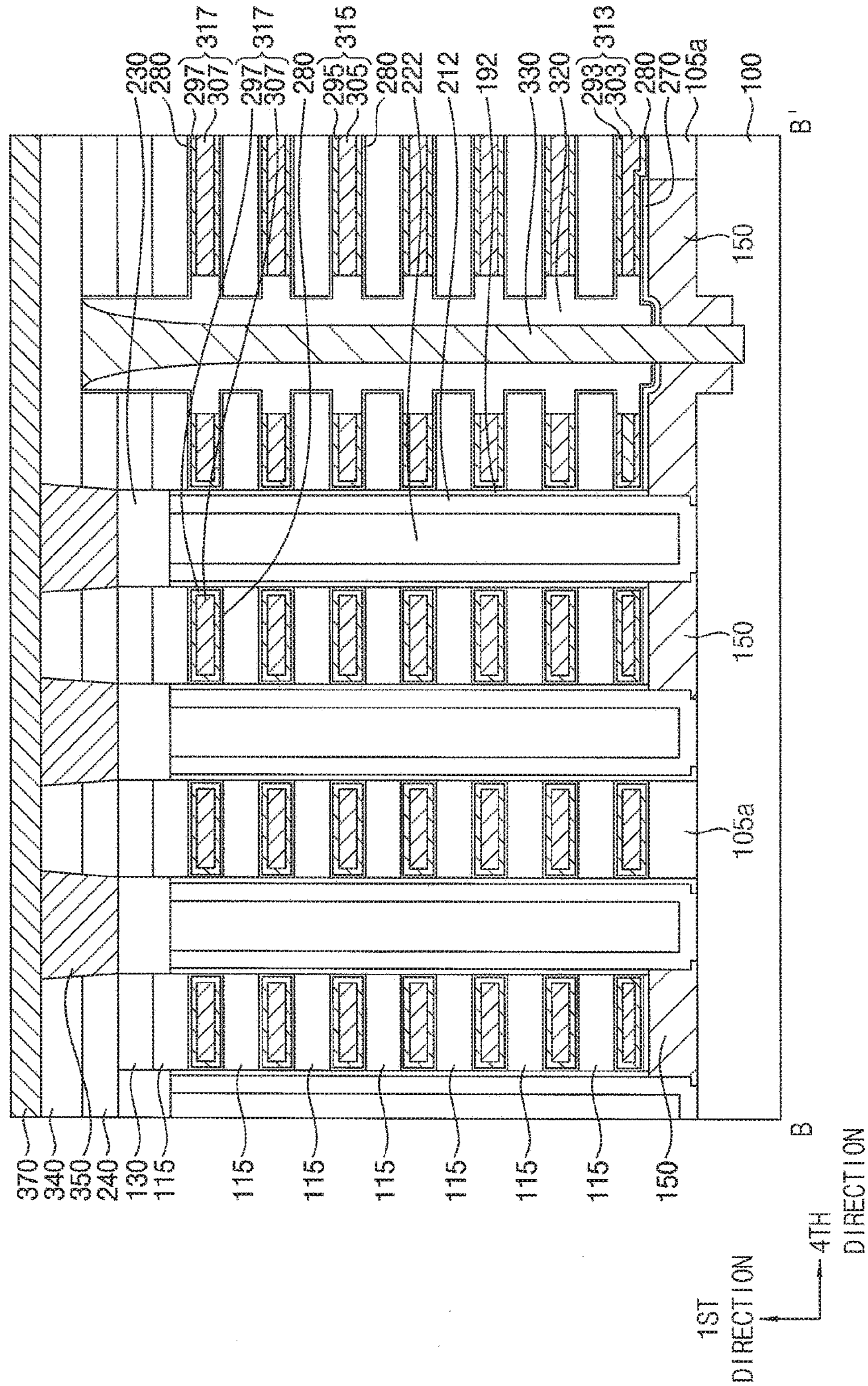

Among the cross-sectional views, FIGS. 56 and 59 are cross-sectional views along cutlines A-A' of corresponding plan views, respectively, and FIGS. 57A and 60 are cross-sectional views along cutlines B-B' of corresponding plan views, respectively. FIGS. 55A, 56A, 57A, 58A, 59A and 60A are cross-sectional views including a first support pattern extending linearly, and FIGS. 55B, 56B, 57B, 58B, 59B and 60B are cross-sectional views including a first support pattern extending in a zigzag layout.

This method may include processes substantially the same as or similar to those illustrated with reference to FIGS. 1 to 28A or FIGS. 37 to 54B. Thus, like reference numerals refer to like elements, and detailed descriptions thereon may be omitted below in the interest of brevity.

First, a process substantially the same as or similar to that illustrated with reference to FIGS. 37 to 39 may be performed.

A process substantially the same as or similar to that illustrated with reference to FIGS. 43 to 45 may be performed without performing the process illustrated with reference to FIGS. 40 to 42, e.g., the process for enlarging the channel holes.

Thus, each channel 212 may not include the first expansion portion at a lower portion thereof, and may have a constant width along the first direction.

Referring to FIGS. 55A, 56A and 57A, a process substantially the same as or similar to that illustrated with reference to FIGS. 46A, 47A and 48A may be performed.

Thus, the support layer 105 exposed by the opening 250 may be partially removed to form the first gap 255, and after partially removing the support layer 105, a portion of the first charge storage structure 192 contacting the support layer 105 may be also removed.

In example embodiments, the whole sidewalls of the first expansion portions of the channels 212 in the first and fourth channel columns 212*a* and 212*d* adjacent the opening 250 may be exposed by the first gap 255, and only portions of the sidewalls of the first expansion portions facing the opening 250 of the channels 212 in the second and third channel columns 212*b* and 212*c* may be exposed by the first gap 255. Thus, the first support pattern 105*a* that may be formed from the support layer 105 may contact lower portions of the channels 212 in the second and third channel columns 212*b* and 212*c*, and may extend in the second direction linearly.

Figure 57B:
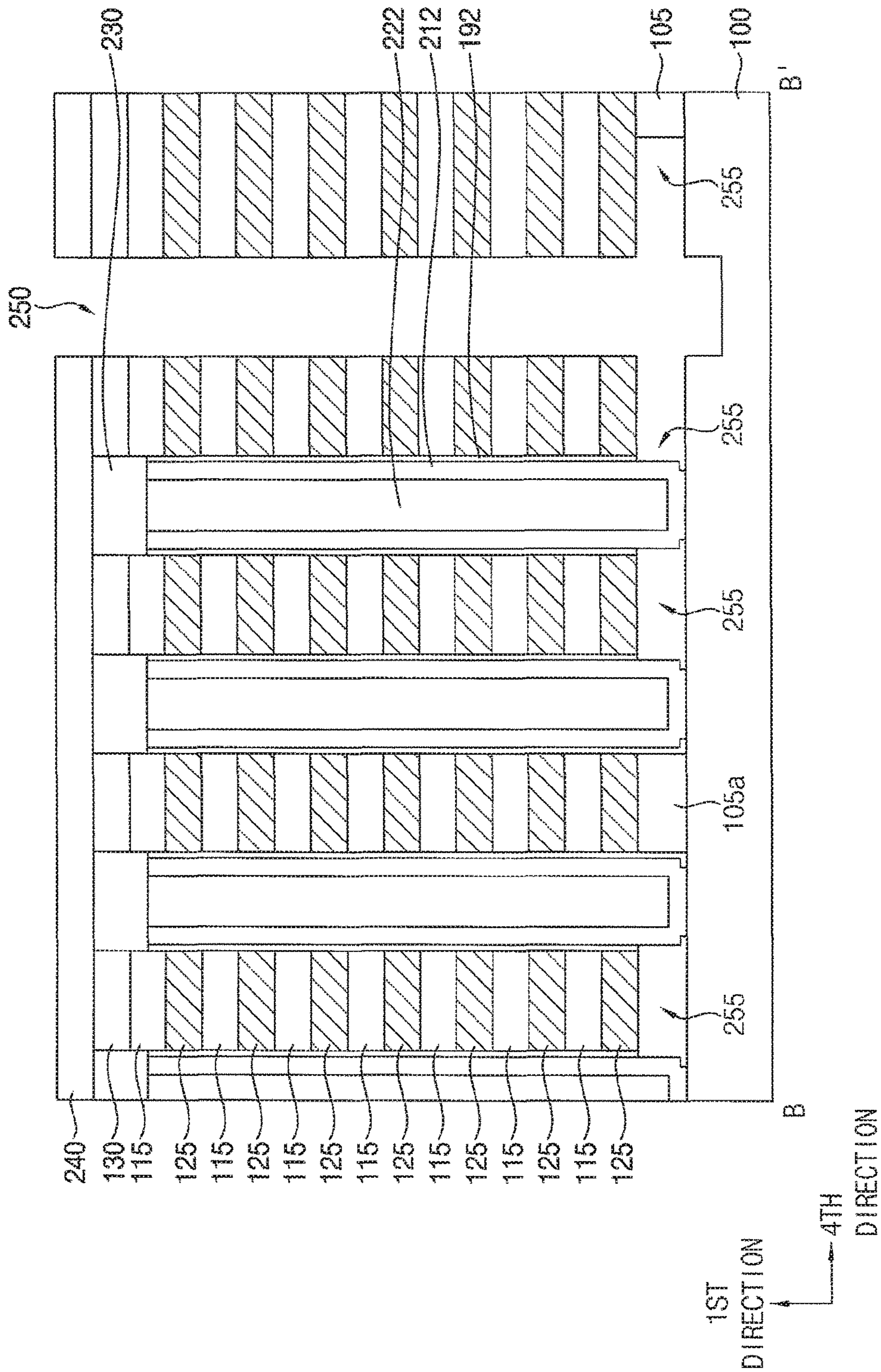

Referring to FIGS. 55B, 56B and 57B, the first support pattern 105*a* that may be formed from the support layer 105 may extend in the second direction in a zigzag layout.

In example embodiments, lower sidewalls of the channels 212 in the first and fourth channel columns 212*a* and 212*d*, which may be adjacent the opening 250, may be exposed more than lower sidewalls of the channels 212 in the second and third channel columns 212*b* and 212*c*, which may be distant from the opening 250.

Referring to FIGS. 58A, 59A and 60A, processes substantially the same as or similar to those illustrated with reference to FIGS. 49A, 50A, 51A, 52A, 53A and 54A may be performed to complete the vertical memory device.

In the method of manufacturing the vertical memory device, the process for partially removing the support layer 105 in order to enlarge the lower portions of the channel holes 142 may not be performed, however, when the support layer 105 exposed by the opening 250 is partially removed to form the first gap 255, the lower portion of each of the channels 212 may be at least partially exposed by the first gap 255. Thus, the channels 212 may contact the epitaxial layer 150 filling the first gap 255, and may be electrically connected with each other through the epitaxial layer 150.

Each of the channels 212 in the vertical memory device may have a cup-like shape having a constant width in the first direction.

Figure 61:
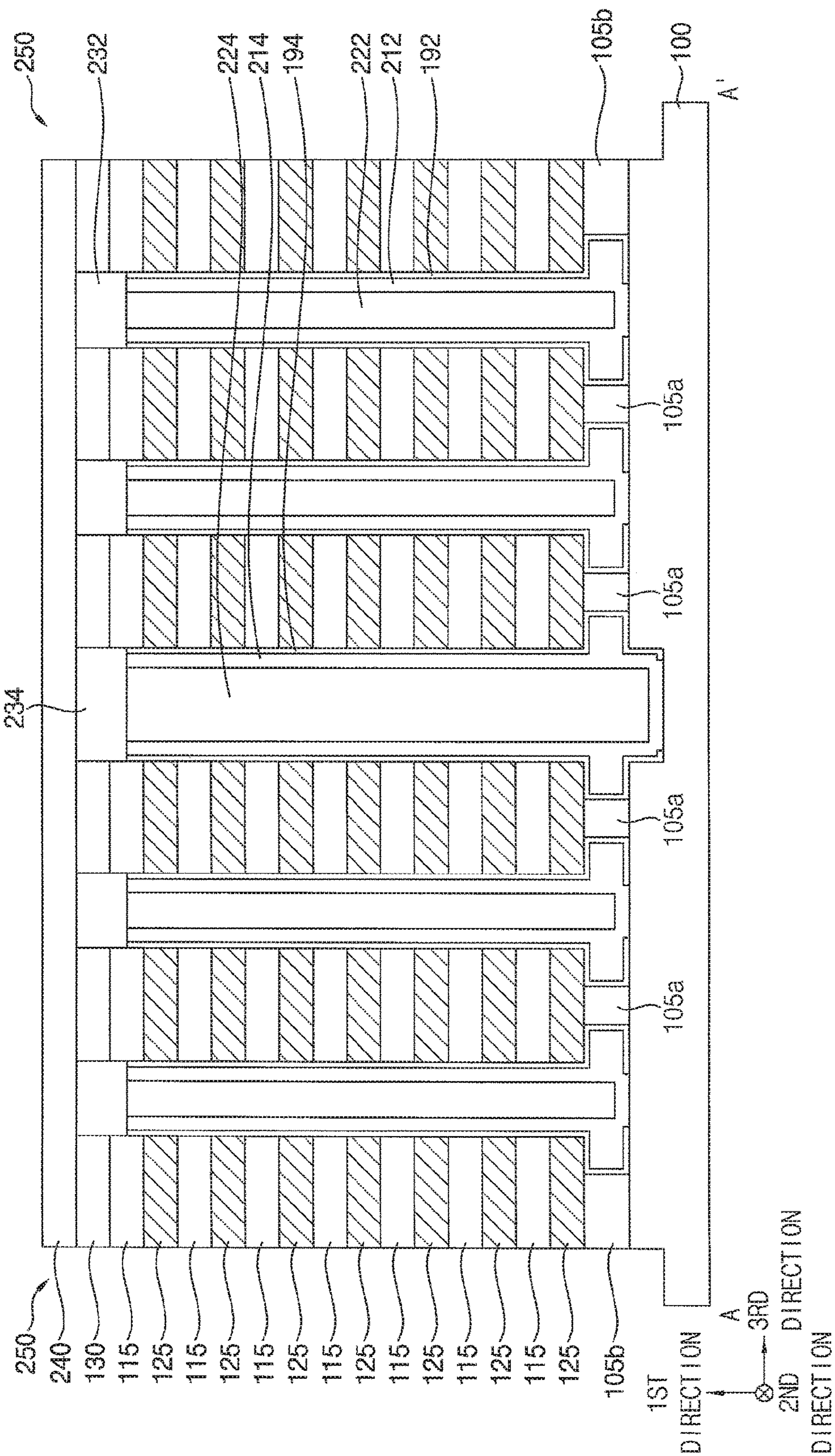
FIGS. 61 to 65 are cross-sectional views illustrating stages of a method of manufacturing a vertical memory device in accordance with example embodiments
Figure 62:
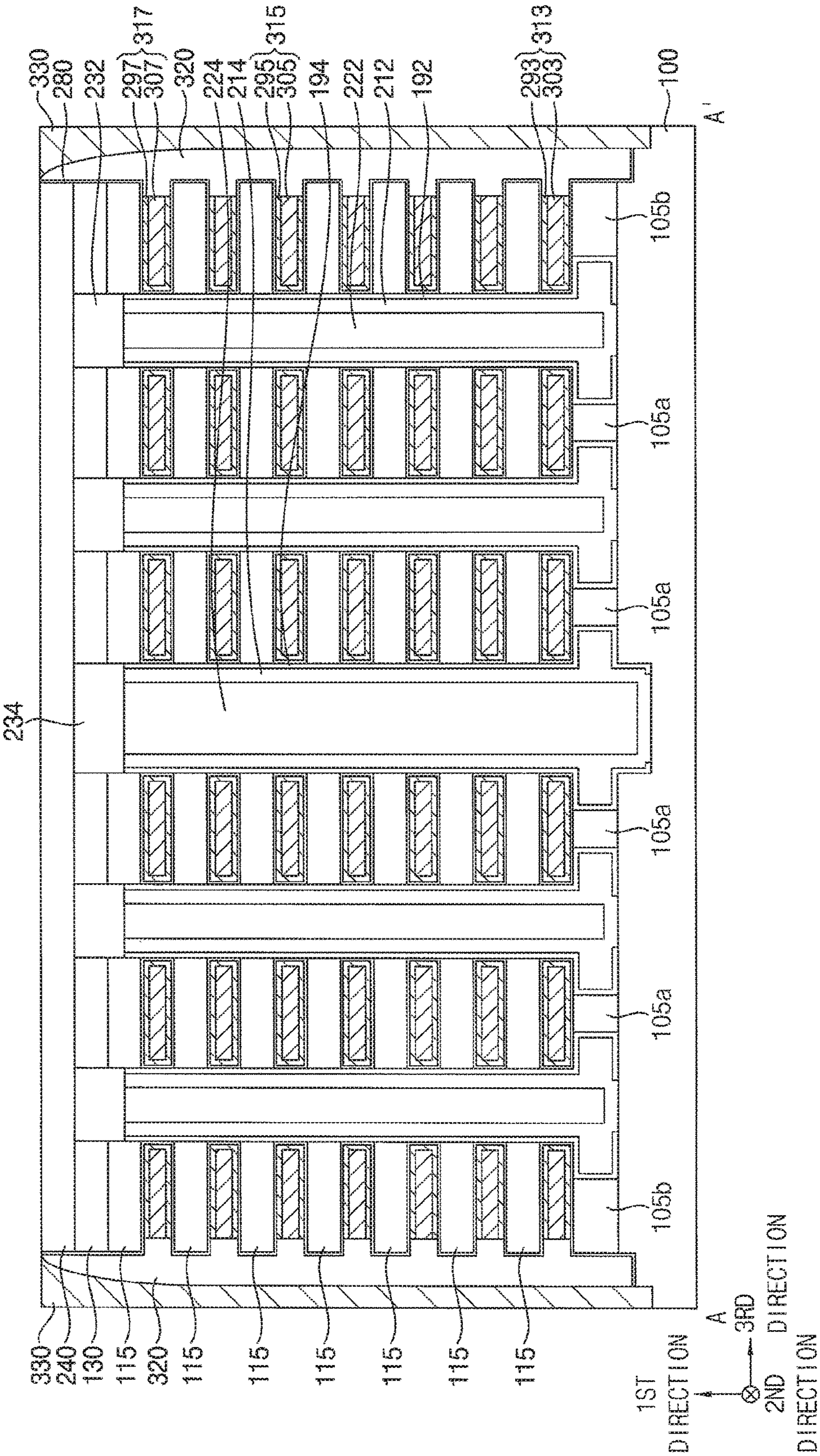
Figure 63:
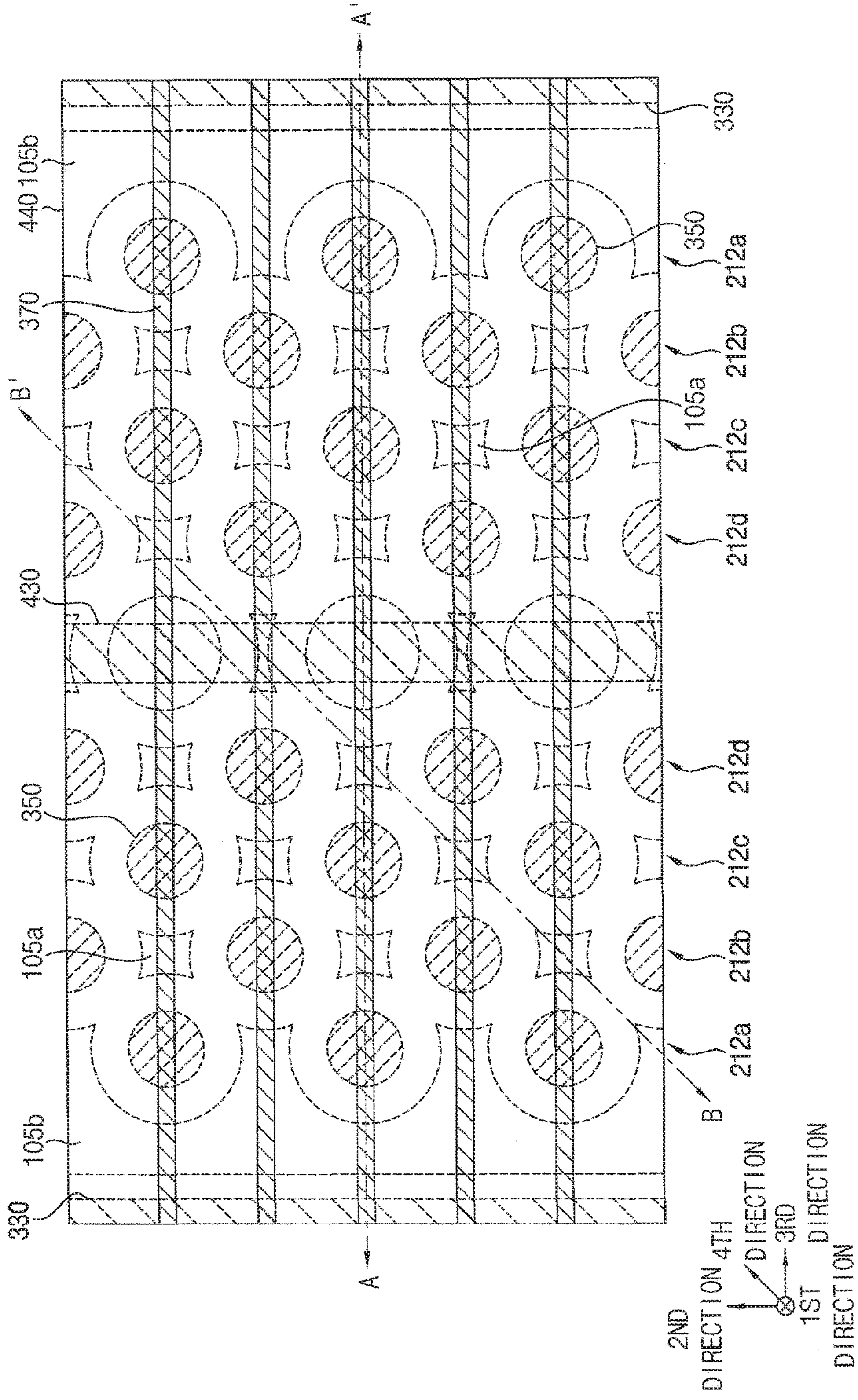

FIGS. 61 to 65 are cross-sectional views illustrating stages of a method of manufacturing a vertical memory device in accordance with example embodiments. Particularly, FIGS. 61-62 and 64-65 are plan views, and FIG. 63 is a cross-sectional view.

Figure 64:
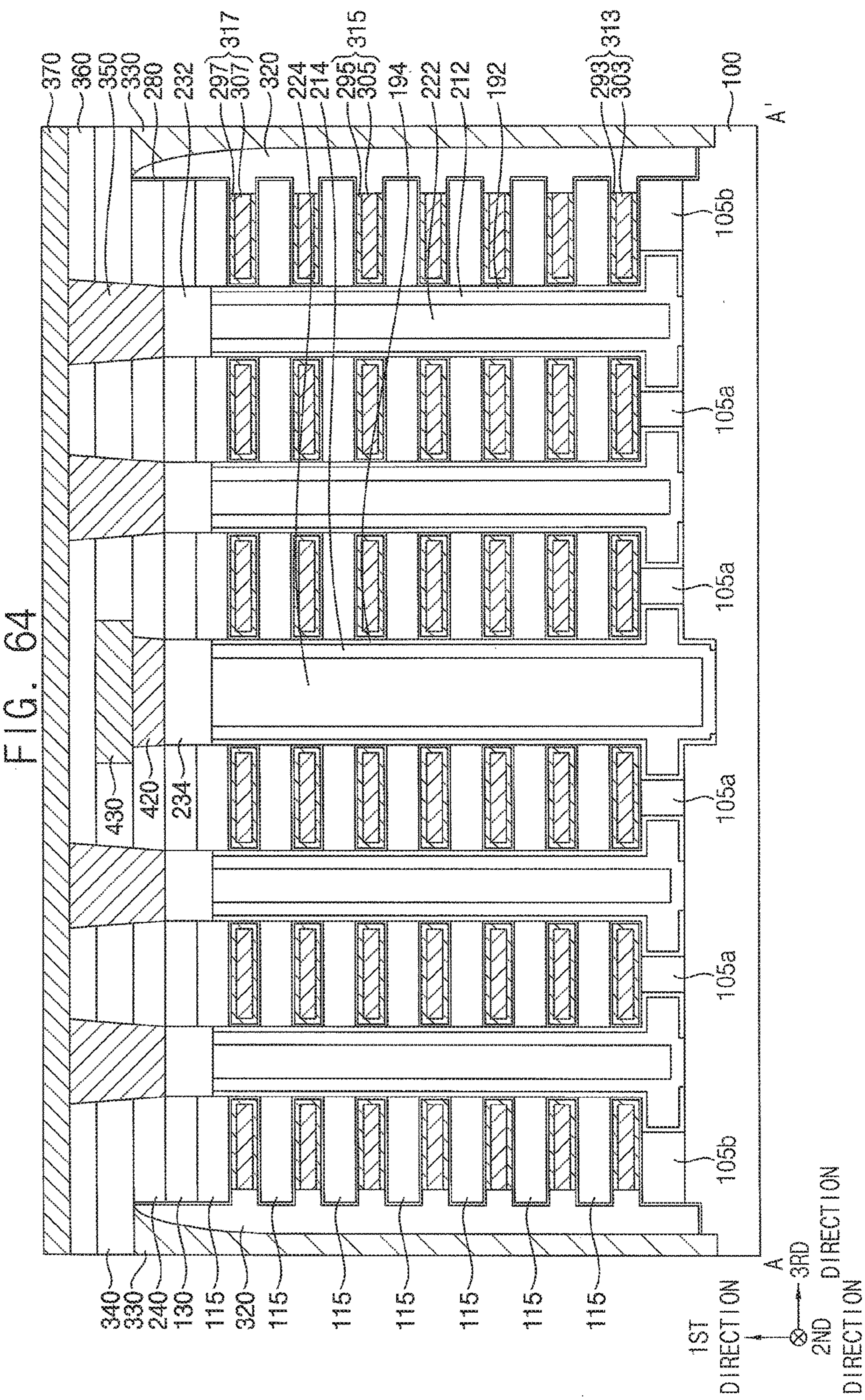
Figure 65:
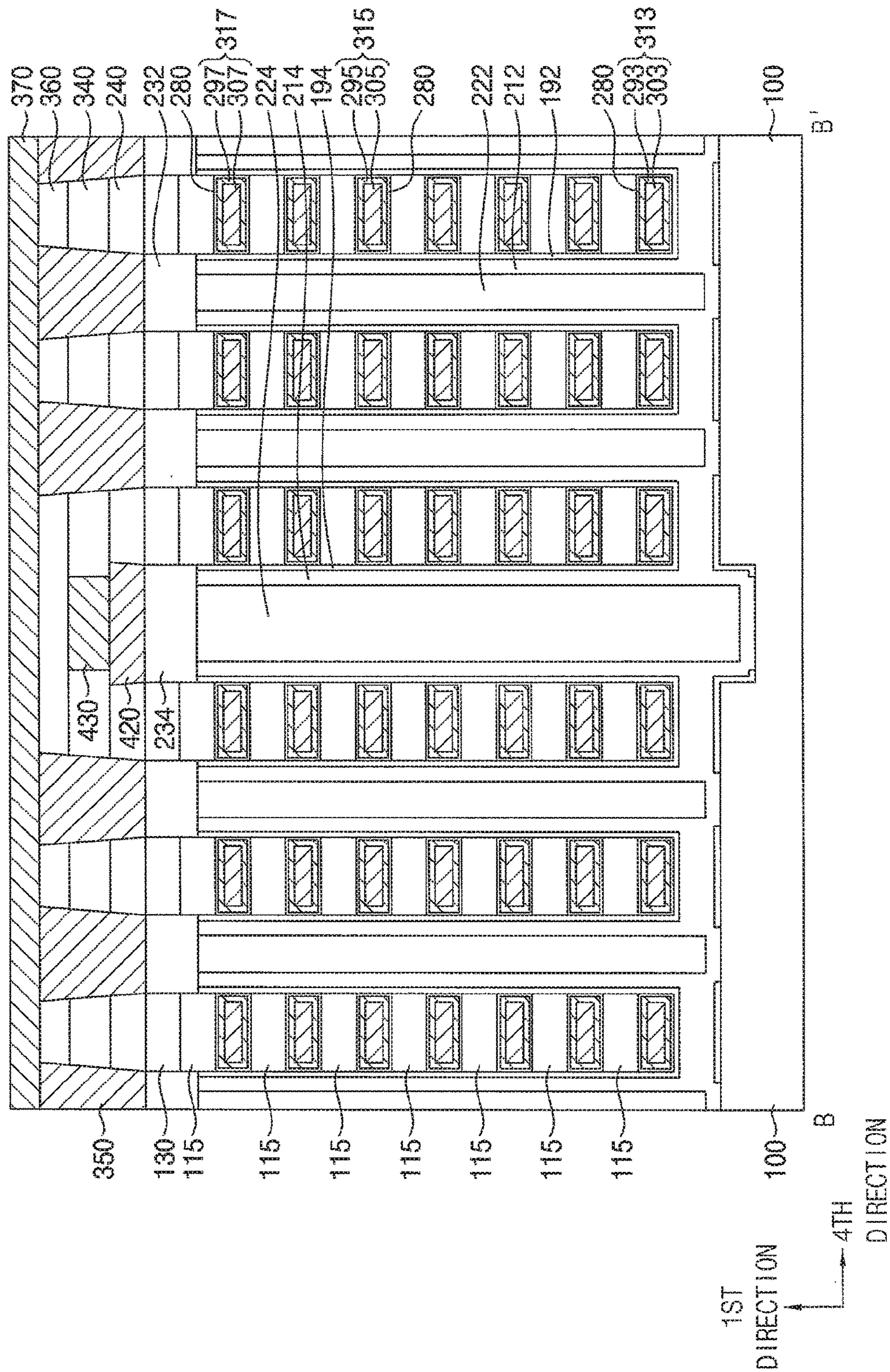

Among the cross-sectional views, FIGS. 61 and 62 are cross-sectional views along cutlines A-A' of corresponding plan views, e.g., FIGS. 16 and 19, respectively, FIG. 64 is a cross-sectional view along a cutline A-A' of FIG. 63, and FIG. 65 is a cross-sectional view along a cutline B-B' of FIG. 63.

This method may include processes substantially the same as or similar to those illustrated with reference to FIGS. 1 to 28B. Thus, like reference numerals refer to like elements, and detailed descriptions thereon may be omitted below in the interest of brevity.

Referring to FIG. 61, processes substantially the same as or similar to those illustrated with reference to FIGS. 1 to 17 may be performed.

However, when the process illustrated with reference to FIGS. 13 and 14 is performed, the capping pattern 230 that may be formed by planarizing the capping layer, may be formed to include first and second capping patterns 232 and 234. That is, the first and second capping patterns 232 and 234 may be formed on the channel 212 and the dummy channel 214. In example embodiments, the first capping pattern 232 may be formed to include n-type impurities, e.g., phosphorus, arsenic, etc., and the second capping pattern 234 may be formed to include p-type impurities, e.g., boron, aluminum, etc.

Referring to FIG. 62, processes substantially the same as or similar to those illustrated with reference to FIGS. 22 to 25 may be performed without performing processes substantially the same as or similar to those illustrated with reference to FIGS. 18 to 21.

That is, after forming the opening 250, the second support pattern 105*b* exposed by the opening 250 may not be removed, and thus the first gap 255 may not be formed. Accordingly, the epitaxial layer 150 and the gate insulation layer 270 filling the first gap 255 may not be formed.

Referring to FIGS. 63 to 65, processes substantially the same as or similar to those illustrated with reference to FIGS. 26, 27A, 27B, 28A and 28B may be performed.

Particularly, a second contact plug 420 may be formed on the second capping pattern 234, which may be formed through the second insulating interlayer 240 on the dummy channel 214. Alternatively, an additional insulating interlayer (not shown) may be formed on the second insulating interlayer 240, and the second contact plug 420 may be formed through the additional insulating interlayer and the second insulating interlayer 240.

A third insulating interlayer 340 may be formed on the second insulating interlayer 240, the second contact plug 420, the CSL 330, the second spacer 320 and the second blocking layer 280, and a wiring 430 may be formed through the third insulating interlayer 340 to contact the second contact plug 420.

In example embodiments, the wiring 430 may be formed to extend in the second direction to contact the second capping patterns 234 on the dummy channels 214 disposed in the second direction, and a plurality of wirings 430 may be formed in the third direction.

A fourth insulating interlayer 360 may be formed on the third insulating interlayer 340 and the wiring 430, and a first contact plug 350 may be formed through the second, third and fourth insulating interlayers 240, 340 and 360 to contact the first capping pattern 232 on the channel 212.

A fifth insulating interlayer 440 may be formed on the fourth insulating interlayer 360 and the first contact plug 350, and a bit line 370 may be formed through the fifth insulating interlayer 440 to contact the first contact plug 350. In example embodiments, the bit line 370 may extend in the third direction, and a plurality of bit lines 370 may be formed in the second direction.

The second to fifth insulating interlayers 240, 340, 360 and 440 may be formed of an oxide, e.g., silicon oxide, and the first and second contact plugs 350 and 420, the bit line 370 and the wiring 430 may be formed of a metal, e.g., tungsten, tantalum, titanium, etc., or a metal nitride, e.g., titanium nitride, tantalum nitride, tungsten nitride, etc.

The vertical memory device may be manufactured by the above processes.

The vertical memory device, unlike that of FIGS. 1 to 28, may not include the epitaxial layer 150 contacting the channels 212 to be electrically connected thereto. However, the second capping pattern 234, which may be doped with p-type impurities to have conductivity, may be formed on the dummy channel 214 that may be electrically connected to the channel 212, and thus the channel 212 may be electrically connected to the wiring 430 through the dummy channel 214, the second capping pattern 234 and the second contact plug 420, and may be electrically connected to an outer wiring.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A vertical memory device, comprising:

a substrate;

a channel on the substrate, the channel extending in a first direction perpendicular to an upper surface of the substrate;

a dummy channel on the substrate, the dummy channel extending from the upper surface of the substrate in the first direction;

a plurality of gate electrodes spaced apart from each other in the first direction at a plurality of levels, respectively, on the substrate, each of the gate electrodes surrounding outer sidewalls of the channel and the dummy channel, the channel and the dummy channel contacting each other between the upper surface of the substrate and a first gate electrode among the gate electrodes, the first gate electrode being at a lowermost one of the levels; and a support pattern between the upper surface of the substrate and the first gate electrode.

2. The vertical memory device of claim 1, wherein a width of the dummy channel is greater than a width of the channel.

3. The vertical memory device of claim 1, wherein the support pattern includes one of silicon-germanium and doped polysilicon.

4. The vertical memory device of claim 1, wherein the support pattern vertically overlaps a portion of the first gate electrode.

5. The vertical memory device of claim 1, further comprising:

a plurality of support patterns on the substrate between the substrate and the first electrode, wherein the plurality of support patterns include the support pattern.

6. The vertical memory device of claim 5, wherein the plurality of support patterns are arranged under the first gate electrode.

7. The vertical memory device of claim 1, wherein the channel includes a first extension portion and a first expansion portion, the first extension portion extends in the first direction; and the first expansion portion is expanded from a lower portion of the first extension portion in a direction parallel to the upper surface of the substrate, the first expansion portion has a width greater than a width of the first extension portion, the dummy channel includes a second extension portion and a second expansion portion, the second extension portion extends in the first direction; and the second expansion portion is expanded from a lower portion of the second extension portion in the direction parallel to the upper surface of the substrate, the second expansion portion has a width greater than a width of the second extension portion, and the first and second expansion portions contact each other between the upper surface of the substrate and the first gate electrode.

8. The vertical memory device of claim 1, further comprising:

an epitaxial layer on the substrate between the upper surface of the substrate and the first gate electrode.

9. The vertical memory device of claim 1, further comprising an etch stop pattern between the first gate electrode and the support pattern.

10. The vertical memory device of claim 1, wherein the channel includes a plurality of channels spaced apart from each other, and the dummy channel includes a plurality of dummy channels spaced apart from each other.

11. A vertical memory device, comprising:

a plurality of gate electrodes on a substrate, the plurality of gate electrodes being spaced apart from each other in a first direction perpendicular to an upper surface of the substrate;

a channel on the substrate and extending in the first direction through the gate electrodes;

a dummy channel on the substrate and extending in the first direction from the upper surface of the substrate through the gate electrodes, a lower portion of the dummy channel contacting a lower portion of the channel;

a first contact plug on the channel;

a first wiring electrically connected to the channel through the first contact plug;

a second contact plug on the dummy channel; and a second wiring electrically connected to the dummy channel through the second contact plug.

12. The vertical memory device of claim 11, further comprising:

a second capping pattern between the dummy channel and the second contact plug, wherein the second capping pattern is doped with p-type impurities.

13. The vertical memory device of claim 12, further comprising:

a first capping pattern between the channel and the first contact plug, wherein the first capping pattern is doped with n-type impurities.

14. The vertical memory device of claim 11, wherein the dummy channel has a width greater than a width of the channel.

15. The vertical memory device of claim 11, wherein each of the channel and the dummy channel includes an expansion portion between the upper surface of the substrate and a first gate electrode among the gate electrodes, the expansion portion of the channel has a width greater than a width of other portions of the channel, the expansion portion of the dummy channel has a width greater than a width of the dummy channel, the first gate electrode is a lowermost one of the gate electrodes, and the expansion portions of the channel and the dummy channel contact each other.

16. A vertical memory device, comprising:

a substrate;

a plurality of gate electrodes stacked on top of each other on the substrate, the gate electrodes defining channel holes that extend through the gate electrodes in a first direction perpendicular to an upper surface of the substrate, the channel holes being spaced apart from each other in a second direction and a third direction that cross each other and are parallel to the upper surface of the substrate;

a support pattern between the upper surface of the substrate and the gate electrodes, the support pattern defining channel openings that connect to the channel holes; and a plurality of channel structures filling the channel holes and the channel openings, the channel structures extending in the first direction through the gate electrodes, a portion of each of the channel structures extending in the third direction in the channel openings.

17. The vertical memory device of claim 16, further comprising:

dummy channel structures on the substrate, wherein the gate electrodes define dummy channel holes spaced apart from the channel holes, the support pattern defines dummy channel openings that connect to the dummy channel holes, the dummy channel structures fill the dummy channel holes and dummy channel openings, and the dummy channel structures contact corresponding channel structures between the upper surface of the substrate and a lowermost one of the gate electrodes, wherein the dummy channel structures contact corresponding channel structures between the upper surface of the substrate and a lowermost one of the gate electrodes.

18. The vertical memory device of claim 16, wherein a width of the dummy channel holes is greater than a width of the channel holes.

19. The vertical memory device of claim 16, further comprising:

an epitaxial layer on the substrate, wherein the epitaxial layer is between the upper surface of the substrate and a lowermost one of the gate electrodes, and the epitaxial layer contacts the channel structures to electrically connect the channel structures to the substrate.

20. The vertical memory device of claim 16, further comprising:

insulation layers between the gate electrodes, wherein the support layer includes a material having an etching selectivity with respect to the insulation layers and the substrate.

* * * * *